US009252282B2

(12) United States Patent
Iyama et al.

(10) Patent No.: US 9,252,282 B2
(45) Date of Patent: Feb. 2, 2016

(54) THIN FILM TRANSISTOR ARRAY SUBSTRATE AND LIQUID CRYSTAL DISPLAY DEVICE

(75) Inventors: Yuichi Iyama, Osaka (JP); Takao Imaoku, Osaka (JP); Iori Aoyama, Osaka (JP); Takatomo Yoshioka, Osaka (JP); Kazuhiko Tsuda, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 236 days.

(21) Appl. No.: 14/004,728

(22) PCT Filed: Mar. 9, 2012

(86) PCT No.: PCT/JP2012/056170
§ 371 (c)(1),
(2), (4) Date: Sep. 12, 2013

(87) PCT Pub. No.: WO2012/128084
PCT Pub. Date: Sep. 27, 2012

(65) Prior Publication Data
US 2014/0036192 A1    Feb. 6, 2014

(30) Foreign Application Priority Data

Mar. 18, 2011  (JP) .................................. 2011-061662
Jun. 27, 2011  (JP) .................................. 2011-142351

(51) Int. Cl.
*G02F 1/1343* (2006.01)
*H01L 29/786* (2006.01)
*G02F 1/1368* (2006.01)

(52) U.S. Cl.
CPC .......... *H01L 29/7869* (2013.01); *G02F 1/1368* (2013.01); *G02F 1/134363* (2013.01); *G02F 2001/134381* (2013.01)

(58) Field of Classification Search
CPC .............. G02F 1/134363; G02F 2001/134381; G09G 2310/06
USPC ..................................................... 349/141, 37
See application file for complete search history.

(56) References Cited

U.S. PATENT DOCUMENTS

| 2005/0024548 A1 | 2/2005 | Choi et al. | |
| 2010/0053484 A1* | 3/2010 | Ono | G02F 1/134363 349/37 |
| 2011/0037914 A1* | 2/2011 | Noguchi | G09G 3/3614 349/37 |

FOREIGN PATENT DOCUMENTS

| CN | 101144954 A | 3/2008 |
| JP | 2002-365657 A | 12/2002 |

(Continued)

OTHER PUBLICATIONS

Official Communication issued in International Patent Application No. PCT/JP2012/056170, mailed on May 29, 2012.

(Continued)

Primary Examiner — Thanh-Nhan P Nguyen
(74) Attorney, Agent, or Firm — Keating & Bennett, LLP

(57) ABSTRACT

The present invention provides a liquid crystal display device that can achieve a sufficiently-high-speed response and has a sufficiently excellent transmittance and a thin film transistor array substrate preferably used in the liquid crystal display device. The thin film transistor array substrate according to the present invention is a thin film transistor array substrate that includes, as electrodes, one pair of comb electrodes and a sheet electrode, and at least one electrode selected from the group consisting of the pair of comb electrodes and the sheet electrode being electrically connected along a pixel line.

8 Claims, 47 Drawing Sheets

(56) References Cited

FOREIGN PATENT DOCUMENTS

| JP | 2004-354407 A | 12/2004 |
|---|---|---|
| JP | 2006-523850 A | 10/2006 |
| JP | 2010-060857 A | 3/2010 |

OTHER PUBLICATIONS

Iwata et al.; "Liquid Crystal Display Pane and Liquid Crystal Display Apparatus", U.S. Appl. No. 14/030,155, filed Sep. 18, 2013.

* cited by examiner

THIN FILM TRANSISTOR ARRAY
SUBSTRATE AND LIQUID CRYSTAL
DISPLAY DEVICE

TECHNICAL FIELD

The present invention relates to a thin film transistor array substrate and a liquid crystal display device. More specifically, the present invention relates to a liquid crystal display device including liquid crystal molecules aligned in a direction perpendicular to a substrate major surface when no voltage is applied and a thin film transistor array substrate used therein.

BACKGROUND ART

A liquid crystal display panel is configured to hold a liquid crystal display element between one pair of glass substrates, and is indispensable in, by utilizing characteristics such as a small thickness, a light weight, and a low power consumption, daily life or business such as displays of a personal computer, a television set, an in-vehicle device such as a car navigation system, and a mobile information terminal such as a mobile phone. In these applications, liquid crystal display panels in various modes related to electrode arrangements to change optical characteristics of a liquid crystal layer and designs of substrates are studied.

As a display scheme of a recent liquid crystal display device, a vertical alignment (VA: Vertical Alignment) mode in which liquid crystal molecules having negative anisotropy of dielectric constant are vertically aligned to a substrate surface, an in-plane switching (IPS: In-Plane Switching) mode in which liquid crystal molecules having positive or negative anisotropy of dielectric constant are horizontally aligned to a substrate surface and a horizontal electric field is applied to a liquid crystal layer, a fringe field switching (FFS: Fringe Field Switching) mode, and the like are given.

For example, as a liquid crystal display device of an FFS drive type, a thin film transistor liquid crystal display having a high-speed response and a wide viewing angle and including a first substrate having a first common electrode layer, a second substrate having both a pixel electrode layer and a second common electrode layer, liquid crystal sandwiched between the first substrate and the second substrate, and a means that generates electric fields between the first common electrode layer included in the first substrate and the pixel electrode layer included in the second substrate and between the first common electrode layer and the second common electrode layer to achieve a high-speed response to a high-speed input data transfer rate and a wide viewing angle for a viewer is disclosed (for example, see Patent Literature 1).

As a liquid crystal device that applies a horizontal electric field by a plurality of electrodes, a liquid crystal device in which a liquid crystal layer that is made of liquid crystal having positive anisotropy of dielectric constant is held between one pair of substrates arranged opposite each other, wherein electrodes are formed on a first substrate and a second substrate configuring the pair of substrates to confront each other through the liquid crystal layer to apply a vertical electric field to the liquid crystal layer, and a plurality of electrodes that apply a horizontal electric field to the liquid crystal layer are formed on the second substrate is disclosed (for example, see Patent Literature 2).

CITATION LIST

Patent Literature

Patent Literature 1: Japanese Translation of PCT Publication No. 2006-523850

Patent Literature 2: Japanese Kokai Publication No. 2002-365657

SUMMARY OF THE INVENTION

Technical Problem

In a liquid crystal display device of an FFS drive type, liquid crystal molecules are rotated by a fringe electric field (FFS drive) generated between an upper-layer slit electrode and a lower sheet electrode of a lower substrate at a rising edge (while a display state changes from a dark state [black display] to a bright state [white display]) and the liquid crystal molecules are rotated by a vertical electric field generated by a potential difference between the substrates at a trailing edge (while a display state changes from a bright state [white display] to a dark state [black display]) to make it possible to achieve high-speed response. On the other hand, as described in Patent Literature 1, even though a fringe electric field is applied by using a slit electrode to a liquid crystal display device in which liquid crystal molecules are vertically aligned, only liquid crystal molecules that are located near the end of the slit electrode are rotated (see FIG. 66), so that a sufficient transmittance cannot be obtained.

FIG. 64 is a sectional schematic diagram of a liquid crystal display panel having an electrode structure of a conventional FFS drive type formed on a lower substrate. FIG. 66 shows a simulation result expressing a distribution of a director D, an electric field distribution, and a transmittance distribution on the liquid crystal display panel shown in FIG. 64. FIG. 64 shows a structure of the liquid crystal display panel, a predetermined voltage (14 V in FIG. 64) need only be applied to a slit electrode, and, for example, a potential difference between the slit electrode and a common electrode 313 need only be equal to or larger than a threshold value. The threshold value means a voltage value at which an electric field that changes display states in a liquid crystal display device is generated), and common electrodes 313 and 323 are arranged on a substrate on which the slit electrode is arranged and an opposed substrate, respectively. The common electrodes 313 and 323 are set at a voltage of 7 V. FIG. 66 shows a simulation result at a rising edge, and shows a voltage distribution, a distribution of the directors D, and a transmittance distribution (solid line).

Patent Literature 2 described above describes that a response speed is increased by using comb driving in a liquid crystal display device having a 3-layer electrode structure. However, Patent Literature 2 describes only a liquid crystal device in which a twisted-nematic (TN) mode is substantially used as a display scheme, and does not disclose a vertical alignment type liquid crystal display device using a scheme that is advantageous to obtain characteristics such as a wide viewing angle and high contrast. Improvement of a transmittance and a relationship between an electrode structure and a transmittance are not disclosed at all.

In view of the above state of the art, it is an object of the present invention to provide a liquid crystal display device in which a liquid crystal layer includes liquid crystal molecules aligned in a direction perpendicular to a substrate major surface when no voltage is applied, wherein a sufficiently high speed response and a sufficiently good transmittance can be achieved. It is another object of the present invention to provide a thin film transistor array substrate suitably used in the liquid crystal display device.

Solution to Problem

The present inventors made investigations concerning compatibility between a high-speed response and a high transmittance in a liquid crystal display device of a vertical alignment type, and consequently gave attentions to a 3-layer electrode structure in which the alignments of liquid crystal molecules are controlled by electric fields at both the rising and trailing edges. The present inventors made further investigations concerning the electrode structure, and they found that a first substrate and a second substrate have a liquid crystal layer therebetween, the first substrate and the second substrate have electrodes, one pair of comb electrodes are used as the electrode of the second substrate to generate a horizontal electric field by a potential difference between the pair of comb electrodes at a rising edge and to generate a vertical electric field by a potential difference between the substrates at a trailing edge, and switching between ON vertical electric field and ON horizontal electric field by a 3-layer electrode structure can be preferably performed. In this manner, the present inventors found that the liquid crystal molecules are rotated by an electric field at a rising edge or a trailing edge to make a response speed high and to also achieve a high transmittance by a comb-drive horizontal electric field, and conceived that the problems can be admirably solved. These findings have now led to completion of the present invention. The present invention is characterized in that a high-speed response and a high transmittance can be achieved in a liquid crystal display device having a vertical alignment type 3-layer electrode structure, as described above, and is different from the invention described in the prior art literature in this point. Furthermore, although the problem of a response speed becomes conspicuous in a low-temperature environment, the present invention can solve the problem and achieve a high transmittance.

More specifically, an invention related to the present invention is a liquid crystal display panel including a first substrate, a second substrate, and a liquid crystal layer held between both the substrate, wherein the first substrate and the second substrate have electrodes, the electrode of the second substrate includes one pair of comb electrodes and a sheet electrode, and the liquid crystal display panel is configured such that liquid crystal molecules in a liquid crystal layer are aligned horizontally to a substrate major surface by an electric field generated between the pair of comb electrode or between the first substrate and the second substrate. The sheet electrode is normally formed over one pair of comb electrodes through an electric resistance layer. The electric resistance layer is preferably an insulating layer. As the insulating layer, a layer that can be called an insulating layer in the technical field of the present invention may be used.

As the pair of comb electrodes, comb electrodes that can be said to be two comb electrodes arranged to face each other when the substrate major surface is planarly viewed may be used. Since a horizontal electric field is preferably generated between the comb electrodes by the pair of comb electrodes, when a liquid crystal layer includes liquid crystal molecules having positive anisotropy of dielectric constant, response performance and a transmittance are excellent at a rising edge. When the liquid crystal layer includes liquid crystal molecules having negative anisotropy of dielectric constant, the liquid crystal molecules are rotated by a lateral electric field at a trailing edge to make it possible to achieve a high-speed response. The electrodes included in the first substrate and the second substrate may be the electrodes that can give a potential difference between the substrates. In this manner, a vertical electric field is generated by a potential difference between the substrates at a trailing edge at which the liquid crystal layer includes liquid crystal molecules having positive anisotropy of dielectric constant and at a rising edge at which the liquid crystal layer includes liquid crystal molecules having negative anisotropy of dielectric constant, and the liquid crystal molecules are rotated by an electric field to make it possible to achieve a high-speed response.

FIGS. 71 and 72 are sectional schematic diagrams showing one mode of a comb electrode of a liquid crystal display panel according to the present invention. As shown in FIG. 71, one pair of comb electrodes 417 and 419 may be formed on one layer. As shown in FIG. 72, as long as the effect of the present invention can be exerted, one pair of comb electrodes 517 and 519 may be formed on different layers. However, one pair of comb electrodes are preferably formed on the same layer. An arrangement of one pair of comb electrodes on the same layer means that the comb electrodes are in contact with a common member (for example, an insulating layer, a liquid crystal layer, or the like) on the liquid crystal layer side and/or the opposite side of the liquid crystal layer side.

The pair of comb electrodes are preferably arranged to have comb portions parallel to each other when the substrate major surface is planarly viewed. In the above configuration, it is preferable that comb portions of the pair of comb electrodes are substantially parallel to each other, in other words, the pair of comb electrodes have a plurality of slits almost parallel to each other. FIG. 19 or the like shows a comb electrode typically having one comb portion. However, one comb electrode normally has two or more comb portions.

The liquid crystal layer preferably includes liquid crystal molecules aligned in a direction perpendicular to a substrate major surface when no voltage is applied. Alignment in a direction perpendicular to the substrate major surface may be alignment in a direction vertical to the substrate major surface in the technical field of the present invention, and includes a mode in which the liquid crystal molecules are substantially vertically aligned. The liquid crystal molecules included in the liquid crystal layer are preferably substantially configured by liquid crystal molecules aligned in a direction perpendicular to the substrate major surface at smaller voltage than the threshold voltage. The "when no voltage is applied" may be that a voltage is not substantially applied in the technical field of the present invention. The vertical alignment type liquid crystal display panel uses a scheme that is advantageous to obtain characteristics or the like such as a wide viewing angle and high contrast, and expands in application.

The pair of comb electrodes preferably have different potentials that are equal to or larger than the threshold voltage. For example, when a transmittance in a bright state is set to 100%, the above potential means a voltage that gives a transmittance of 5%. The different potentials that equal to or larger than the threshold voltage may be potentials at which a drive operation that obtain different potentials equal to or higher than the threshold voltage can be achieved. In this manner, an electric field applied to the liquid crystal layer can be preferably controlled. A preferable upper limit value of the different potentials is, for example, 20 V. As a configuration that can obtain different potentials can be obtained, for example, of the pair of comb electrodes, one comb electrode is driven by a certain electrode, and the other comb electrode is driven by another TFT or is electrically connected to a lower electrode of the other comb electrode to make it possible to cause the pair of comb electrodes to have different potentials, respectively. A width of a comb portion of the pair of comb electrodes is preferably, for example, 2 μm or more. A width (also called a space in this specification) between the comb portion and the comb portion is preferably, for example, 2 μm to 7 μm.

The liquid crystal display panel is preferably configured such that liquid crystal molecules in a liquid crystal layer are aligned in a direction perpendicular to a substrate major surface by an electric field generated between the pair of comb electrodes or between the first substrate and the second substrate. The electrode of the first substrate is preferably a sheet electrode. In the specification, the sheet electrode includes a configuration in which the sheet electrode is electrically connected in a plurality of pixels. For example, as the sheet electrode of the first substrate, a configuration in which the electrode is electrically connected in all pixels, a configuration in which the electrode is electrically connected along a pixel line, and the like are given as preferable configurations. The second substrate preferably further has a sheet electrode. In this manner, a vertical electric field is preferably applied to make it possible to achieve a high-speed response. In particular, the electrode of the first substrate is a sheet electrode, and the second substrate further has a sheet electrode to make it possible to preferably generate a vertical electric field by a potential difference between the substrate at the trailing edge and to make it possible to achieve a high-speed response. In preferable application of a horizontal electric field/vertical electric field, it is especially preferable that an electrode (upper electrode) on a liquid crystal layer side of the second substrate is one pair of comb electrodes and that an electrode (lower electrode) on the opposite side of the liquid crystal layer of the second substrate is a sheet electrode. For example, the sheet electrode of the second substrate can be formed on a lower layer (opposite layer of the liquid crystal layer when viewed from the second substrate) of the pair of comb electrodes of the second substrate through an insulating layer. Furthermore, the sheet electrodes of the second substrate are preferably electrically connected along a pixel line. However the sheet electrode may be independent in units of pixels. When the comb electrode is electrically connected to the sheet electrode serving as the lower electrode, when the sheet electrode is electrically connected along a pixel line, the comb electrode is also electrically connected along the pixel line, and the configuration is one of preferable configurations of the present invention. The sheet electrode of the second substrate preferably has at least a sheet-like shape at a portion that superposes on the electrode held by the first substrate when the substrate surface is planarly viewed. The electric connection along the pixel line means that the electrodes need only be electrically connected to each other along at least any one of vertical and horizontal arrays of the pixels. The electrodes need not be electrically connected to each other in all the pixel lines, and the electrodes need only be substantially electrically connected to each other along a pixel line in the liquid crystal display panel. Furthermore, in the specification, the electric connection of the electrodes along a pixel line may mean that the electrodes in pixels of one pixel line are electrically connected to each other, and may mean that, while the electrodes in the pixels of a pixel line of a plurality of pixel lines are sequentially electrically connected to each other between the pixel lines, all the electrically connected electrodes are along the pixel line. In this case, sequentially electrically connecting the electrodes in the pixels of the pixel line of the plurality of pixel lines to each other between the pixel lines is, for example, electrically alternately connecting metal wirings to the electrodes in the pixels of both pixel lines of two adjacent pixel lines, alternately electrically connecting the electrodes in the pixels of both the pixel lines of the two adjacent pixel lines, and the like.

The sheet electrodes are preferably configured to be electrically connected in the same pixel array. The same pixel array is a pixel array in which, for example, when the second substrate is an active matrix substrate, pixels are arranged along a gate bus line in the active matrix substrate when the substrate major surface is planarly viewed. In this manner, the sheet electrode of the first substrate and/or the sheet electrode of the second substrate are electrically connected in the same pixel array to make it possible to apply voltages to the electrodes to invert potential changes, for example, in units of pixels corresponding to the even-number gate bus lines/in units of pixels corresponding to the odd-number gate bus lines and to make it possible to preferably generate a vertical electric field so as to achieve a high-speed response.

The sheet electrodes of the first substrate and/or the second substrate may have planar shapes in the technical field of the present invention, may have an alignment regulating structure such as a rib or a slit in a partial area, or may have the alignment regulating structure at a central portion of the pixels when the substrate major surface is planarly viewed. However, it is preferable that the sheet electrodes do not substantially have an alignment regulating structure.

The liquid crystal layer normally includes liquid crystal molecules that are aligned to have a horizontal component to the substrate major surface at the threshold voltage or more by an electric field generated between one pair of comb electrodes or between the first substrate and the second substrate, in particular, preferably includes liquid crystal molecules aligned in a horizontal direction. The alignment in the horizontal direction may be alignment in a horizontal direction in the technical field of the present invention. In this manner, the transmittance can be improved. The liquid crystal molecules included in the liquid crystal layer are preferably substantially configured by liquid crystal molecules aligned in a direction horizontal to the substrate major surface at the threshold voltage or more.

The liquid crystal layer preferably includes liquid crystal molecules (positive type liquid crystal molecules) having positive anisotropy of dielectric constant. The liquid crystal molecules having the positive anisotropy of dielectric constant are aligned in a predetermined direction when an electric field is applied, are easily controlled in alignment, and can achieve a higher-speed response. The liquid crystal layer preferably includes liquid crystal molecules (negative type liquid crystal molecules) having negative anisotropy of dielectric constant. In this manner, the transmittance can be improved. More specifically, in terms of a high-speed response, the liquid crystal molecules are preferably substantially configured by liquid crystal molecules having positive anisotropy of dielectric constant. In terms of a transmittance, it can be said that the liquid crystal molecules are preferably substantially configured by liquid crystal molecules having negative anisotropy of dielectric constant.

The first substrate and the second substrate normally have an alignment film on a liquid crystal layer side of at least one of the substrates. The alignment film is preferably a vertical alignment film. As the alignment film, an alignment film made of an organic material or an inorganic material, an optical alignment film made of a photoactive material, and the like are given. The alignment film may be an alignment film that is not subjected to alignment treatment performed by a rubbing process or the like. By using an alignment film such as an alignment film made of an organic material or an inorganic material, or an optical alignment film that does not require alignment treatment, costs can be reduced by simplification of processes, and reliability and a yield can be improved. When the rubbing process is performed, liquid crystal contamination caused by interfusion of impurities from rubbing cloth or the like, a point defects caused by foreign particles, and an uneven display caused by ununiform rubbing in a liquid crystal panel may occur. However, the disadvantageous points can be eliminated. The first substrate and the second substrate preferably have a polarizing plate on an opposite side of the liquid crystal layer side of at least one of the substrates. The polarizing plate is preferably a circularly polarizing plate. With the configuration, a transmittance improvement effect can be further exerted. The polarizing plate is also preferably a linear polarizing plate. With the configuration, an excellent viewing angle characteristic can be achieved.

In the liquid crystal display panel according to the present invention, in generation of a vertical electric field, a potential difference is normally generated between at least the electrode included in the first substrate and the electrode (for example, a sheet electrode) included in the second substrate. A preferable mode is a mode in which a potential difference that is larger than that generated between the electrodes (for example, one pair of comb electrodes) included in the second substrate is generated between the electrode included in the first substrate and the electrode included in the second substrate. For example, a potential of the sheet electrode included in the first substrate and a potential of the sheet electrode included in the second substrate can be set to 7.5 V and 0 V, respectively, and both potentials of one pair of comb electrodes included in the second substrate can be set to 0 V, a potential of the sheet electrode included in the first substrate and a potential of the sheet electrode included in the second substrate can be set to, 7.5 V and 15 V, respectively, and both potentials of one pair of comb electrodes included in the second substrate can be set to 15 V, or a potential of the electrode included in the first substrate and a potential of the sheet electrode included in the second substrate can be set to 0 V and 15 V, respectively, and both potentials of one pair of comb electrodes included in the second substrate can be set to 15V.

A mode (also called an initializing step in the specification) in which, after the vertical electric field is generated, a potential difference between the sheet electrode included in the first substrate and the sheet electrode included in the second substrate and a potential difference between one pair of comb electrodes included in the second substrate are prevented from being substantially generated is preferable. In other words, a drive operation in which a potential is prevented from being substantially generated between all the electrodes including the electrode (for example, a sheet electrode) included in the first substrate and the electrodes (for example, one pair of comb electrodes and a sheet electrode) included in the second substrate is preferably executed. With the mode, in particular, alignment of liquid crystal molecules near edges of one pair of comb electrodes can be preferably controlled, and a transmittance that is posed unless all the electrodes are set to equal potentials can be sufficiently decreased to an initial black state (for example, a portion surrounded by a dotted line in FIG. 8 (will be described later)). The initializing step may be able to execute a drive operation in which potential differences between all electrodes are prevented from be substantially generated. For example, the drive operation may be performed such that TFTs are turned off to float at least one of one pair of comb electrodes. Alternatively, the drive operation may be performed such that all the TFTs are turned on to apply a constant voltage to at least one of the pair of comb electrodes or TFTs every even-number line or every odd-number line are turned on to apply a constant voltage to at least one of the pair of comb electrodes every even-number line or every odd-number line. The initializing step may be performed after a vertical electric field is generated, and other electric fields may be generated after the vertical electric field is generated. However, the initializing step is preferably performed immediately after the vertical electric field is generated.

In generation of a horizontal electric field, a potential difference is normally generated between at least the electrodes (for example, one pair of comb electrodes) included in the second substrate. For example, a mode in which a potential difference higher than that generated between the electrode included in the first substrate and the electrode (for example, a sheet electrode) included in the second substrate is generated between the electrodes included in the second substrate can be obtained. A potential of the sheet electrode included in the first substrate and a potential of the sheet electrode included in the second substrate can be set to 7.5 V and 0 V, respectively, potentials of one pair of comb electrodes included in the second substrate can be set to 15 V and 0 V, respectively; a potential of the sheet electrode included in the first substrate and a potential of the sheet electrode included in the second substrate can be set to 7.5 V and 7.5 V, respectively, potentials of one pair of comb electrodes included in the second substrate can be set to 15 V and 0 V, respectively; a potential of the sheet electrode included in the first substrate and a potential of the sheet electrode included in the second substrate can be set to 0 V and 0 V, respectively, and potentials of one pair of comb electrodes included in the second substrate can be set to 15V and 0V, respectively. A mode in which a potential difference lower than that generated between the electrode included in the first substrate and the electrode included in the second substrate is generated between the electrodes included in the second substrate can be obtained. When a low-gray-scale-level display is performed by a horizontal electric field between one pair of comb electrodes, for example, a case in which a potential of the sheet electrode included in the first substrate and a potential of the sheet electrode included in the second substrate are set to 7.5 V and 0 V, respectively, potentials of the pair of comb electrodes included in the second substrate are set to 10 V and 5 V, respectively (potential difference between one pair of comb electrodes is 5 V), and the like are given.

In this case, it can be assumed that a voltage is applied to lower electrodes (sheet electrodes included in the second substrate) connected in units of sets respectively including even-number lines and odd-number lines in common to invert a potential change. A potential of an electrode kept at a predetermined voltage may be set to an intermediate potential. When it is considered that a potential of an electrode kept at the predetermined voltage is 0 V, it can also be said that the polarities of voltages applied to the lower electrodes of the different combinations of bus lines are inverted.

The first substrate and the second substrate included in the liquid crystal display panel according to the present invention are one pair of substrates to hold a liquid crystal layer therebetween. For example, the substrate can be formed such that an insulating substrate such as glass or a resin is used as a base material, and wirings, electrodes, color filters, and the like are formed on the insulating substrate.

At least one of the pair of comb electrodes is preferably a pixel electrode, and the second substrate including the pair of comb electrodes is preferably an active matrix substrate. The liquid crystal display panel according to the present invention may be of any one of a transmission type, a reflection type, and a transflective type.

The present invention is also a liquid crystal display device including the liquid crystal display panel according to the present invention. A preferable mode of the liquid crystal display panel in the liquid crystal display device according to the present invention is the same as the above-mentioned preferable mode of the present invention. As the liquid crystal display device, a display or the like of a personal computer, a television set, an in-vehicle device such as a car navigation system, or a mobile information terminal such as a mobile phone is given. In particular, the liquid crystal display device is preferably applied to an in-vehicle device such as a car navigation system used in a low-temperature environment or the like.

The present invention is a thin film transistor array substrate including a thin film transistor element, and is also a thin film transistor array substrate in which electrodes of the thin film transistor array substrate include one pair of comb electrodes and a sheet electrode, at least one electrode selected from the group consisting of the pair of comb electrodes and the sheet electrode is electrically connected along a pixel line.

The sheet electrode is preferably electrically connected along the pixel line. More preferably, the sheet electrode is configured by a transparent conductor and a metal conductor electrically connected to the transparent conductor. In this manner, the electrode can be reduced in resistance to make it possible to sufficiently prevent the waveform from being dull. In a large-scale panel, a resistance of an electrode may be excessively high to make a waveform dull. Since the drawback can be prevented, the present invention is especially preferably applied to a large-scale liquid crystal display device.

At least one of the pair of comb electrodes is preferably electrically connected along the pixel line. More preferably, at least one of the pair of comb electrodes is configured by a transparent conductor and a metal conductor electrically connected to the transparent conductor. For the same reason as described above, the liquid crystal driving device is especially preferably applied to a large-scale liquid crystal display device.

At least one of the pair of comb electrodes is preferably electrically connected to the sheet electrode.

In the specification, the electric connection of the electrodes along the pixel line also means that the electrodes are electrically connected at least in units of the same sets of pixel lines. For example, electrodes may be connected in units of pixel lines, and the electrodes may be connected in units of sets each including n pixel lines (every n lines). Both the configurations are preferably used. Note that n is an integer that is 2 or more. The connection of the electrodes in units of sets each including a plurality of pixel lines (n pixel lines) may be an electric connection of electrodes corresponding to the plurality of pixel lines, and includes, for example, a mode in which electrodes are electrically connected every odd-number pixel line or every even-number pixel line. When the electrodes are connected in units of sets each having a plurality of pixel lines, the plurality of lines are normally inverted at the same time.

The thin film transistor array substrate is a thin film transistor array substrate for frame-reversal driving or line reversal driving. In one preferable mode of the present invention, at least one electrode selected from the group consisting of the pair of comb electrodes and the sheet electrode is electrically connected every pixel line between pixels of the pixel line. More specifically, the thin film transistor array substrate can be used in frame-reversal driving and line reversal driving. In terms of difficult recognition of flickers and excellent display, the line reversal driving is preferable. To electrically connect the electrodes every pixel line between the pixels of the pixel line is that, as long as the effect of the present invention can be exerted, the electrodes need not be electrically connected between all the pixels of the pixel line, and the electrodes need only be substantially electrically connected between all the pixels of the pixel line.

The thin film transistor array substrate is a thin film transistor array substrate for frame-reversal driving, line reversal driving, or dot-reversal drive. In another preferable mode of the present invention, at least one electrode selected from the group consisting of the pair of comb electrodes and the sheet electrode is electrically connected between alternate pixels of one pixel line. More specifically, the thin film transistor array substrate can be used in frame-reversal driving, line reversal driving, and dot-reversal drive. In terms of difficult recognition of flickers and excellent display, the line reversal driving and the dot-reversal drive are more preferable. The dot-reversal drive is most preferable. In this case, there are two combinations of alternate pixels of one pixel line, and the pixels of one of the combinations may be electrically connected to each other, and the pixels of both the combinations may be electrically connected to each other, respectively. To electrically connect electrodes between alternate pixels of one pixel line is that, as long as the effect of the present invention can be exerted, the electrodes need only be substantially electrically connected between alternate pixels.

The present invention is a thin film transistor array substrate including a thin film transistor element, and is also a thin film transistor array substrate in which the electrodes of the thin film transistor array substrate includes one pair of comb electrodes and a sheet electrode, and at least one of the pair of comb electrodes is electrically connected to the sheet electrode.

The present invention is also a liquid crystal display device characterized by comprising the thin film transistor array substrate according to the present invention. A preferable mode of the thin film transistor array substrate in the liquid crystal display device according to the present invention is the same as the above-mentioned preferable mode of the thin film transistor array substrate according to the present invention. As the liquid crystal display device can be preferably applied to the above usage.

The configuration of the liquid crystal display device and the thin film transistor array substrate of the present invention is not especially limited by other components as long as it essentially includes such components. Other configurations that are normally used in a liquid crystal display device and a thin film transistor array substrate can be arbitrarily applied.

The aforementioned modes may be employed in appropriate combination as long as the combination is not beyond the spirit of the present invention.

Advantageous Effects of Invention

According to the liquid crystal display device of the present invention, the first substrate and the second substrate have electrodes, and the electrode of the second substrate includes one pair of comb electrodes and a sheet electrode to make it possible to achieve a sufficient-high-speed response and a sufficiently excellent transmittance.

DESCRIPTION OF EMBODIMENTS

Figure 1:
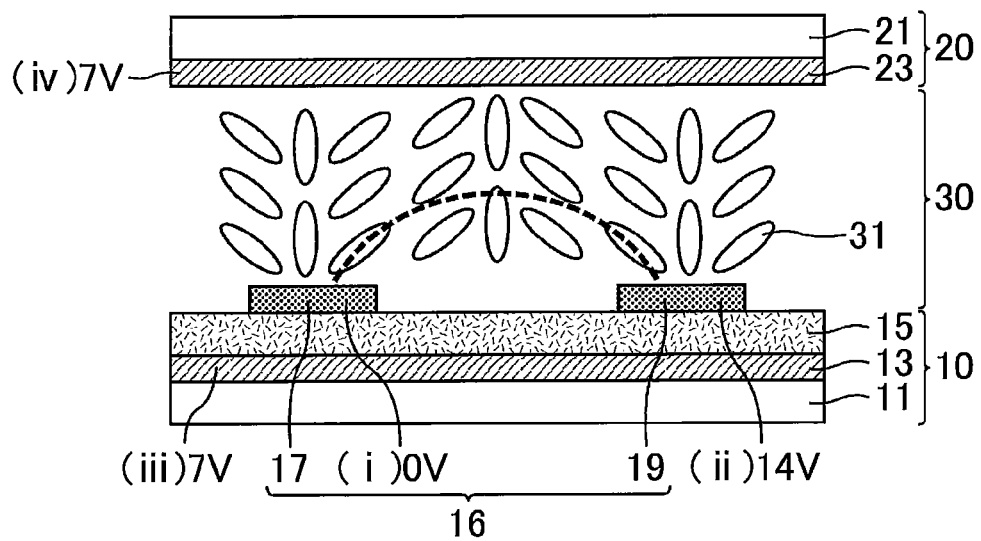
FIG. 1 is a sectional schematic diagram of a liquid crystal display panel according to Embodiment 1 in generation of a horizontal electric field.

The present invention will be mentioned in more detail referring to the drawings in the following embodiments, but is not limited to these embodiments. In this specification, unless otherwise stated, a pixel may be a picture element (sub-pixel). A sub-frame means a time spent to display one color when colors are continuously displayed in one frame by, for example, field sequential (time division) drive using some or all of pixels of a frame serving as a display by all pixels (pixels including RGB). In the specification, the sub-frame means a period for the display. Furthermore, a sheet electrode, as long as the sheet electrode is called a sheet electrode in the technical field of the present invention, may have a dot-shaped rib and/or slit that is formed therein. However, it is preferable that the sheet electrode does not substantially have an alignment regulating structure. Of one pair of substrate that holds a liquid crystal layer therebetween, a substrate on a display surface side is also called an upper substrate, and a substrate on the opposite side of the display surface is called a lower substrate. Of the electrodes arranged on the substrates, an electrode on the display surface side is called an upper electrode, and an electrode on the opposite side of the display surface is also called a lower electrode. Furthermore, a circuit substrate (second substrate) according to the embodiment is called a TFT substrate or an array substrate because the circuit substrate has a thin film transistor element (TFT) or for another reason. In the embodiment, at both a rising edge (application of a horizontal electric field) and a trailing edge (application of a vertical electric field), a TFT is turned on to apply a voltage to at least one electrode (pixel electrode) of one pair of comb electrodes.

In each of the embodiments, the same symbols denote members and parts that exert the same functions, respectively. In the drawings, unless otherwise noted, (i) denotes one potential of a comb electrode on the upper layer of the lower substrate, (ii) denotes the other potential of the comb electrode on the upper layer of the lower substrate, (iii) denotes a potential of a sheet electrode on a lower layer of the lower substrate, and (iv) denotes a potential of a sheet electrode of the upper substrate.

Embodiment 1

Figure 2:
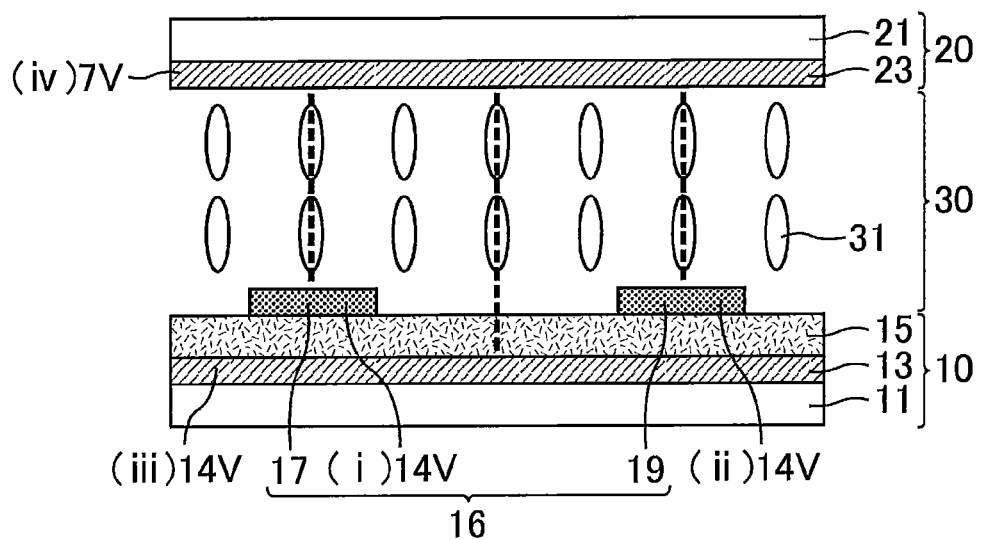
FIG. 2 is a sectional schematic diagram of the liquid crystal display panel according to Embodiment 1 in generation of a vertical electric field.

FIG. 1 is a sectional schematic diagram of a liquid crystal display panel according to Embodiment 1 in generation of a horizontal electric field. FIG. 2 is a sectional schematic diagram of the liquid crystal display panel according to Embodiment 1 in generation of a vertical electric field. In FIGS. 1 and 2, dotted lines indicate directions of electric fields to be generated. A liquid crystal display panel according to Embodiment 1 has a vertical alignment type 3-layer electrode structure using liquid crystal molecules 31 serving as a positive liquid crystal (in this case, the upper electrode of the lower substrate located as a second layer is a comb electrode). At a rising edge, as shown in FIG. 1, a horizontal electric field generated by a potential difference of 14 V generated between one pair of comb electrodes 16 (for example, including a comb electrode 17 having a potential of 0 V and a comb electrode 19 having a potential of 14 V) rotates the liquid crystal molecules. At this time, a potential difference between the substrates (between a common electrode 13 having a potential of 7 V and a common electrode 23 having a potential of 7 V) is not substantially generated.

At the trailing edge, as shown in FIG. 2, a vertical electric field generated by a potential difference of 7 V between the substrates (for example, the common electrode 13, the comb electrode 17, and the comb electrode 19 each having a potential of 14 V and the common electrode 23 having a potential of 7 V) rotates the liquid crystal molecules. At this time, a potential difference between the pair of comb electrodes 16 (for example, including the comb electrode 17 having a potential of 14 V and the comb electrode 19 having a potential of 14 V) is not substantially generated.

At both the rising edge and the trailing edge, the liquid crystal molecules are rotated by electric fields to achieve a high-speed response. More specifically, at the rising edge, an on state is set by a horizontal electric field between one pair of comb electrodes to achieve a high transmittance. At the trailing edge, an on state is set by a vertical electric field between the substrates to achieve a high-speed response. Furthermore, the high transmittance can also be achieved by the horizontal electric field obtained by comb driving. In Embodiment 1 and embodiments subsequent thereto, a positive liquid crystal is used as a liquid crystal. However, a negative liquid crystal may be replaced with the positive liquid crystal. When the negative liquid crystal is used, a potential difference between one pair of substrates aligns liquid crystal molecules in a horizontal direction, and a potential difference between one pair of comb electrodes aligns the liquid crystal molecules in a vertical direction. In this manner, an excellent transmittance can be obtained, and the liquid crystal molecules are rotated by an electric field at both a rising edge and a trailing edge to make it possible to achieve a high-speed response. Liquid crystal molecules are sufficiently aligned in the vertical direction in an initializing step, as in the case of the positive liquid crystal, an effect of sufficiently decreasing a transmittance in a black display state can be exerted. In this case, a drive operation that generates a potential difference between the common electrodes respectively arranged on at least the upper and lower substrates, a drive operation that generates a potential difference between at least one pair of comb electrodes, and a drive operation that does not generate a potential difference between the common electrode and the pair of comb electrodes are preferably sequentially executed. In the specification, potentials of one pair of comb electrodes are represented by (i) and (ii), a potential of the sheet electrode of the lower substrate is represented by (iii), and a potential of the sheet electrode of the upper substrate is represented by (iv).

The liquid crystal display panel according to Embodiment 1, as shown in FIGS. 1 and 2, an array substrate 10, a liquid crystal layer 30, and an opposed substrate 20 (color filter substrate) are configured to be stacked in the order named from a rear surface side of the liquid crystal display panel to an observation surface side. In the liquid crystal display panel according to Embodiment 1, as shown in FIG. 2, the liquid crystal molecules are vertically aligned at a voltage lower than a threshold voltage. As shown in FIG. 1, when a voltage difference between the comb electrodes is the threshold voltage or more, an electric field generated between the upper electrodes 17 and 19 (one pair of comb electrodes) formed on a glass substrate 11 (second substrate) inclines the liquid crystal molecules in a horizontal direction between the comb electrodes to control an amount of transmitted light. The sheet-like lower electrode 13 (common electrode 13) is formed such that an insulating layer 15 is sandwiched between the upper electrodes 17 and 19 (one pair of comb electrodes 16). As the insulating layer 15, for example, an oxide film made of $SiO_2$, a nitride film made of SiN, an acrylic resin, or the like is used, or combinations of these materials can be also used.

Although not shown in FIGS. 1 and 2, polarizing plates are arranged on opposite sides of the liquid crystal layer on both the substrates. As the polarizing plate, any one of a circularly polarizing plate and a linear polarizing plate can be used. Alignment films are arranged on the liquid crystal layer sides of both the substrates, respectively. As long as the liquid crystal molecules are stood perpendicularly to the film surfaces of the alignment films, the alignment films may be any one of an organic alignment film and an inorganic alignment film.

At a timing selected by a scanning signal line, a voltage supplied from a video signal line is applied to the comb electrode 19 that drives a liquid crystal material through a thin film transistor element (TFT). In the embodiment, the comb electrode 17 and the comb electrode 19 are formed in the same layer. This configuration is preferable. However, as long as the effect of the invention that generates a voltage difference between the comb electrodes to apply a horizontal electric field so as to improve a transmittance can be exerted, the comb electrodes may be formed in different layers, respectively. The comb electrode 19 is connected to the drain electrode extending from the TFT through a contact hole. In FIGS. 1 and 2, the common electrodes 13 and 23 have sheet-like shapes, and the common electrodes 13 are connected in units of sets respectively including even-number lines and odd-number lines of gate bus lines in common. Such an electrode is also called a sheet electrode in the specification. The common electrode 23 is connected to all the pixels in common.

In the embodiment, although an electrode width L of the comb electrode is 2.4 μm, for example, a width of 2 μm or more is preferable. Although an electrode interval S between the comb electrodes is 2.6 μm, an interval of 2 μm or more is preferable. The preferable upper limit value is, for example, 7 μm.

As a ratio (L/S) of the electrode interval S to the electrode width L, for example, 0.4 to 3 is preferably set. A more preferable lower limit value is 0.5, and a more preferable upper limit value is 1.5.

Although a cell gap d is 5.4 μm, the cell gap need only be set to 2 μm to 7 μm and preferably ranges within the range. The cell gap d (thickness of the liquid crystal layer) is preferably calculated by averaging all the thicknesses of the liquid crystal layer in the liquid crystal display panel in the specification.

(Verification of Response Performance and Transmittance by Simulation)

Figure 3:
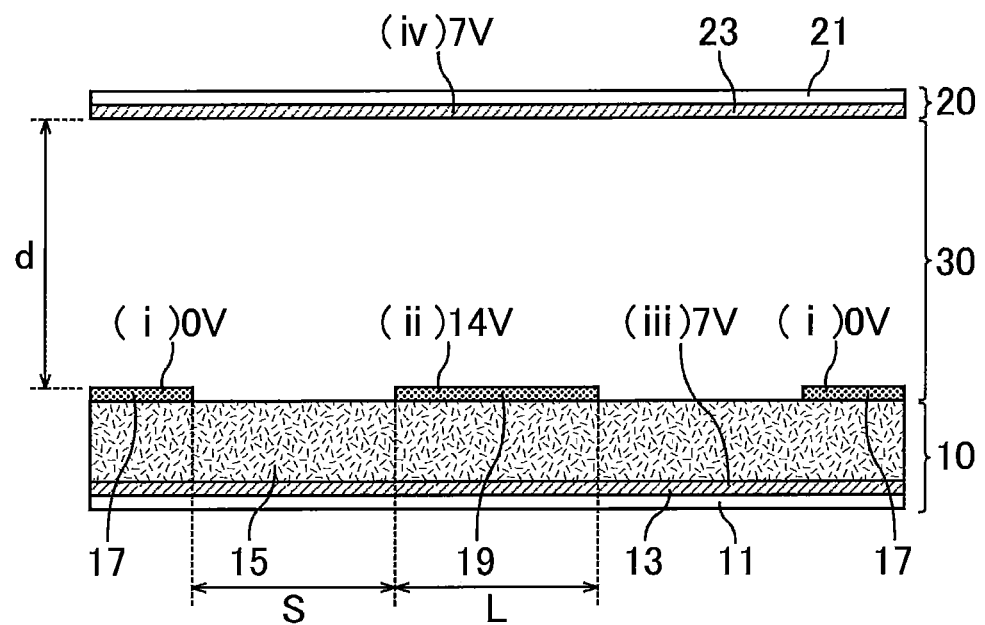
FIG. 3 is a sectional schematic diagram of the liquid crystal display panel according to Embodiment 1 in generation of a horizontal electric field.

FIG. 3 is a sectional schematic diagram of the liquid crystal display panel according to Embodiment 1 in generation of a horizontal electric field. In the comb driving according to Embodiment 1, a horizontal electric field is generated between the pair of comb electrodes 16 (for example, including the comb electrode 17 having a potential of 0 V and the comb electrode 19 having a potential of 14 V) to make it possible to rotate liquid crystal molecules over a large area between one pair of comb electrodes (see FIGS. 3 and 4).

Figure 4:
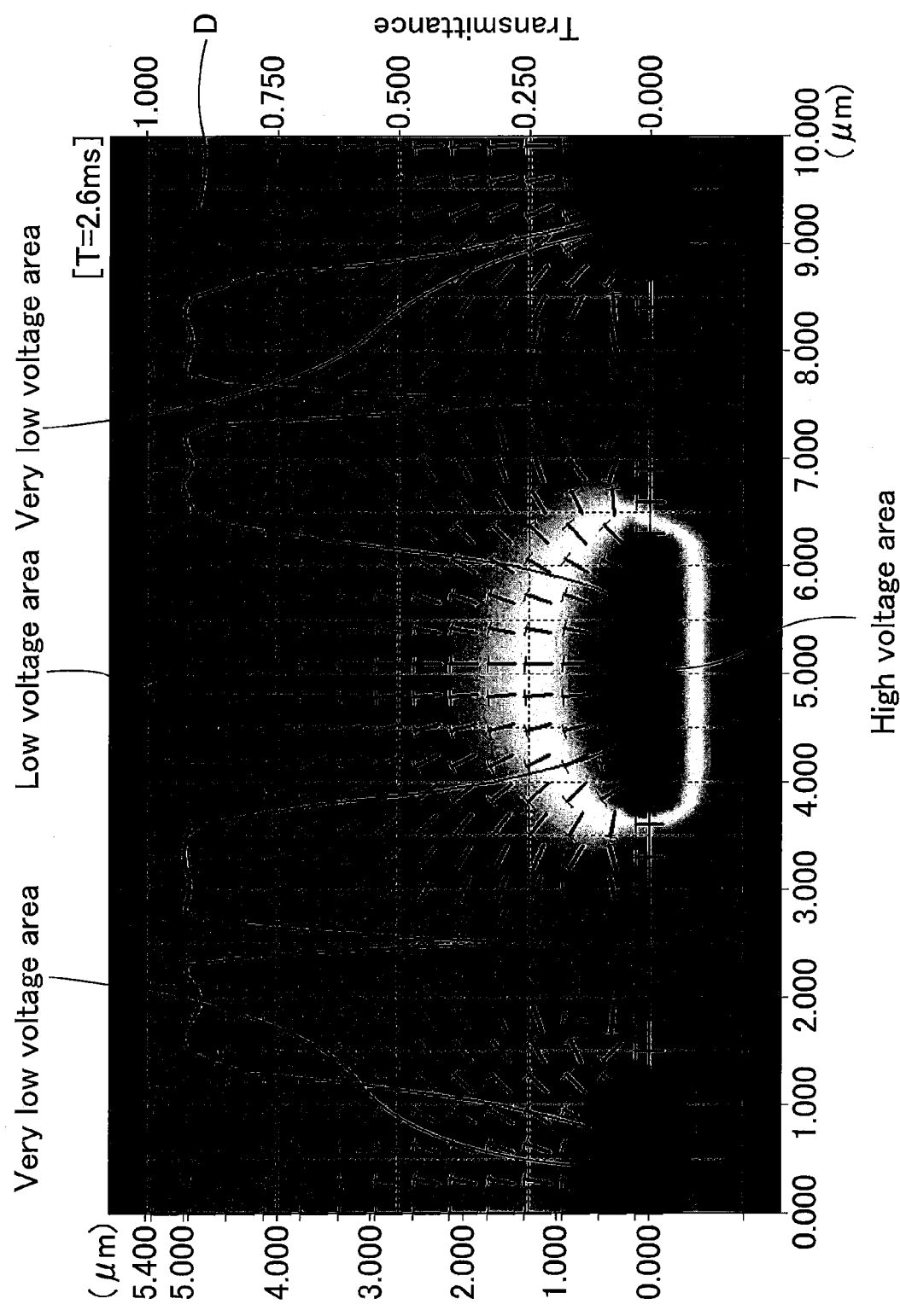
FIG. 4 shows a simulation result about the liquid crystal display panel shown in FIG. 3.

FIG. 4 shows a simulation result about the liquid crystal display panel shown in FIG. 3. FIG. 4 shows simulation results of a director D, an electric field, and a transmittance distribution at a timing of 2.2 ms after the rising (as shown in a diagram (graph) or the like (will be described later), the display panel is not driven for a first 0.4-ms period). A graph indicated by a solid line shows a transmittance. The director D indicates a longitudinal alignment direction of liquid crystal molecules. As simulation conditions, a cell thickness was set to 5.4 μm, and a comb interval was set to 2.6 μm.

Figure 5:
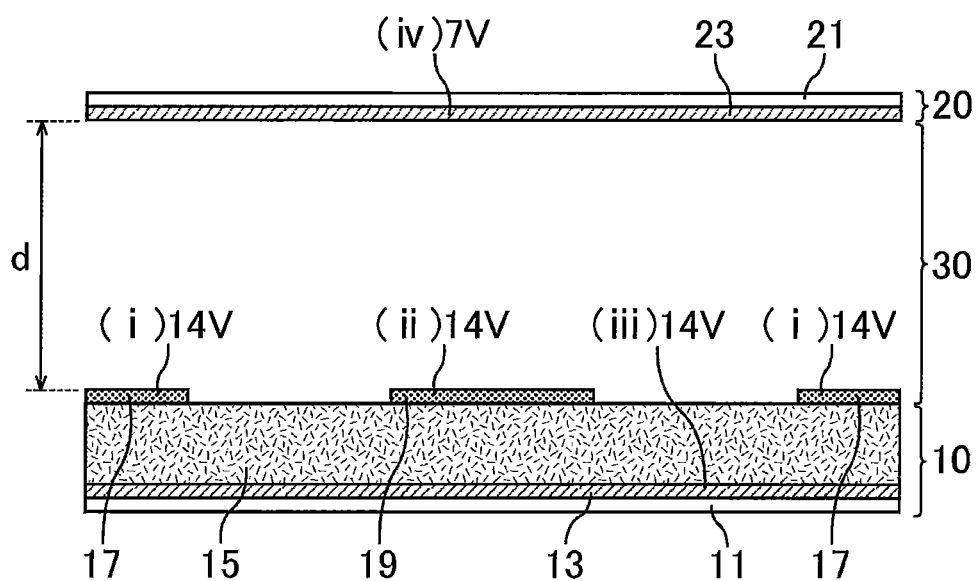
FIG. 5 is a sectional schematic diagram of the liquid crystal display panel according to Embodiment 1 in generation of a vertical electric field.
Figure 6:
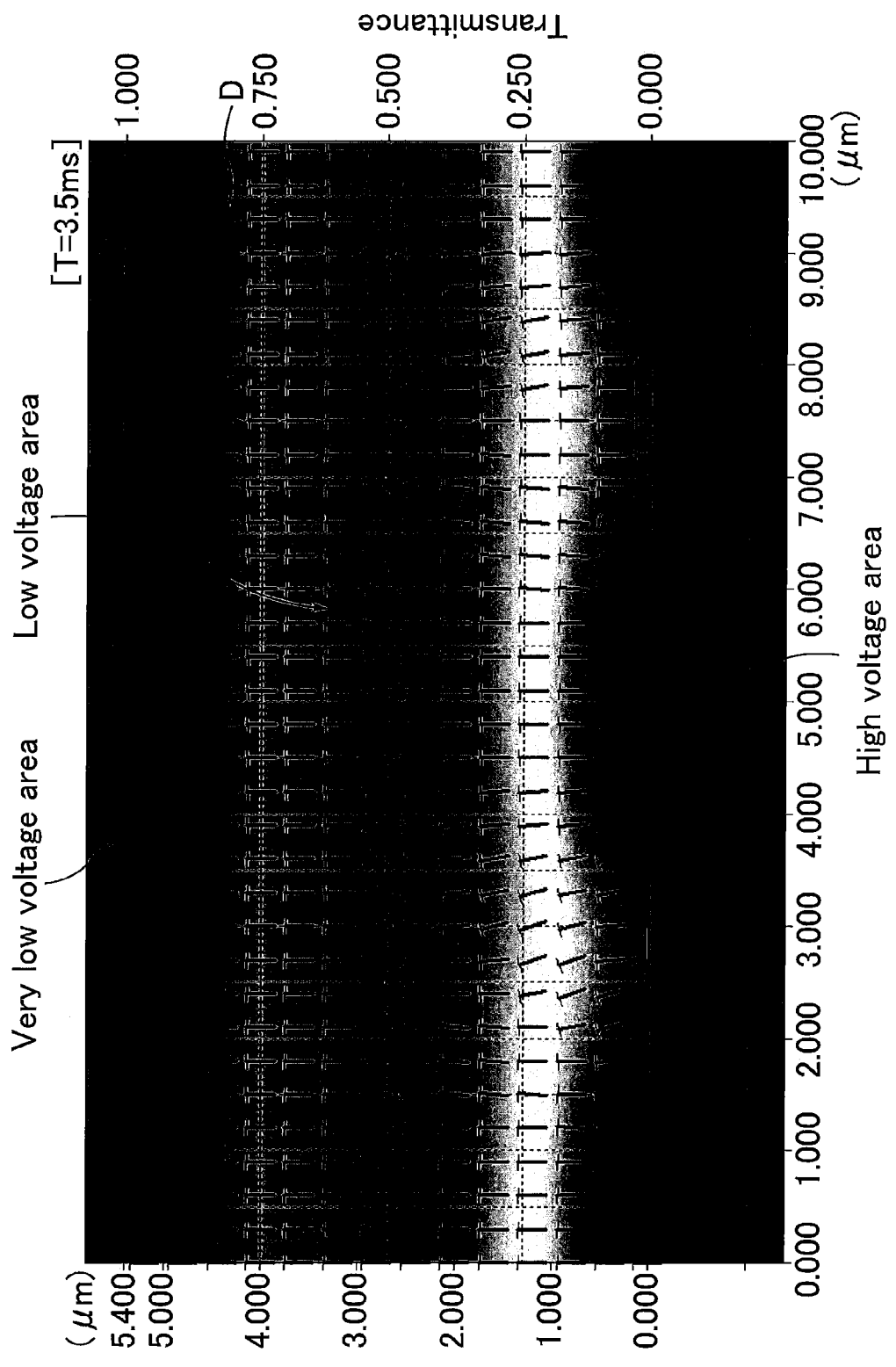
FIG. 6 shows a simulation result about the liquid crystal display panel shown in FIG. 5.

When a horizontal electric field obtained by comb driving is applied in the liquid crystal display panel according to Embodiment 1, the liquid crystal molecules can be rotated in a large area between the comb electrodes to achieve a high transmittance (see a transmittance of 18.6% in the simulation (see FIG. 7), and a measured transmittance of 17.7% (will be described later) (see FIG. 8 or the like)). On the other hand, in Comparative Example 1 (will be described later) (FFS driving in the prior art document), a sufficient transmittance cannot be obtained. FIG. 5 is a sectional schematic diagram of the liquid crystal display panel according to Embodiment 1 in generation of a vertical electric field. A vertical electric field generated by a potential difference of 7 V between the substrates (for example, the common electrode 13, the comb electrode 17, and the comb electrode 19 each having a potential of 14 V and the common electrode 23 having a potential of 7 V) rotates liquid crystal molecules. FIG. 6 shows a simulation result about the liquid crystal display panel shown in FIG. 5. FIG. 6 shows simulation results of the director D, the electric field, and the transmittance distribution at a timing of 3.5 ms after the end point (timing of 2.8 ms) a rising period.

Figure 7:
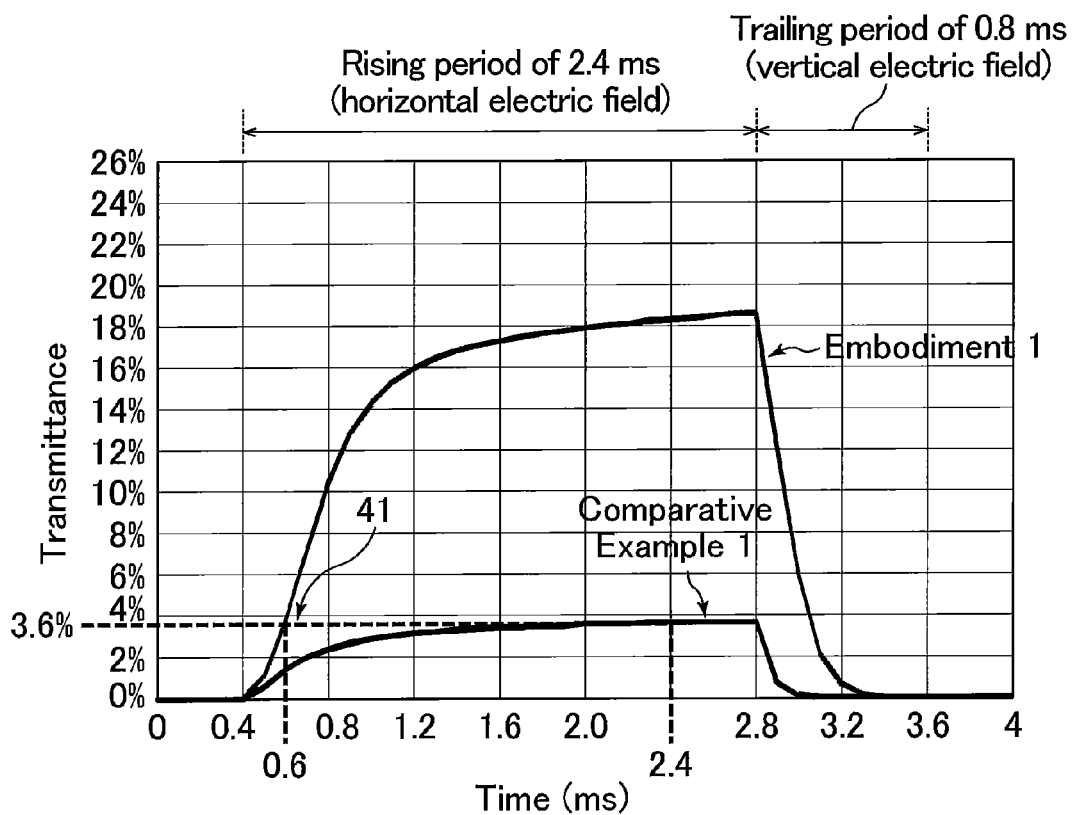
FIG. 7 is a graph showing response waveform comparison performed by simulation of comb driving and FFS driving.

FIG. 7 is a graph obtained by comparing response waveforms obtained by performing simulation of comb driving and FFS driving. Since the panel is not driven in the first 0.4-ms period, the rising period (horizontal electric field application period) is 2.4 ms, and a trailing period (vertical electric field application period) is 0.8 ms. The comb driving (Embodiment 1) and FFS driving (Comparative Example 1) (will be described later) are compared with each other. The simulation is performed such that a cell thickness of 5.4 μm and an electrode interval of 2.6 μm between one pair of comb electrodes are set as simulation conditions.

A response speed is considered as described below. A transmittance (18.6%) obtained by the comb driving according to Embodiment 1 is higher than a transmittance (3.6%) obtained in the FFS driving according to Comparative Example 1. For this reason, when a transmittance of 3.6% is to be obtained by the comb driving according to Embodiment 1, overdrive driving is used to make it possible to achieve a response the speed of which is higher than that of the FFS driving. More specifically, a voltage larger than a rated voltage required to obtain a transmittance of 3.6% in at least the comb driving is applied to execute the liquid crystal to respond at a high speed, and an applied voltage is decreased to the rated voltage at a timing at which a target transmittance is obtained, so that a response time at the rising edge can be shortened. For example, in FIG. 7, the applied voltage is decreased to the rated voltage at a 0.6-ms timing 41 to make it possible to shorten the response time at the rising edge. When the transmittance does not change, a response time at a trailing edge does not change.

(Verification of Response Performance and Transmittance Obtained by Actual Measurement)

Figure 8:
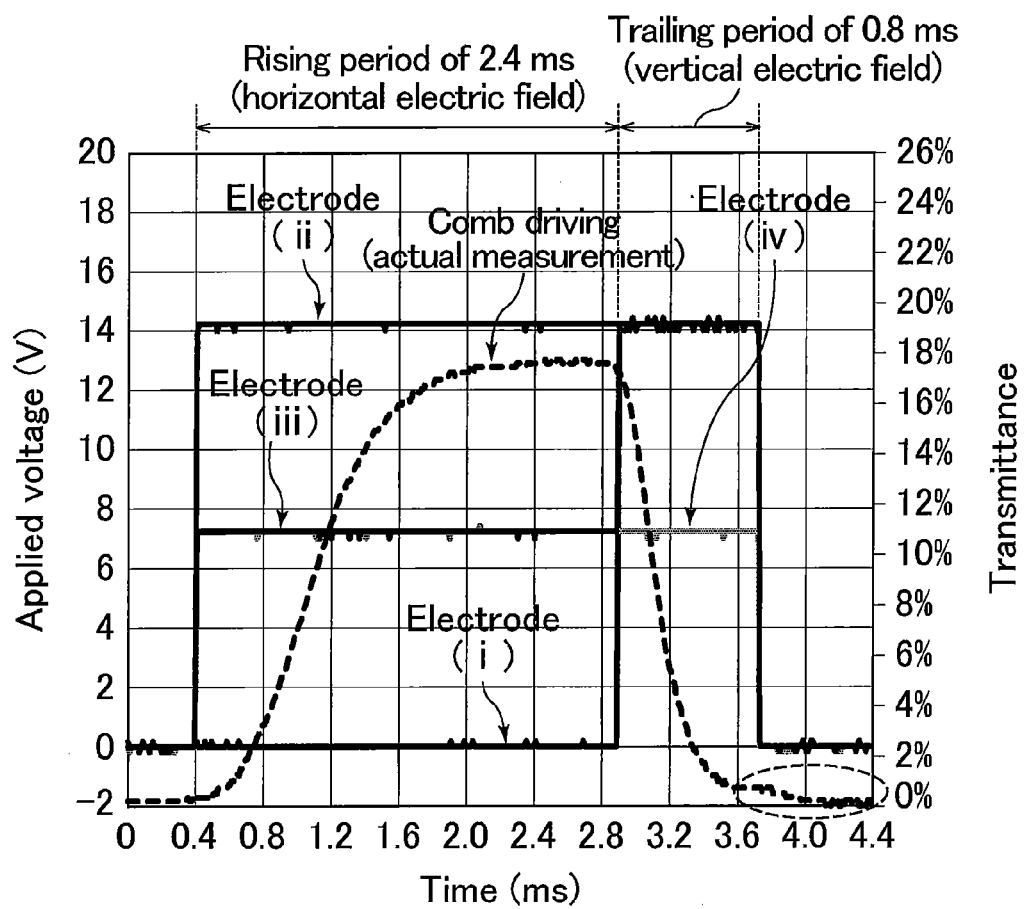
FIG. 8 is a graph showing a drive response waveform measurement value and applied rectangular waves of electrodes in Embodiment 1.

FIG. 8 is a graph showing a drive response waveform measurement value and applied rectangular waves of electrodes in Embodiment 1. As an evaluation cell, a cell having a cell thickness of 5.4 μm was used as in the simulation described above. An electrode interval between one pair of comb electrodes was set to 2.6 μm. A measured temperature was 25° C.

At the rising edge and the trailing edge, voltages are applied to the electrodes as shown in FIGS. 3 and 5, and a horizontal electric field and a vertical electric field are applied to liquid crystal molecules, respectively. More specifically, a rising period of 2.4 ms (embodiment 1) was obtained performing comb driving between one pair of comb electrodes. A trailing period of 0.8 ms (see FIG. 8 regarding applied waveforms of electrodes) was obtained by performing vertical-electric-field driving between one pair of comb electrodes, the lower electrode of the lower substrate, and the common electrode of the upper substrate (between the common electrode 13, the comb electrode 17, and the comb electrode 19, and the common electrode 23 in FIG. 2).

As a result of actual measurement, a maximum transmittance of 17.7% (transmittance in simulation is 18.6%) was obtained in Embodiment 1, and a transmittance higher than that in Comparative Example 1 (will be described later) (simulation transmittance of 3.6%) was achieved. At the rising edge, a response speed of 0.9 ms was obtained at a transmittance of 10% to 90% (value obtained when the maximum transmittance was set to 100%). At the trailing edge, a response speed of 0.4 ms was obtained at a transmittance of 90% to 10% (value obtained when the maximum transmittance was 100%). High speed responses were achieved at both the rising and trailing edges.

A preferable comb electrode width (L; Line), a preferable comb electrode interval (S; Space), and a preferable cell thickness (d) in an ON vertical electric field and an ON horizontal electric field in Embodiment 1 were examined.

(Relationship Between Transmittance and Line Width (L))

Although the transmittance increases in proportion to a decrease of a comb electrode width L, when the comb electrode width L is excessively decreased, problems in device manufacturing such as leakage and disconnection are posed. For this reason, the comb electrode width L is desirably set to be 2 µm or more.

(Relationship Between Transmittance, Cell Thickness d, and Comb Electrode Interval S)

Figure 9:
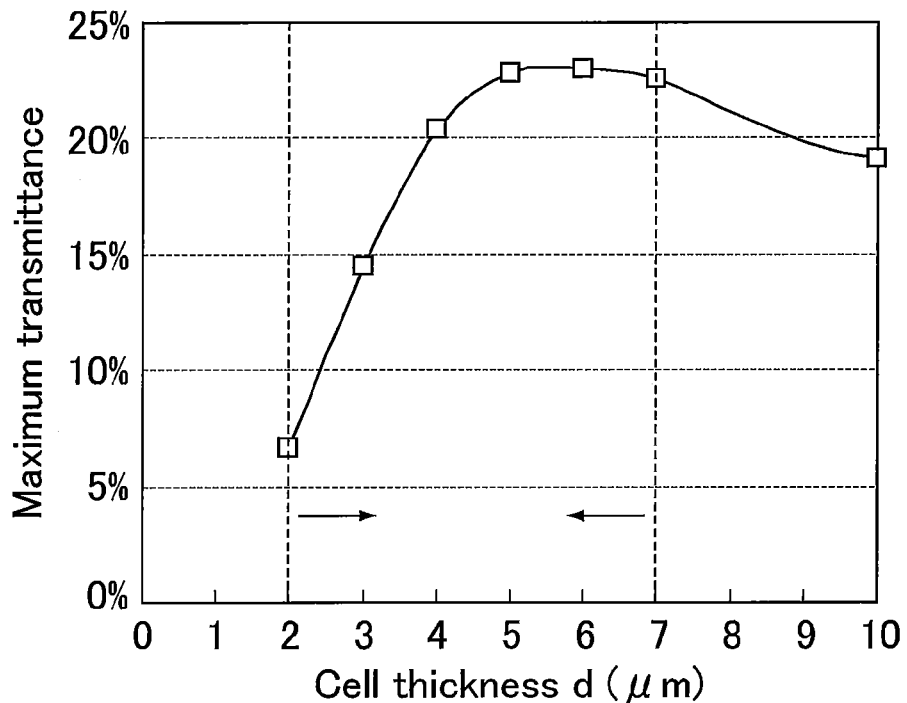
FIG. 9 is a graph showing a relationship between a maximum transmittance and a cell thickness d in Embodiment 1.
Figure 10:
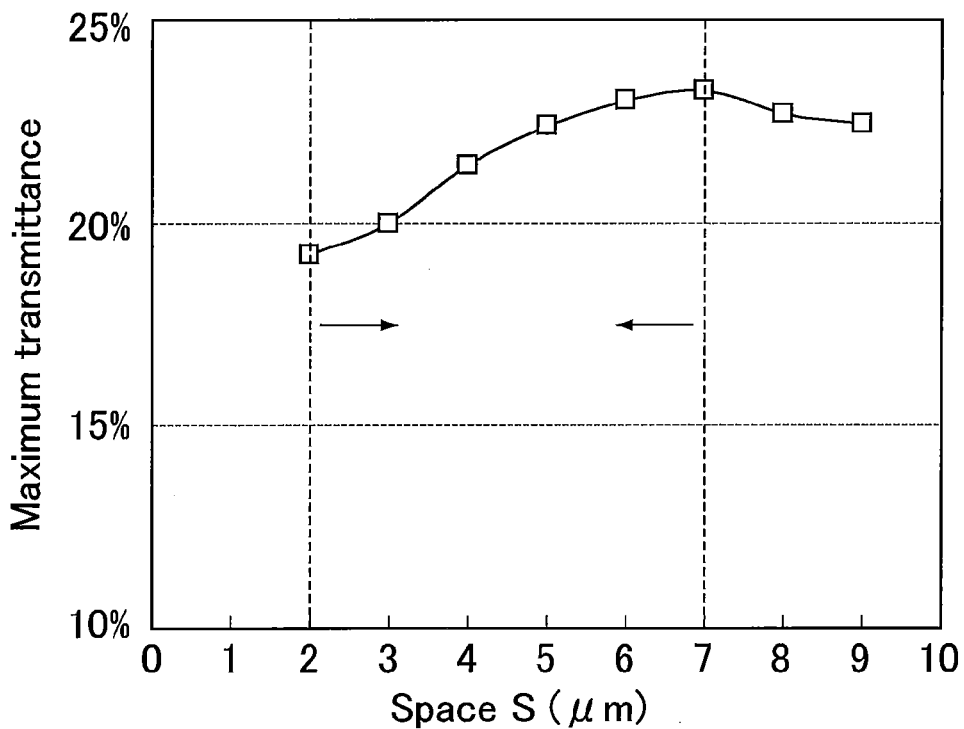
FIG. 10 is a graph showing a relationship between the maximum transmittance and a space S in Embodiment 1.

FIG. 9 is a graph showing a relationship between a maximum transmittance and a cell thickness d in Embodiment 1. FIG. 10 is a graph showing a relationship between the maximum transmittance and a space S in Embodiment 1. When the cell thickness d and the space S increase, a response speed decreases. Thus, in terms of a response speed, the cell thickness d and the space S are preferably small. However, the cell thickness d and the space S are excessively decreased, problems in device manufacturing such as leakage and disconnection may be posed. For this reason, the cell thickness d and the space S are desirably set to be 2 µm or more. When the maximum transmittance obtained when the cell thickness d and the space S are changed is simulated by LCD MASTER (see FIGS. 9 and 10, Table 1, and Table 2), the maximum transmittance increases as the cell thickness d and the space S become larger than 2 µm. However, the cell thickness d and the space S exceed 7 µm, the maximum transmittance considerably decreases. Thus, the cell thickness d and the space S are desirably set to be 7 µm or less. Thus, the cell thickness d and the space S are desirably set to be 2 µm or more and 7 µm or less.

TABLE 1

| Cell thickness (µm) | Maximum transmittance |
| --- | --- |
| 2 | 6.6% |
| 3 | 14.5% |
| 4 | 20.4% |
| 5 | 22.8% |
| 6 | 23.0% |
| 7 | 22.6% |
| 10 | 19.1% |
| 15 | 19.2% |

TABLE 2

| Space (µm) | Maximum transmittance |
| --- | --- |
| 2 | 19.2% |
| 3 | 20.0% |
| 4 | 21.4% |
| 5 | 22.4% |
| 6 | 23.0% |
| 7 | 23.3% |
| 8 | 22.7% |
| 9 | 22.5% |

Embodiment 2

Figure 11:
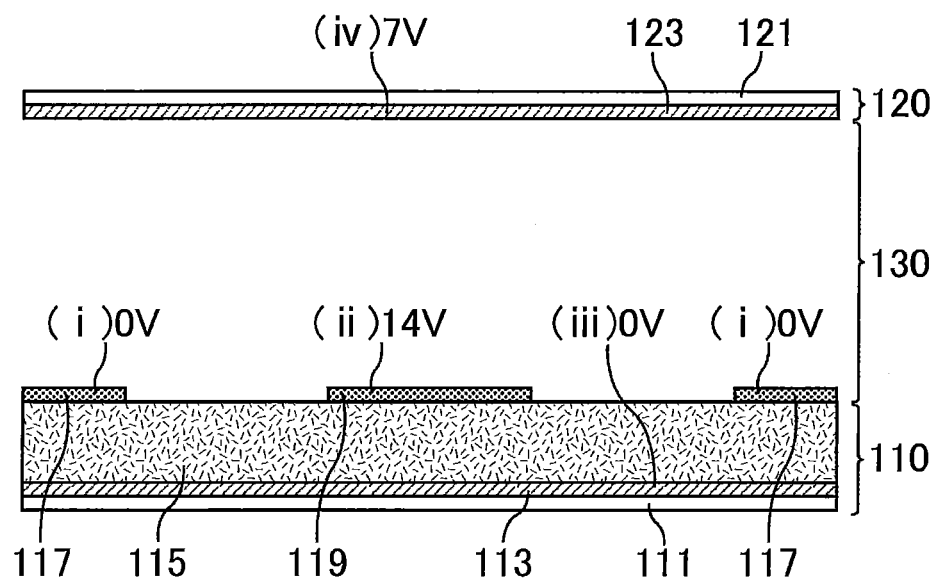
FIG. 11 is a sectional schematic diagram of a liquid crystal display panel according to Embodiment 2 in generation of a horizontal electric field.
Figure 12:
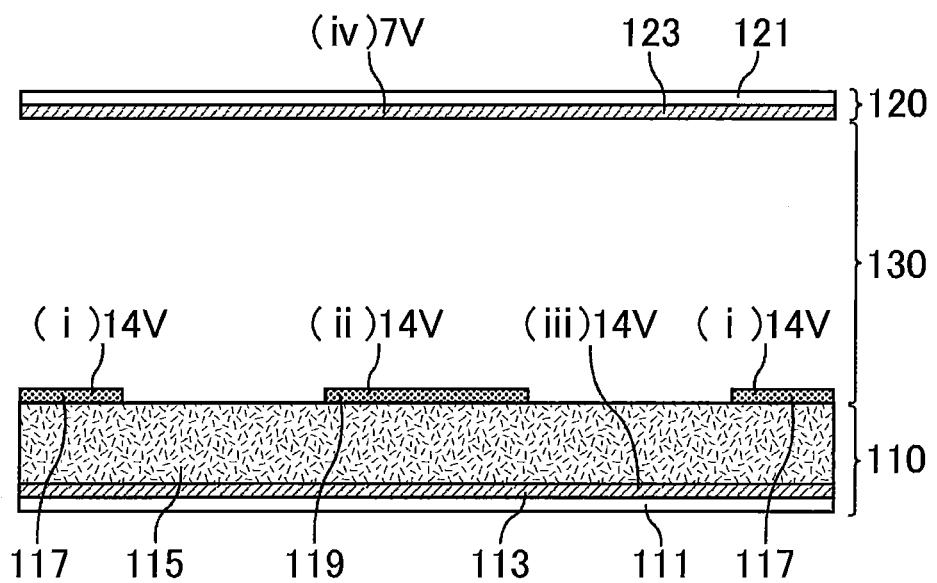
FIG. 12 is a sectional schematic diagram of the liquid crystal display panel according to Embodiment 2 in generation of a vertical electric field.
Figure 13:
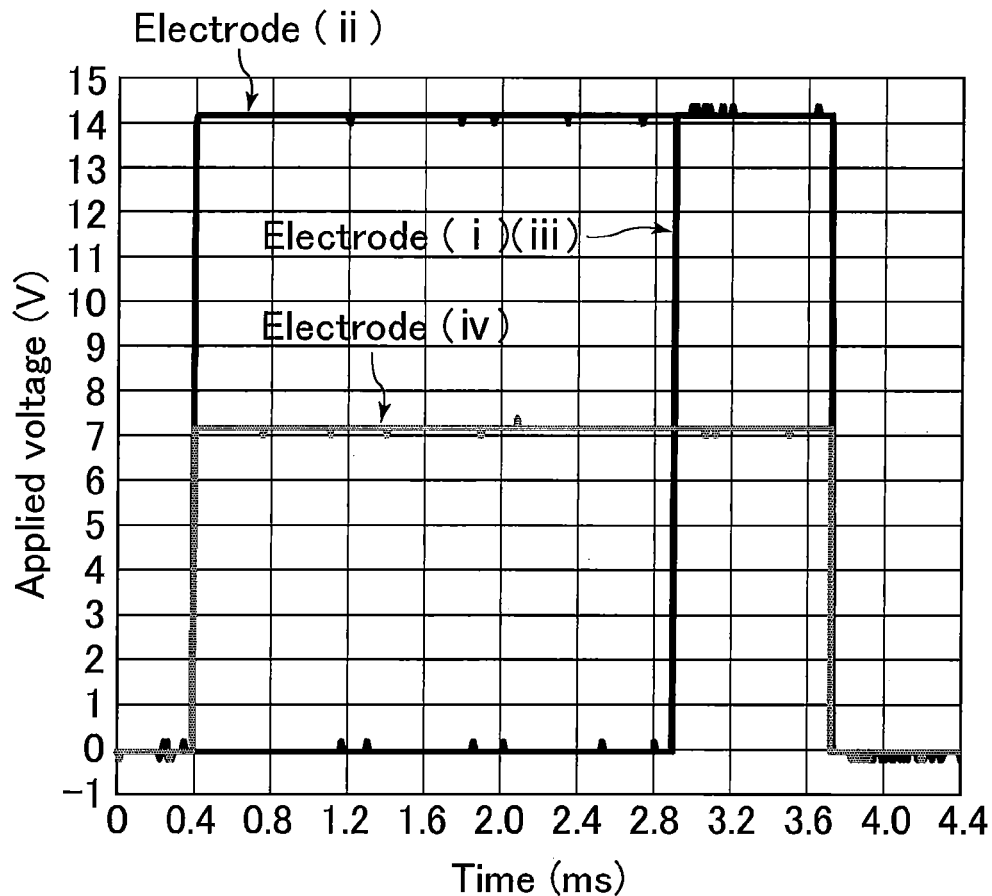
FIG. 13 is a graph showing applied rectangular waves (drive waveforms) of electrodes in Embodiment 2.

FIG. 11 is a sectional schematic diagram of a liquid crystal display panel according to Embodiment 2 in generation of a horizontal electric field. FIG. 12 is a sectional schematic diagram of the liquid crystal display panel according to Embodiment 2 in generation of a vertical electric field. FIG. 13 is a graph showing applied rectangular waves (drive waveforms) of electrodes in Embodiment 2.

In the driving method described in Embodiment 1, in generation of a horizontal electric field, the common electrode 13 and the common electrode 23 are applied an intermediate voltage (7 V) of a voltage difference (14 V) between one pair of comb electrodes. However, in Embodiment 2, the potential of a common electrode 113 is set to be equal to the potential of a comb electrode 117 serving as one of one pair of comb electrodes, and the potential of a common electrode 123 is set to the intermediate voltage (7 V) of the voltage difference (14 V) between one pair of comb electrodes (Embodiment 2). The other configurations of Embodiment 2 are the same as those in Embodiment 1.

Embodiment 3

Figure 14:
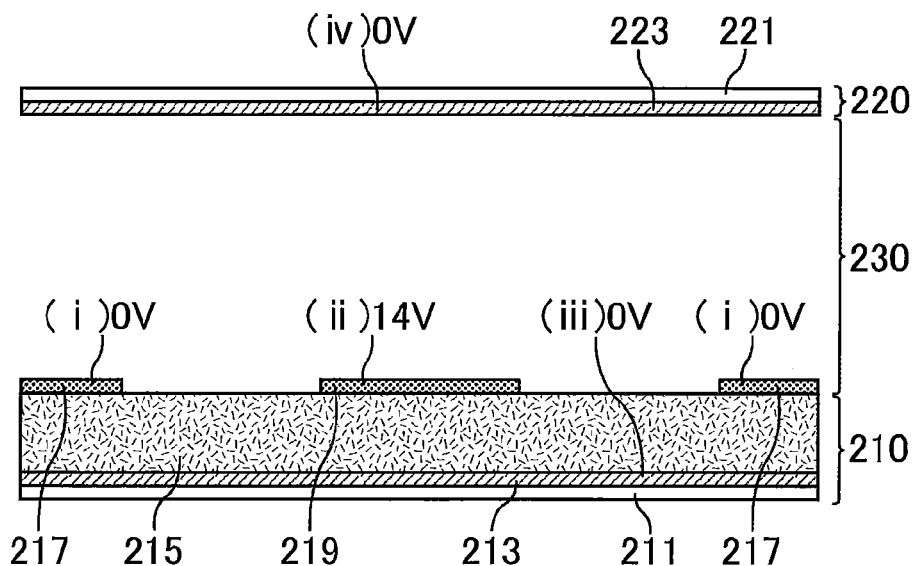
FIG. 14 is a sectional schematic diagram of a liquid crystal display panel according to Embodiment 3 in generation of a horizontal electric field.
Figure 15:
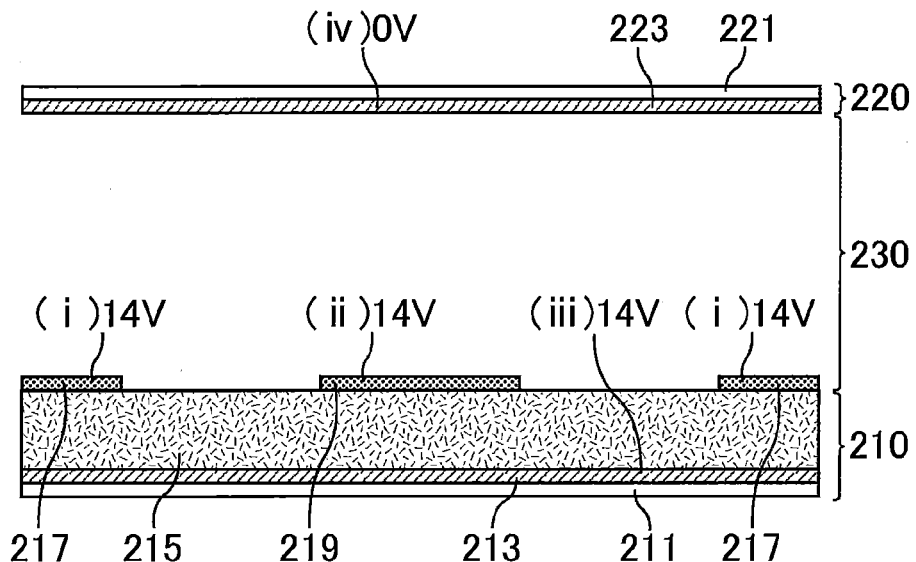
FIG. 15 is a sectional schematic diagram of the liquid crystal display panel according to Embodiment 3 in generation of a vertical electric field.
Figure 16:
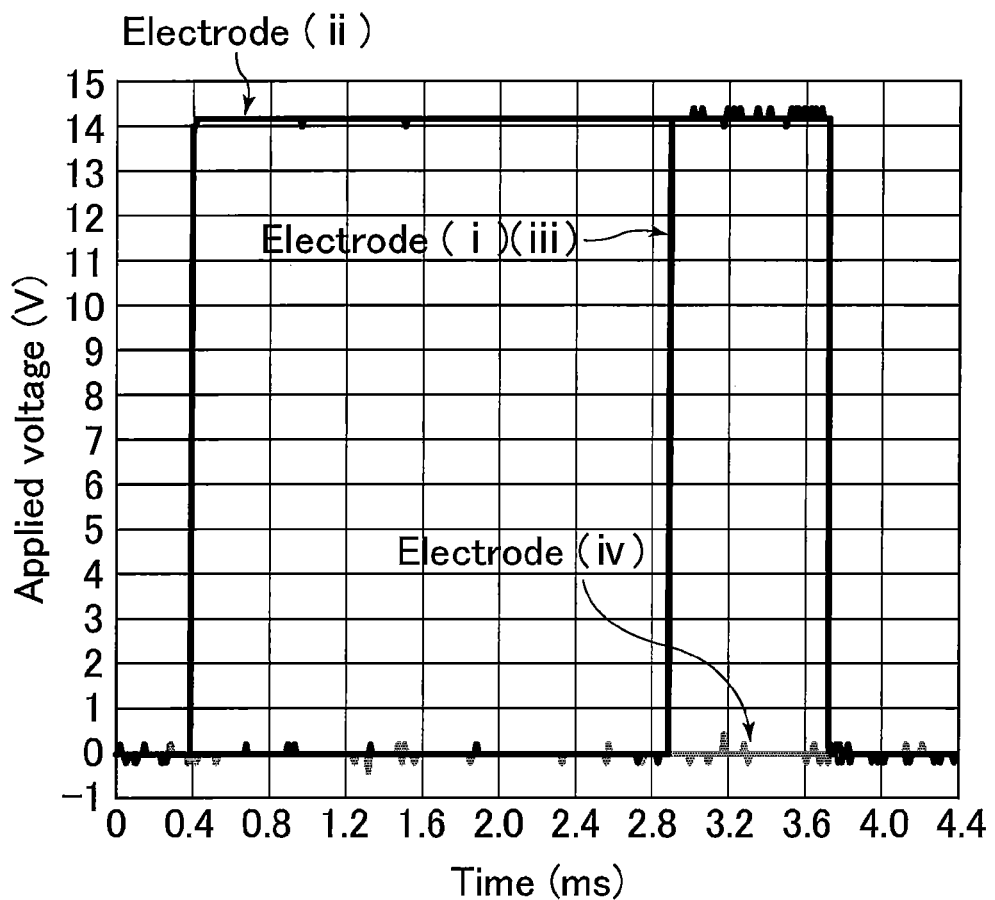
FIG. 16 is a graph showing applied rectangular waves (drive waveforms) of electrodes in Embodiment 3.

FIG. 14 is a sectional schematic diagram of a liquid crystal display panel according to Embodiment 3 in generation of a horizontal electric field. FIG. 15 is a sectional schematic diagram of the liquid crystal display panel according to Embodiment 3 in generation of a vertical electric field. FIG. 16 is a graph showing applied rectangular waves (drive waveforms) of electrodes in Embodiment 3.

In Embodiment 3, the potential of a common electrode 213 is set to be equal to the potential of a comb electrode 217 serving as one of one pair of comb electrodes, and a potential of a common electrode 223 is set to 0 V. The other configurations are the same as those in Embodiment 1.

Figure 17:
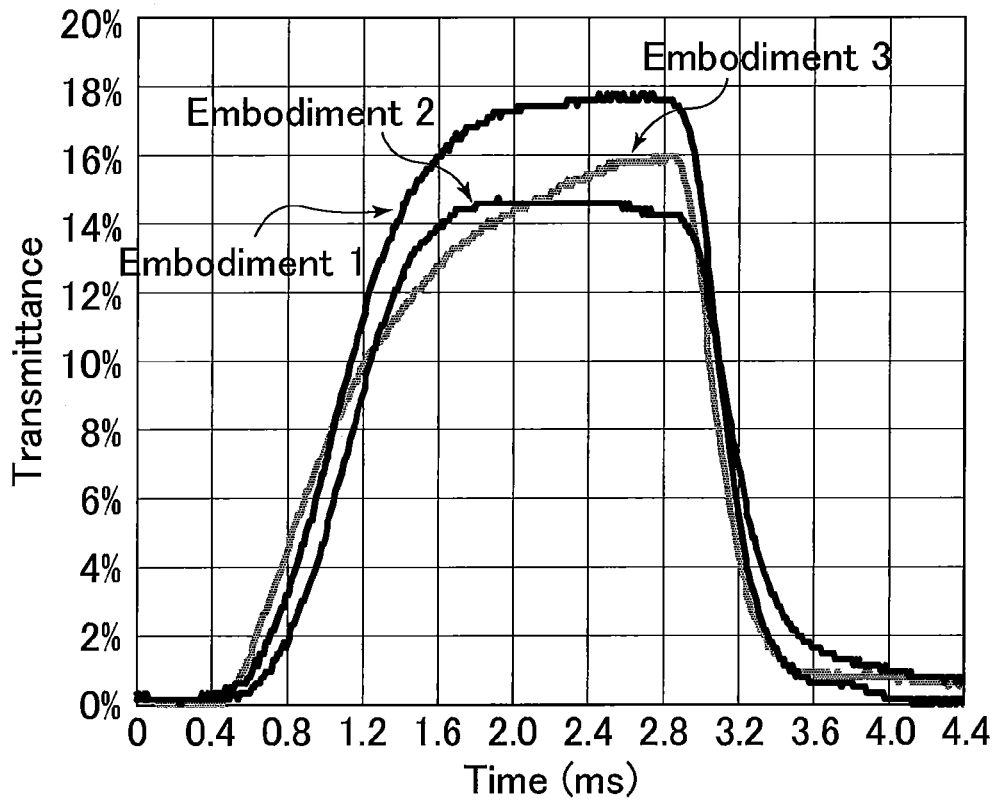
FIG. 17 is a graph showing drive response waveform measurement values in Embodiments 1 to 3.

FIG. 17 is a graph showing drive response waveform measurement values in Embodiments 1 to 3. In Embodiment 2 and Embodiment 3 using other driving methods, as in Embodiment 1, response performance and transmittances were measured. For example, as an evaluation cell, a cell having a cell thickness of 5.4 µm was used. An electrode interval between one pair of comb electrodes was set to 2.6 µm. A measurement temperature was set to 25° C. In this case, as in Embodiment 1, also in Embodiment 2 and Embodiment 3, it was confirmed that response performance and a transmittance that were higher than those in Comparative Example 1 (simulation transmittance of 3.6%) could be achieved while maintaining a high-speed response as shown in FIG. 17.

(TFT Driving Method)

Embodiment 1

Figure 18:
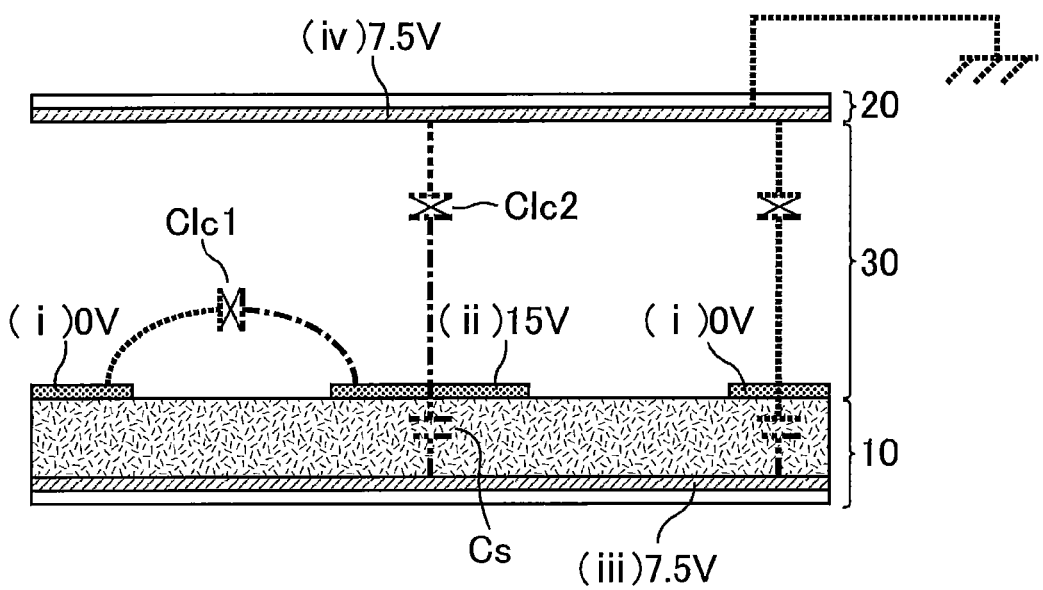
FIG. 18 is a sectional schematic diagram of the liquid crystal display panel according to Embodiment 1.
Figure 19:
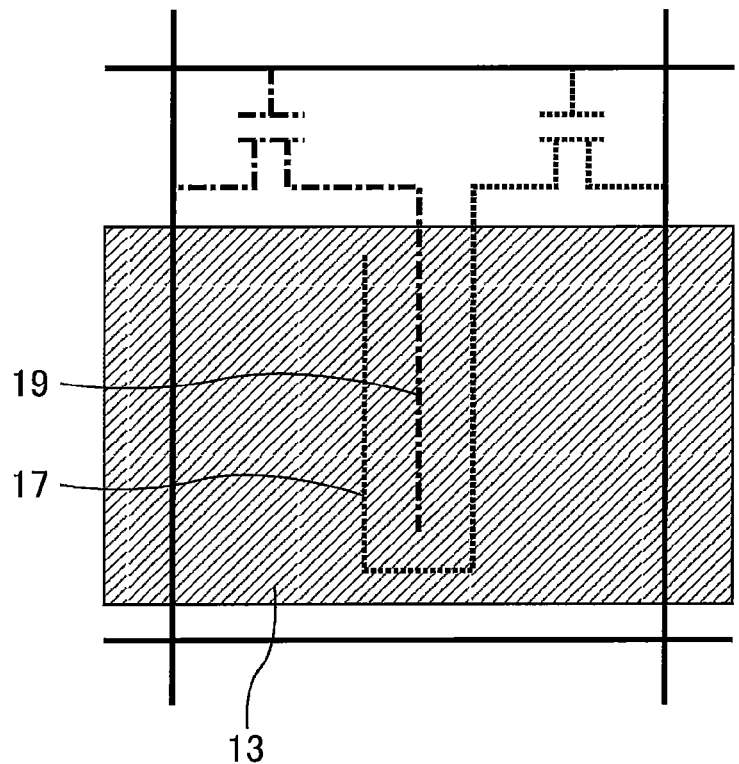
FIG. 19 is a pixel planar diagram of the liquid crystal display panel according to Embodiment 1.
Figure 20:
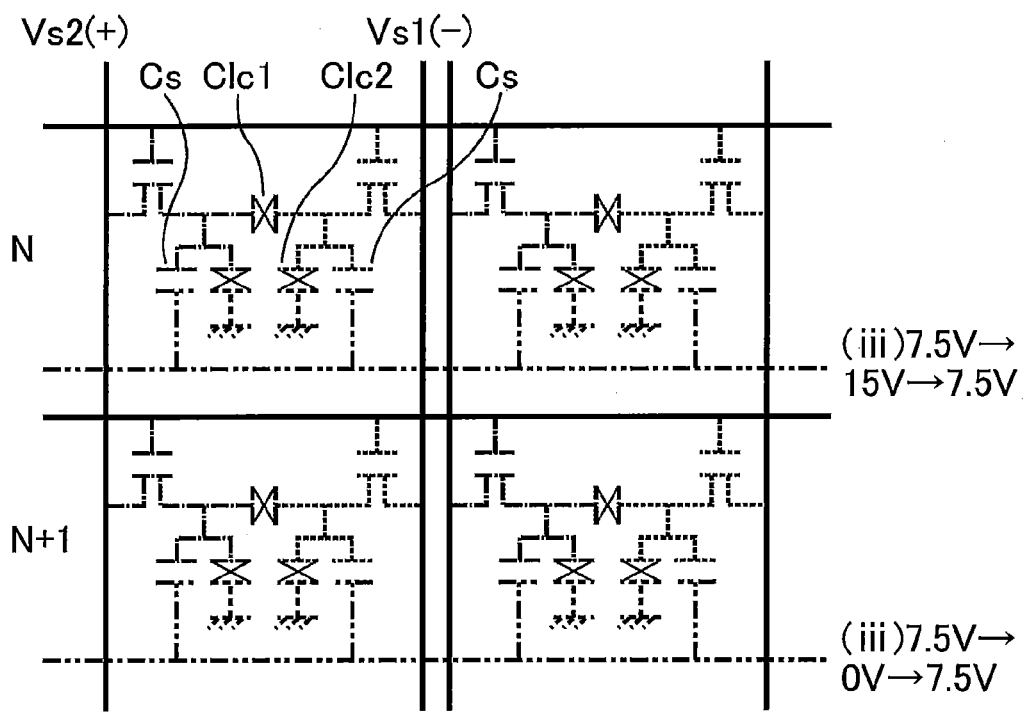
FIG. 20 is a pixel equivalent circuit diagram of the liquid crystal display panel according to Embodiment 1.
Figure 21:
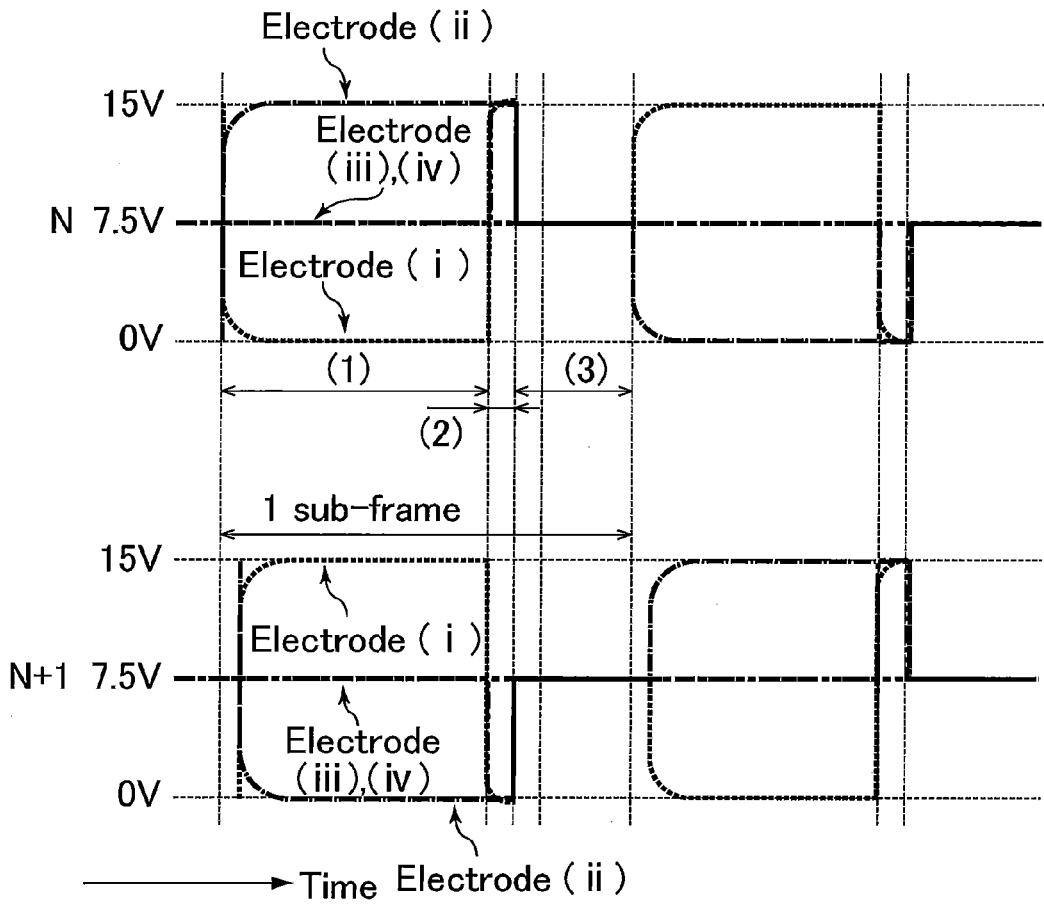
FIG. 21 is a diagram showing potential changes of electrodes in the liquid crystal display panel according to Embodiment 1.

FIG. 18 is a sectional schematic diagram of the liquid crystal display panel according to Embodiment 1. FIG. 19 is a pixel planar diagram of the liquid crystal display panel according to Embodiment 1. FIG. 20 is a pixel equivalent circuit diagram of the liquid crystal display panel according to Embodiment 1. FIG. 21 is a diagram showing potential changes of electrodes in the liquid crystal display panel according to Embodiment 1. As a driving method in a module in Embodiment 1, the method is performed such that two TFTs are driven per pixel. In FIG. 18 to FIG. 21, a wiring electrically connected to a lower electrode of a lower substrate is indicated by a chain double-dashed line. A wiring electrically connected to one of one pair of comb electrodes of the lower substrate is indicated by a chain line. A wiring electrically connected to the other of the pair of comb electrodes of the lower substrate is indicated by a narrower-interval dotted line in the corresponding drawing. A wiring electrically connected to the electrode of the upper substrate is indicated by a wider-interval dotted line in the corresponding drawing. The lower electrodes also serve as Cs electrodes and are connected in units of sets respectively including even-number lines and odd-number lines in common. In FIG. 18, an auxiliary capacitor formed by overlapping the comb electrode and the Cs electrode is indicated by Cs, a liquid crystal capacitor formed between one pair of comb electrodes is indicated by Clc1, and a liquid crystal capacitor formed between electrodes of one pair of substrates is indicated by Clc2.

At pixels on an Nth row, a voltage applied to the lower electrode is 7.5 V in a bright display state, thereafter, becomes 15 V in a dark display (black display) state, and is 7.5 V in an initializing step. At pixels on an (N+1)th row, a voltage applied to the lower electrode is 7.5 V in a bright display state, thereafter, becomes 0 V in a dark display (black display) state, and is 7.5 V in the initializing step. The Nth row and the (N+1)th row may be an even-number line and an odd-number line, respectively, and may be an odd-number line and an even-number line, respectively. In Embodiment 1, a voltage is applied to the lower electrodes respectively connected in units of sets respectively including the even-number lines and the odd-number lines in common to invert a potential change. Note that a potential of an electrode kept at a predetermined voltage is expressed as 7.5 V. Since this also means that the potential is substantially 0 V, it can also be said that the N line and (N+1) line are driven such that polarities are inverted.

Figure 22:
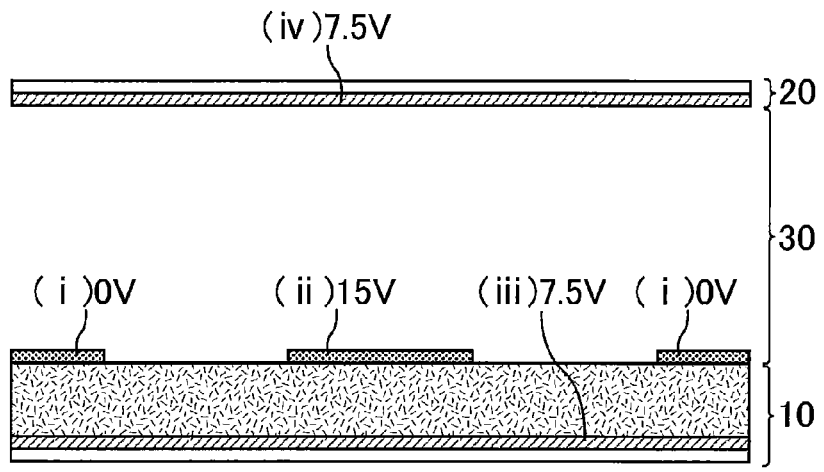
FIG. 22 is a sectional schematic diagram showing electrodes of an Nth row in the liquid crystal display panel according to Embodiment 1 in generation of a horizontal electric field.
Figure 23:
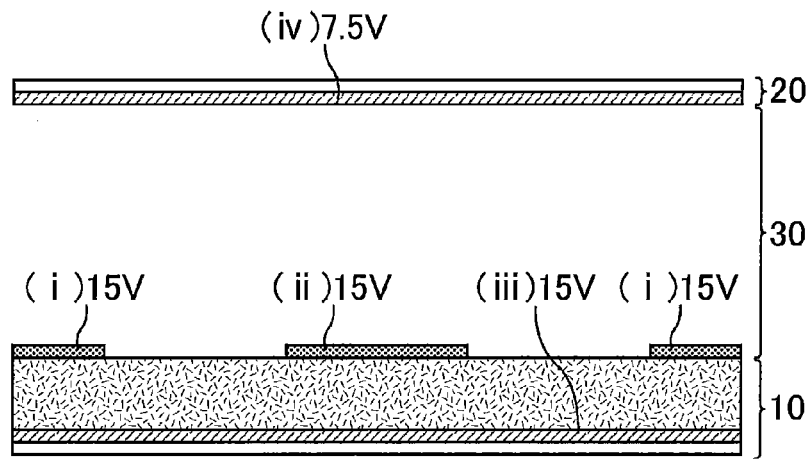
FIG. 23 is a sectional schematic diagram showing the electrodes of the Nth row in the liquid crystal display panel according to Embodiment 1 in generation of a vertical electric field.
Figure 24:
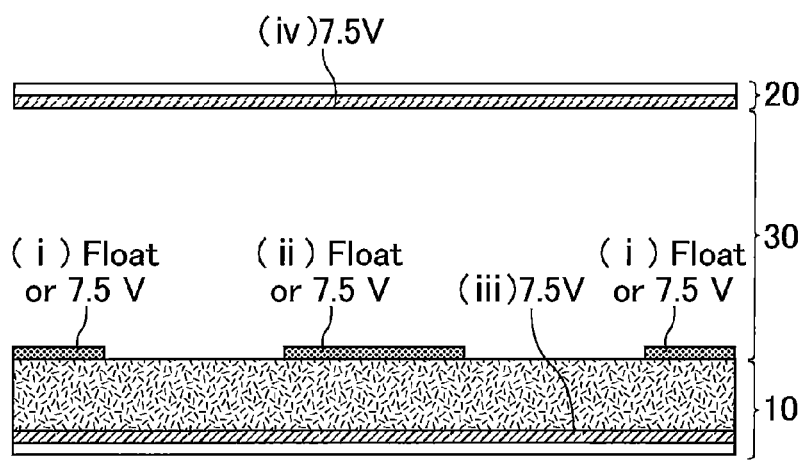
FIG. 24 is a sectional schematic diagram showing electrodes of the Nth row in an initializing step in the liquid crystal display panel according to Embodiment 1 after generation of a vertical electric field.
Figure 25:
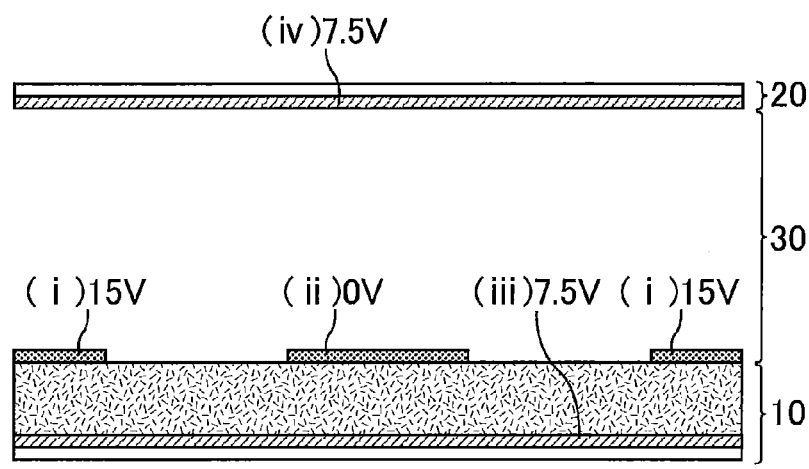
FIG. 25 is a sectional schematic diagram showing electrodes of an (N+1)th row in the liquid crystal display panel according to Embodiment 1 in generation of a horizontal electric field.
Figure 26:
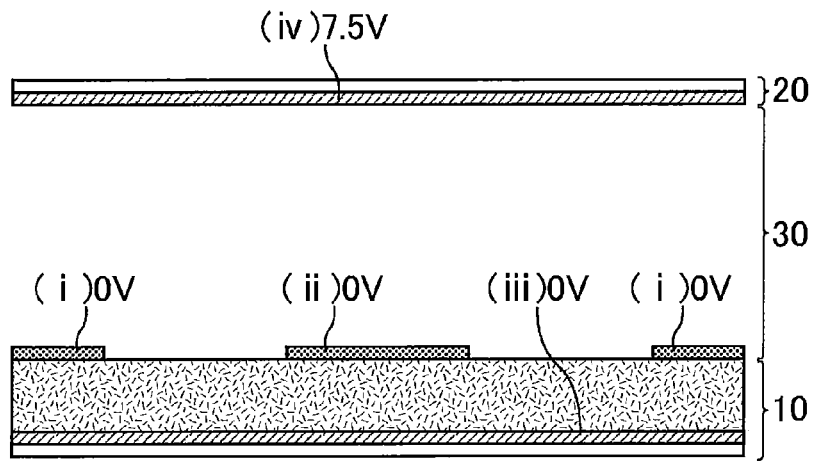
FIG. 26 is a sectional schematic diagram showing the electrodes of the (N+1)th row in the liquid crystal display panel according to Embodiment 1 in generation of a vertical electric field.
Figure 27:
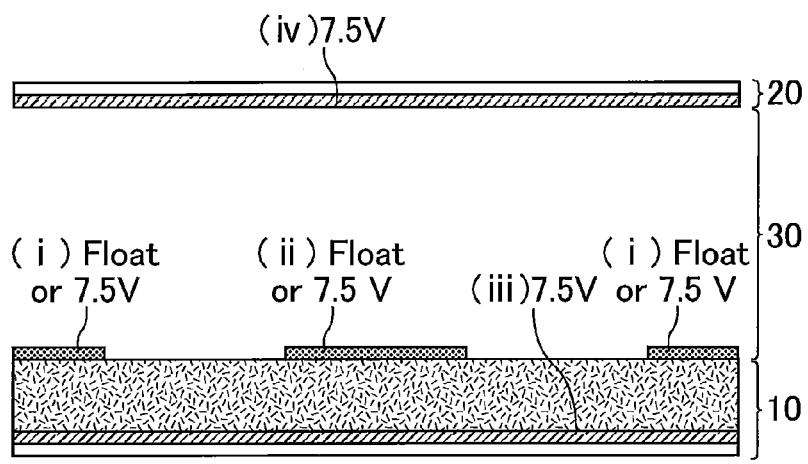
FIG. 27 is a sectional schematic diagram showing electrodes of the (N+1)th row in the initializing step in the liquid crystal display panel according to Embodiment 1 after generation of a vertical electric field.

FIG. 22 is a sectional schematic diagram showing electrodes of an Nth row in the liquid crystal display panel according to Embodiment 1 in generation of a horizontal electric field. FIG. 23 is a sectional schematic diagram showing the electrodes of the Nth row in the liquid crystal display panel according to Embodiment 1 in generation of a vertical electric field. FIG. 24 is a sectional schematic diagram showing electrodes of the Nth row in an initializing step in the liquid crystal display panel according to Embodiment 1 after generation of a vertical electric field. FIG. 25 is a sectional schematic diagram showing electrodes of an (N+1)th row in the liquid crystal display panel according to Embodiment 1 in generation of a horizontal electric field. FIG. 26 is a sectional schematic diagram showing the electrodes of the (N+1)th row in the liquid crystal display panel according to Embodiment 1 in generation of a vertical electric field. FIG. 27 is a sectional schematic diagram showing electrodes of the (N+1)th row in the initializing step in the liquid crystal display panel according to Embodiment 1 after generation of a vertical electric field.

In FIGS. 22 and 25, a liquid crystal is driven by a horizontal electric field between one pair of comb electrodes. In FIGS. 23 and 26, the comb electrode and the lower electrode are set to 15 V or 0 V to perform vertical electric field application (TFTs are turned in units of sets respectively including even-number lines and odd-number lines). In FIGS. 24 and 27, the TFTs are turned off to float one pair of comb electrodes, or all the TFTs are turned on to set one pair of comb electrodes to 7.5 V, and refreshing (initializing step) is performed to initial alignment by the lower electrode having a voltage of 7.5 V.

The liquid crystal display device including the liquid crystal display panel according to Embodiment 1 can arbitrarily include a member (for example, a light source or the like) included in a general liquid crystal display device. The configuration is also used in the following embodiment.

Embodiment 2

Figure 28:
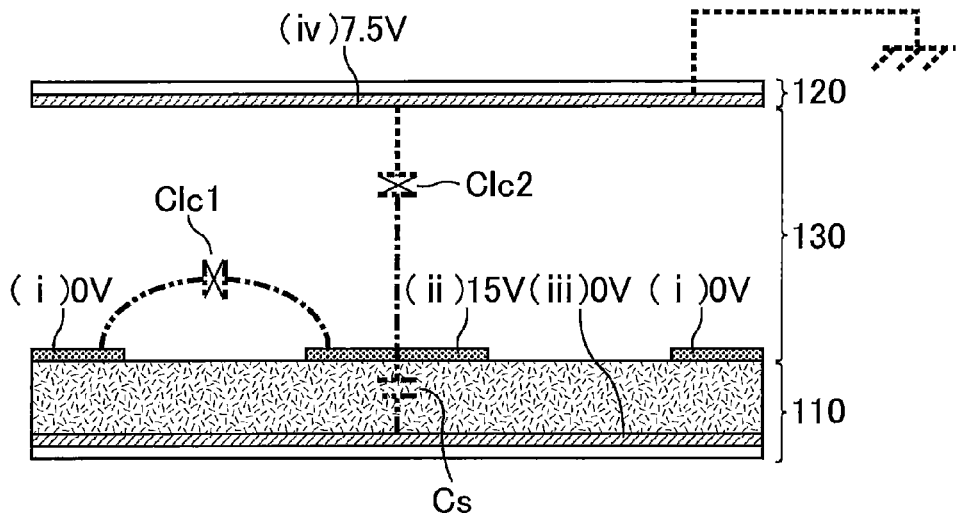
FIG. 28 is a sectional schematic diagram of the liquid crystal display panel according to Embodiment 2.
Figure 29:
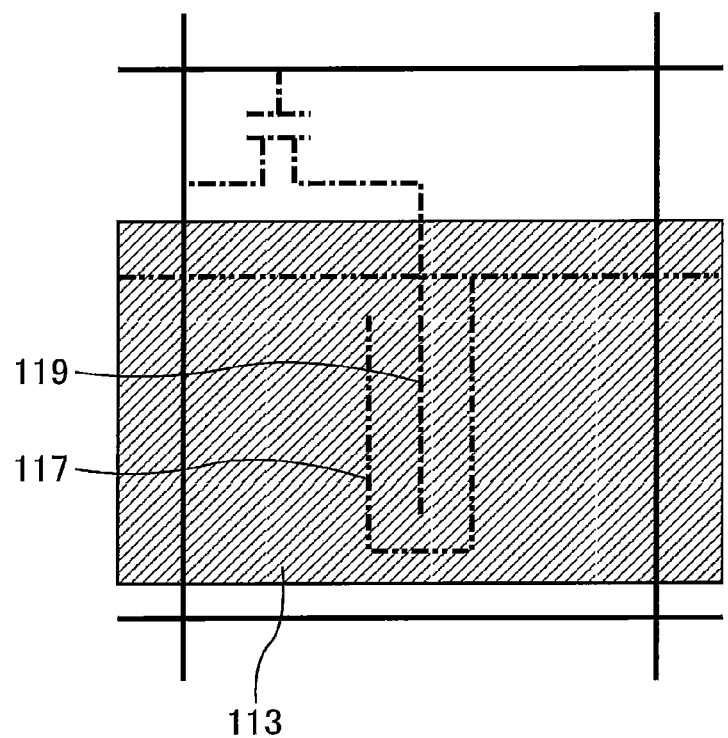
FIG. 29 is a pixel planar diagram of the liquid crystal display panel according to Embodiment 2.
Figure 30:
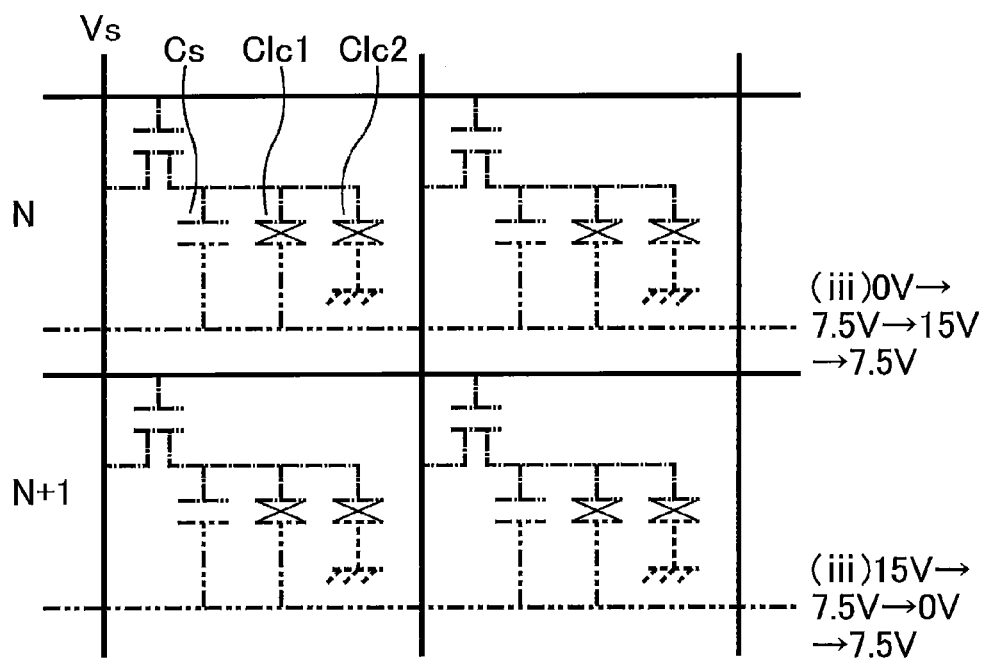
FIG. 30 is a pixel equivalent circuit diagram of the liquid crystal display panel according to Embodiment 2.
Figure 31:
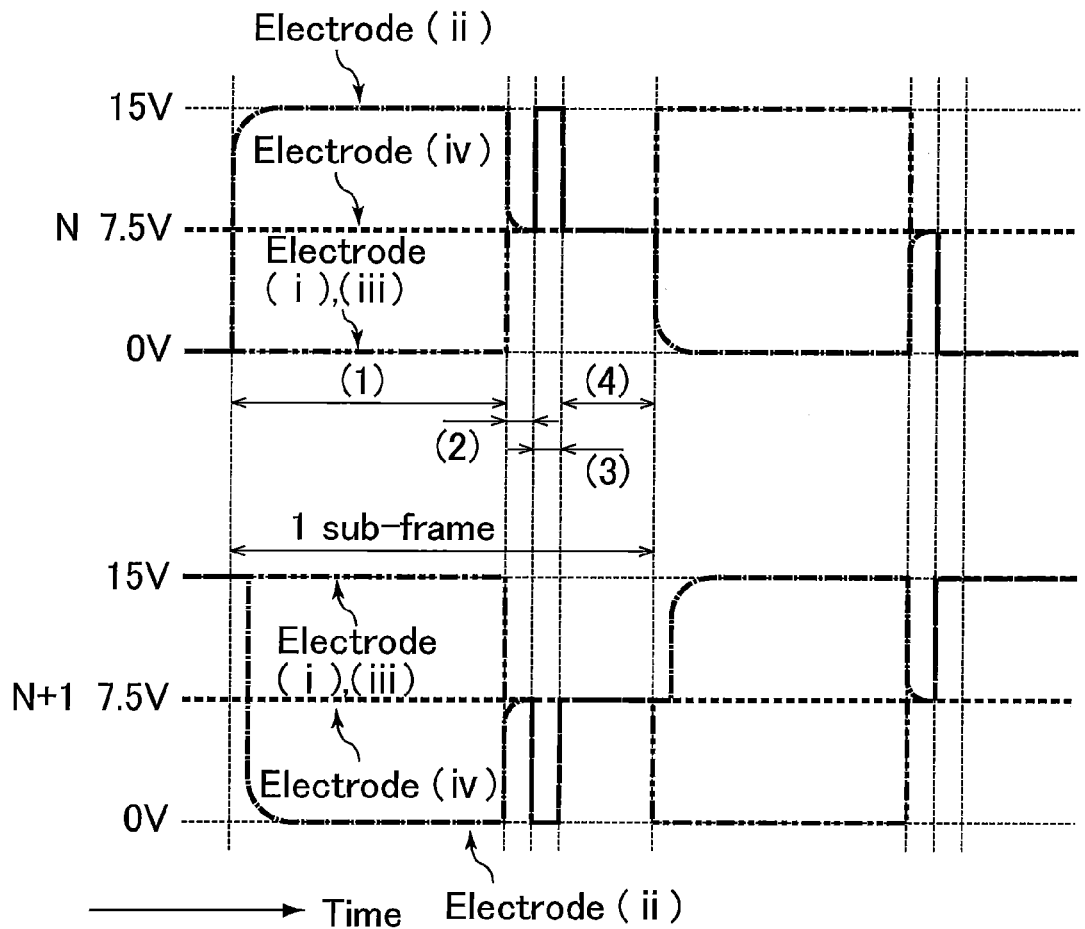
FIG. 31 is a diagram showing potential changes of electrodes in the liquid crystal display panel according to Embodiment 2.

FIG. 28 is a sectional schematic diagram of a liquid crystal display panel according to Embodiment 2. FIG. 29 is a pixel planar diagram of the liquid crystal display panel according to Embodiment 2. FIG. 30 is a pixel equivalent circuit diagram of the liquid crystal display panel according to Embodiment 2. FIG. 31 is a diagram showing potential changes of electrodes in the liquid crystal display panel according to Embodiment 2.

As a driving method in a module in Embodiment 2, the method is performed such that one TFT is driven per pixel.

In FIG. 28 to FIG. 31, a wiring electrically connected to a lower electrode of a lower substrate is indicated by a chain double-dashed line. A wiring electrically connected to one of one pair of comb electrodes of the lower substrate is indicated by a chain line. A wiring electrically connected to the other of one pair of comb electrodes of the lower substrate is indicated by a chain double-dashed line because the other of the comb electrodes is electrically connected to the lower electrode of the lower substrate. A wiring electrically connected to the electrode of the upper substrate is indicated by a dotted line. The lower electrodes also serve as Cs electrodes and are connected in units of sets respectively including even-number lines and odd-number lines in common.

On the pixels of the Nth row, a voltage applied to the lower electrode is 0 V in a bright display state. Thereafter, in a dark display (black display) state, after an initializing step at 7.5 V (all TFTs are turned on) is performed, the voltage is set to 15 V in application of a vertical electric field and set to 7.5 V in an initializing step performed after the application of the vertical electric field. On the pixels of the (N+1)th row, a voltage applied to the lower electrode is 15 V in a bright display state. Thereafter, in a dark display (black display) state, after an initializing step at 7.5 V (all TFTs are turned on) is performed, the voltage is set to 0 V in application of a vertical electric field and set to 7.5 V in an initializing step performed after the application of the vertical electric field. The Nth row and the (N+1)th row may be an even-number line and an odd-number line, respectively, and may be an odd-number line and an even-number line, respectively. In Embodiment 2, a voltage is applied to the lower electrodes connected in units of sets respectively including the even-number lines and the odd-number lines in common to invert a potential change. Note that a potential of an electrode kept at a predetermined voltage is expressed as 7.5 V. Since this also means that the potential is substantially 0 V, it can also be said that the N line and (N+1) line are driven such that polarities are inverted.

Figure 32:
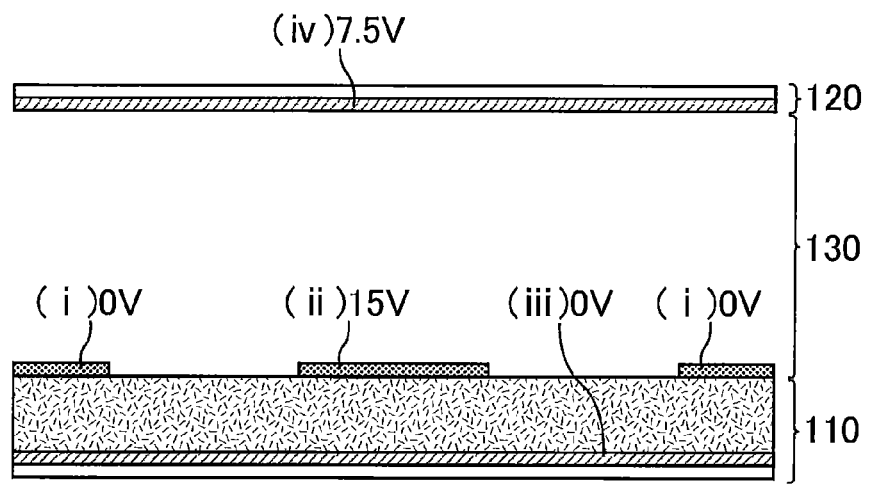
FIG. 32 is a sectional schematic diagram showing electrodes of an Nth row in the liquid crystal display panel according to Embodiment 2 in generation of a horizontal electric field.
Figure 33:
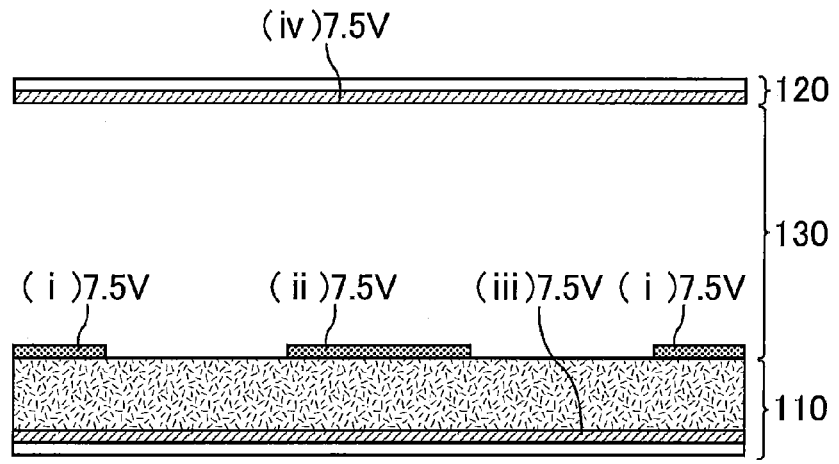
FIG. 33 is a sectional schematic diagram showing electrodes of the Nth row in the initializing step in the liquid crystal display panel according to Embodiment 2 after generation of a vertical electric field.
Figure 34:
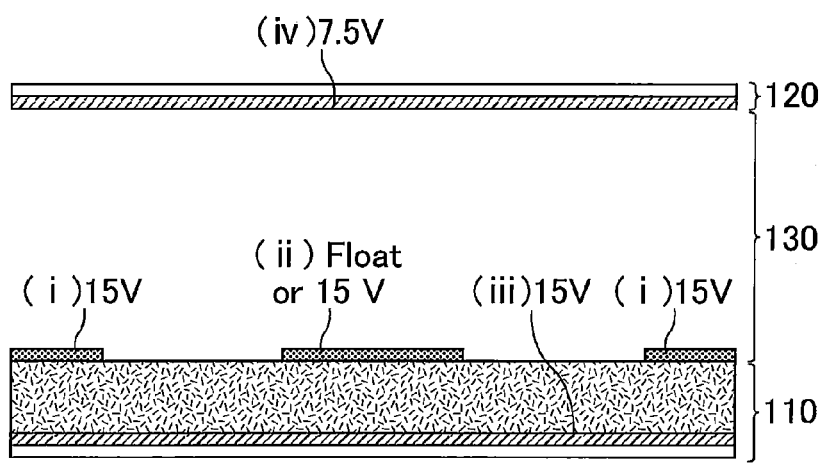
FIG. 34 is a sectional schematic diagram showing the electrodes of the Nth row in the liquid crystal display panel according to Embodiment 2 in generation of a vertical electric field.
Figure 35:
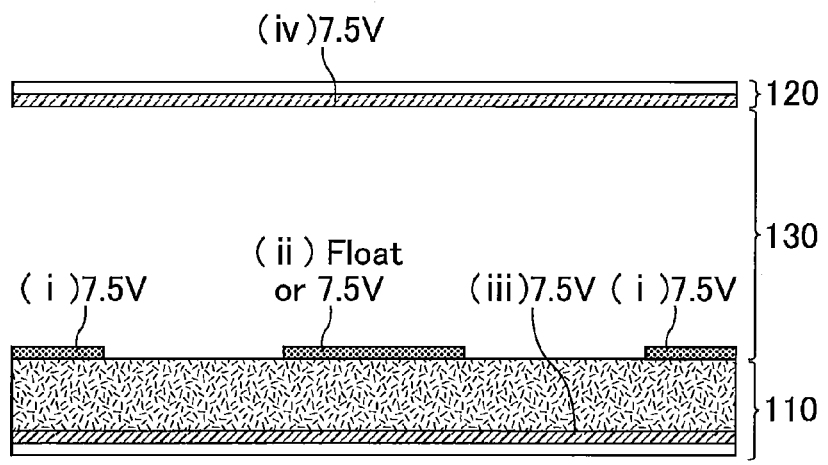
FIG. 35 is a sectional schematic diagram showing the electrodes of the Nth row in the initializing step in the liquid crystal display panel according to Embodiment 2 after generation of a vertical electric field.
Figure 36:
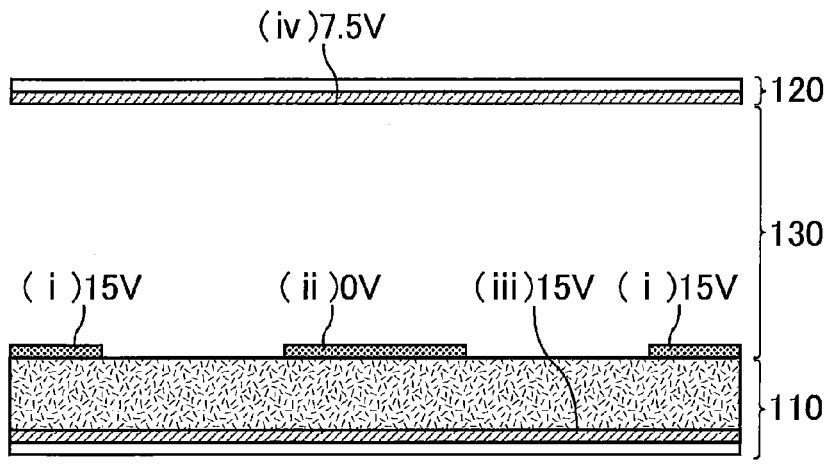
FIG. 36 is a sectional schematic diagram showing electrodes of an (N+1)th row in the liquid crystal display panel according to Embodiment 2 in generation of a horizontal electric field.
Figure 37:
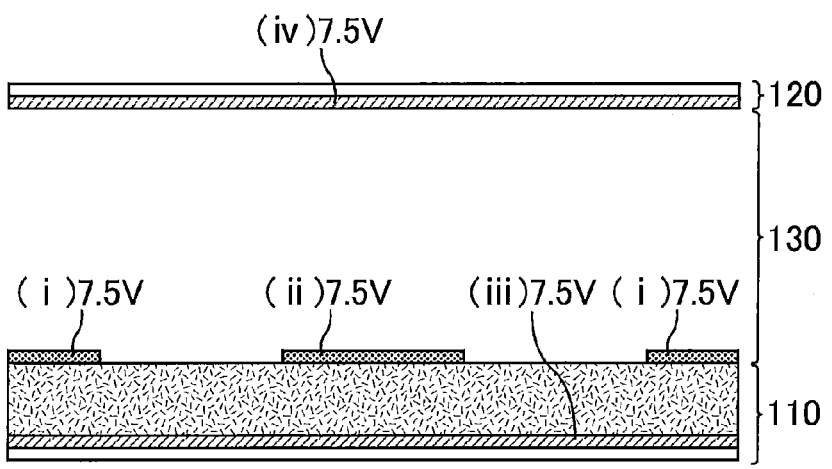
FIG. 37 is a sectional schematic diagram showing the electrodes of the (N+1)th row in the initializing step in the liquid crystal display panel according to Embodiment 2 after generation of a horizontal electric field.
Figure 38:
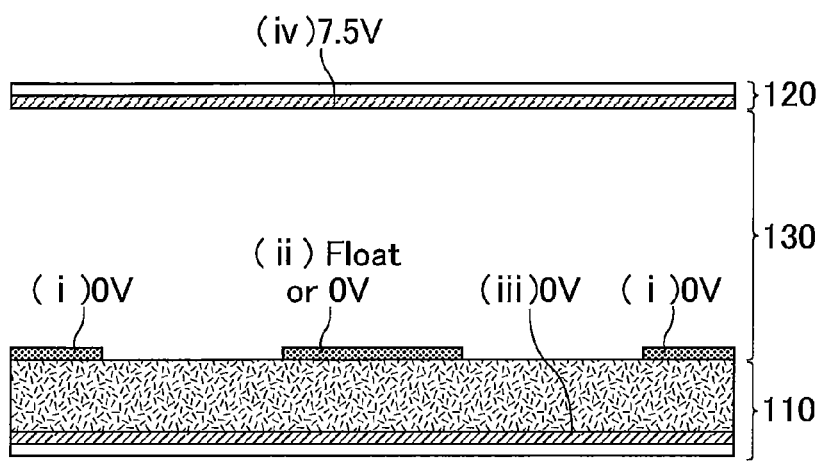
FIG. 38 is a sectional schematic diagram showing the electrodes of the (N+1)th row in the liquid crystal display panel according to Embodiment 2 in generation of a vertical electric field.
Figure 39:
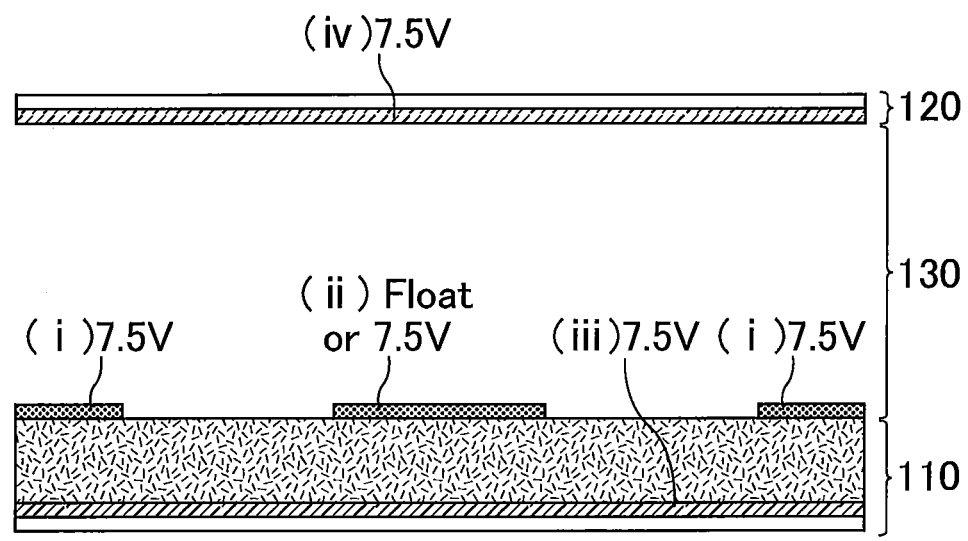
FIG. 39 is a sectional schematic diagram showing the electrodes of the (N+1)th row in the initializing step in the liquid crystal display panel according to Embodiment 2 after generation of a vertical electric field.

FIG. 32 is a sectional schematic diagram showing electrodes of the Nth row in the liquid crystal display panel according to Embodiment 2 in generation of a horizontal electric field. FIG. 33 is a sectional schematic diagram showing electrodes of the Nth row in the initializing step in the liquid crystal display panel according to Embodiment 2 after generation of a horizontal electric field. FIG. 34 is a sectional schematic diagram showing the electrodes of the Nth row in the liquid crystal display panel according to Embodiment 2 in generation of a vertical electric field. FIG. 35 is a sectional schematic diagram showing the electrodes of the Nth row in the initializing step in the liquid crystal display panel according to Embodiment 2 after generation of a vertical electric field. FIG. 36 is a sectional schematic diagram showing electrodes of an (N+1)th row in the liquid crystal display panel according to Embodiment 2 in generation of a horizontal electric field. FIG. 37 is a sectional schematic diagram showing the electrodes of the (N+1)th row in the initializing step in the liquid crystal display panel according to Embodiment 2 after generation of a horizontal electric field. FIG. 38 is a sectional schematic diagram showing the electrodes of the (N+1)th row in the liquid crystal display panel according to Embodiment 2 in generation of a vertical electric field. FIG. 39 is a sectional schematic diagram showing the electrodes of the (N+1)th row in the initializing step in the liquid crystal display panel according to Embodiment 2 after generation of a vertical electric field.

In FIGS. 32 and 36, a liquid crystal is driven by a horizontal electric field between one pair of comb electrodes. In FIGS. 33 and 37, all the TFTs are turned on, and all the electrodes are reset to 7.5 V once. In FIGS. 34 and 38, the TFTs are turned off to float one of one pair of comb electrodes, or the TFTs are turned on in units of sets respectively including even-number lines and odd-number lines to set one of one pair of comb electrodes to 15 V or 0 V and set the lower electrode to 15 V or 0 V, so that a vertical electric field is applied. In FIGS. 35 and 39, the TFTs are turned off to float one of one pair of comb electrodes, or all the TFTs are turned on to set one pair of comb electrodes to 7.5 V, and refreshing (initializing step) is performed to initial alignment by the lower electrode having a voltage of 7.5 V. Other reference numerals in the drawings according to Embodiment 2 are the same as those in the drawings according to Embodiment 1 except that 1 is added as each hundred's digit.

Modification of Embodiment 2

Figure 40:
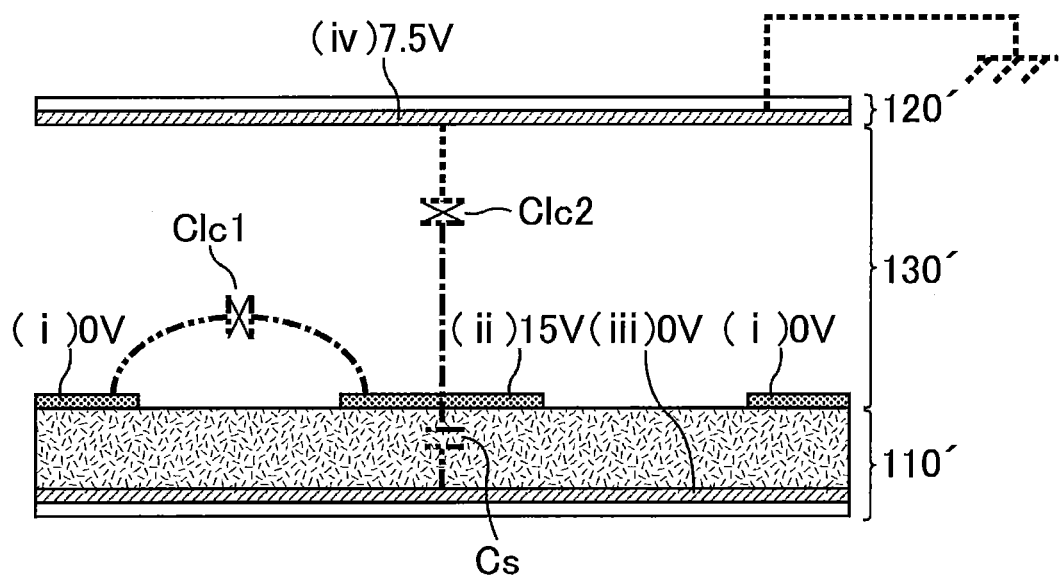
FIG. 40 is a sectional schematic diagram of the liquid crystal display panel according to a modification of Embodiment 2.
Figure 41:
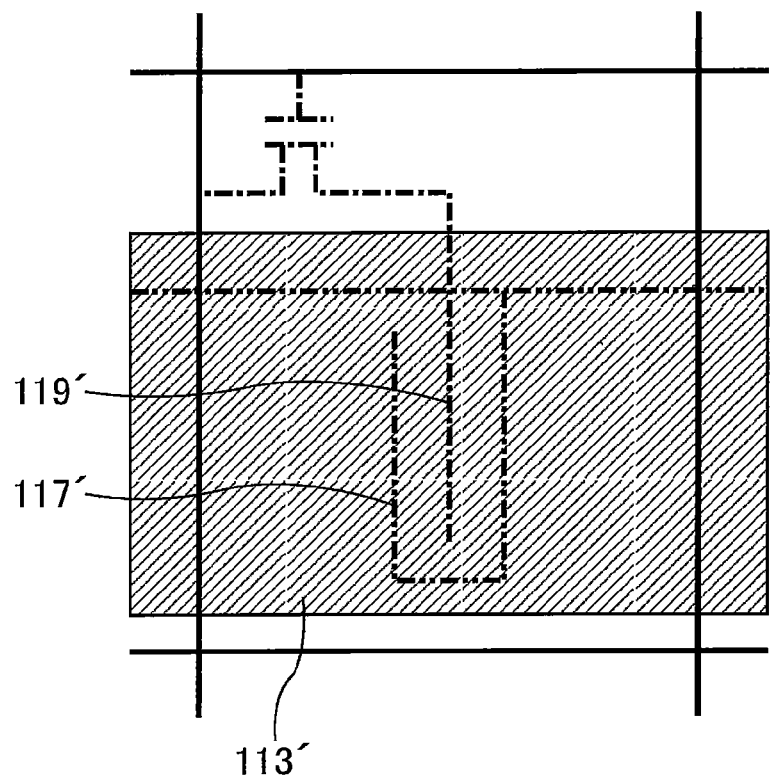
FIG. 41 is a pixel planar diagram of the liquid crystal display panel according to the modification of Embodiment 2.
Figure 42:
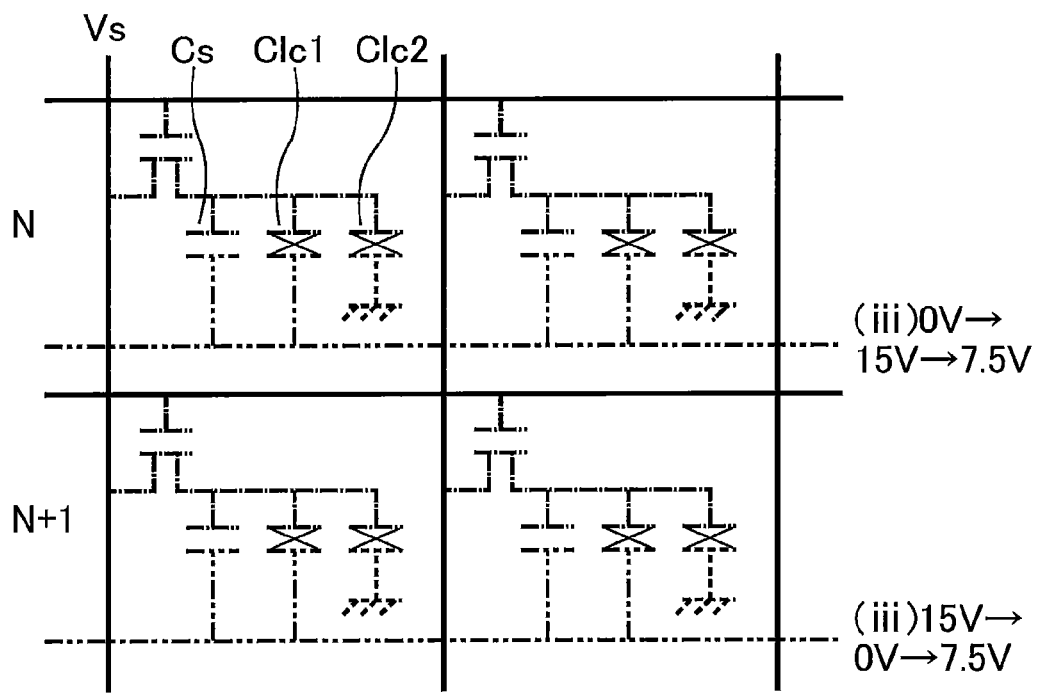
FIG. 42 is a pixel equivalent circuit diagram of the liquid crystal display panel according to the modification of Embodiment 2.
Figure 43:
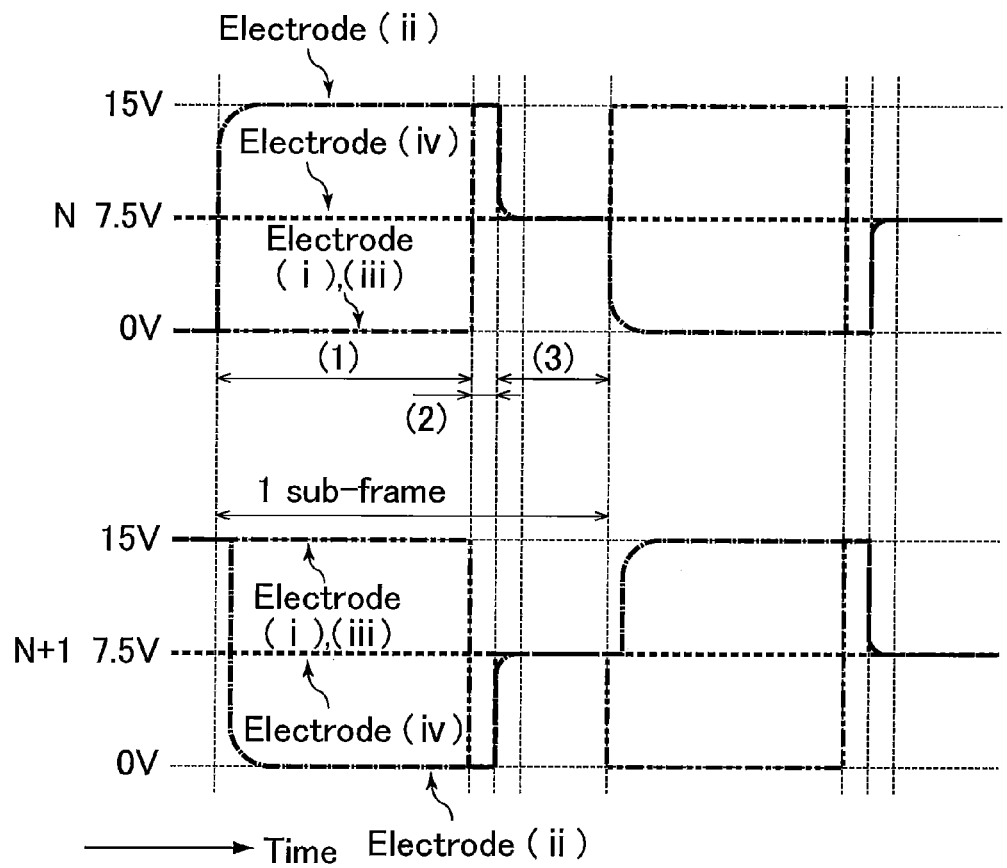
FIG. 43 is a diagram showing potential changes of electrodes in the liquid crystal display panel according to the modification of Embodiment 2.

FIG. 40 is a sectional schematic diagram of the liquid crystal display panel according to a modification of Embodiment 2. FIG. 41 is a pixel planar diagram of the liquid crystal display panel according to the modification of Embodiment 2. FIG. 42 is a pixel equivalent circuit diagram of the liquid crystal display panel according to the modification of Embodiment 2. FIG. 43 is a diagram showing potential changes of electrodes in the liquid crystal display panel according to the modification of Embodiment 2.

As a driving method in a module in Modification of Embodiment 2, the method is performed such that one TFT is driven per pixel.

In FIG. 40 to FIG. 43, a wiring electrically connected to a lower electrode of a lower substrate is indicated by a chain double-dashed line. A wiring electrically connected to one of one pair of comb electrodes of the lower substrate is indicated by a chain line. A wiring electrically connected to the other of one pair of comb electrodes of the lower substrate is indicated by a chain double-dashed line because the other of the comb electrodes is electrically connected to the lower electrode of the lower substrate. A wiring electrically connected to the electrode of the upper substrate is indicated by a dotted line. The lower electrodes also serve as Cs electrodes and are connected in units of sets respectively including even-number lines and odd-number lines in common.

At pixels on an Nth row, a voltage applied to the lower electrode is 0 V in a bright display state, thereafter, becomes 15 V in a dark display (black display) state, and is 7.5 V in an initializing step in the dark display (black display) state. At pixels on an (N+1)th row, a voltage applied to the lower electrode is 15 V in a bright display state, thereafter, becomes 0 V in a dark display (black display) state, and is 7.5 V in the initializing step in the dark display (black display) state. The Nth row and the (N+1)th row may be an even-number line and an odd-number line, respectively, and may be an odd-number line and an even-number line, respectively. In the Modification of Embodiment 2, a voltage is applied to the lower electrodes connected in units of sets including the even-number lines and the odd-number lines in common to invert a potential change. Note that a potential of an electrode kept at a predetermined voltage is expressed as 7.5 V. Since this also means that the potential is substantially 0 V, it can also be said that the N line and (N+1) line are driven such that polarities are inverted.

Figure 44:
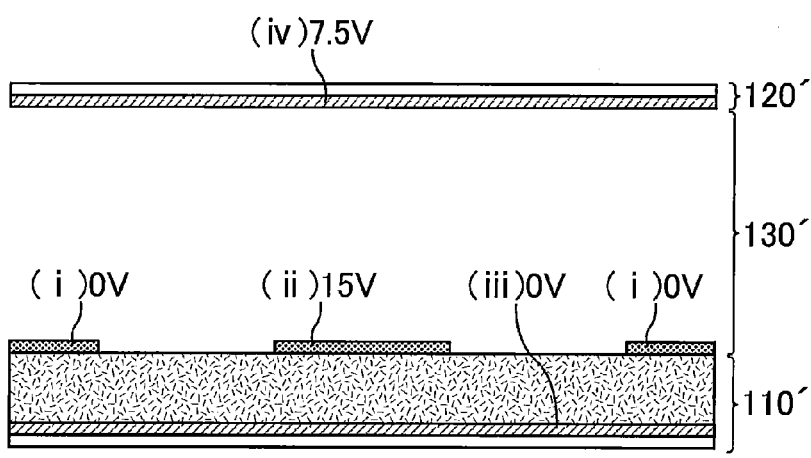
FIG. 44 is a sectional schematic diagram showing electrodes of an Nth row in the liquid crystal display panel according to the modification of Embodiment 2 in generation of a horizontal electric field.
Figure 45:
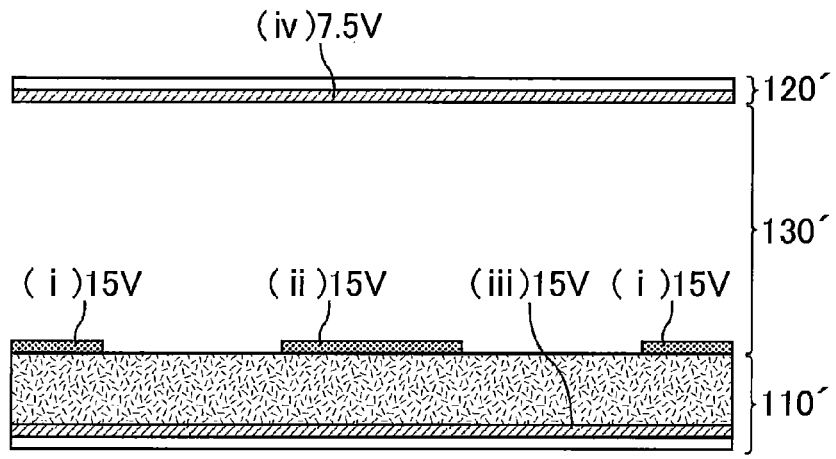
FIG. 45 is a sectional schematic diagram showing the electrodes of the Nth row in the liquid crystal display panel according to the modification of Embodiment 2 in generation of a vertical electric field.
Figure 46:
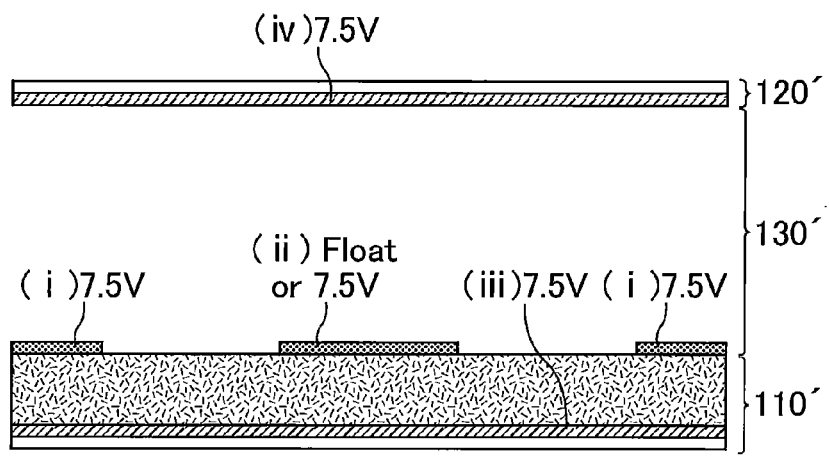
FIG. 46 is a sectional schematic diagram showing the electrodes of the Nth row in an initializing step in the liquid crystal display panel according to modification of Embodiment 2 after generation of a vertical electric field.
Figure 47:
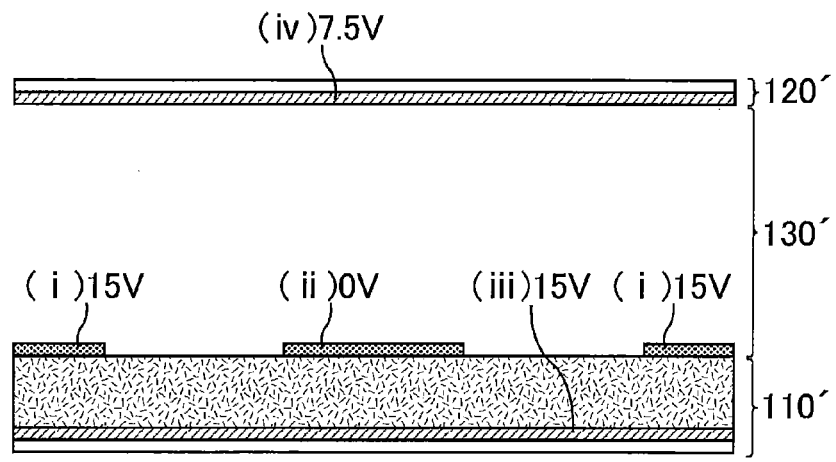
FIG. 47 is a sectional schematic diagram showing electrodes of the (N+1)th row in the liquid crystal display panel according to the modification of Embodiment 2 in generation of a horizontal electric field.
Figure 48:
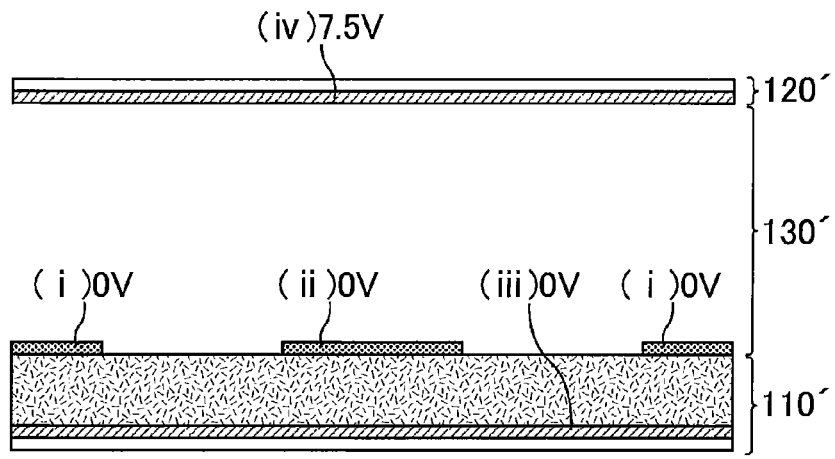
FIG. 48 is a sectional schematic diagram showing the electrodes of the (N+1)th row in the liquid crystal display panel according to the modification of Embodiment 2 in generation of a vertical electric field.
Figure 49:
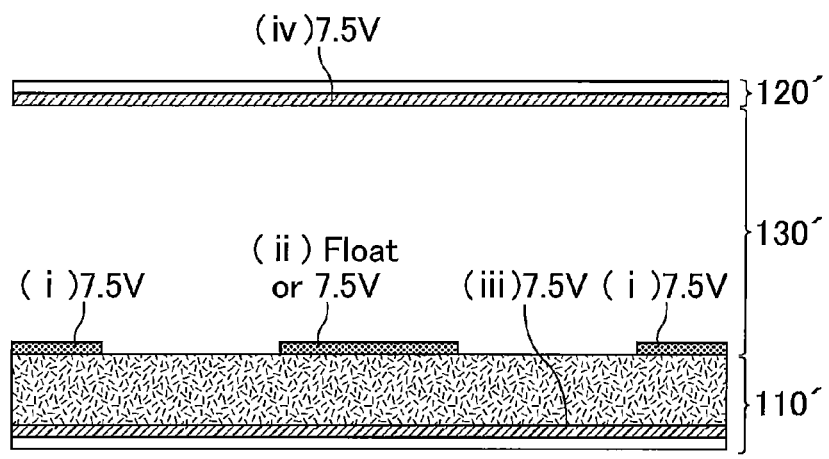
FIG. 49 is a sectional schematic diagram showing the electrodes of the (N+1)th row in the initializing step in the liquid crystal display panel according to modification of Embodiment 2 after generation of a vertical electric field.

FIG. 44 is a sectional schematic diagram showing electrodes of an Nth row in the liquid crystal display panel according to the modification of Embodiment 2 in generation of a horizontal electric field. FIG. 45 is a sectional schematic diagram showing the electrodes of the Nth row in the liquid crystal display panel according to the modification of Embodiment 2 in generation of a vertical electric field. FIG. 46 is a sectional schematic diagram showing the electrodes of the Nth row in an initializing step in the liquid crystal display panel according to modification of Embodiment 2 after generation of a vertical electric field. FIG. 47 is a sectional schematic diagram showing electrodes of the (N+1)th row in the liquid crystal display panel according to the modification of Embodiment 2 in generation of a horizontal electric field. FIG. 48 is a sectional schematic diagram showing the electrodes of the (N+1)th row in the liquid crystal display panel according to the modification of Embodiment 2 in generation of a vertical electric field. FIG. 49 is a sectional schematic diagram showing the electrodes of the (N+1)th row in the initializing step in the liquid crystal display panel according to modification of Embodiment 2 after generation of a vertical electric field.

In FIGS. 44 and 47, a liquid crystal is driven by a horizontal electric field between one pair of comb electrodes. In FIGS. 45 and 48, TFTs are turned on in units of sets respectively including even-number lines and odd-number lines, and the comb electrode and the lower electrode are set to 15 V or 0 V, so that a vertical electric field is applied. In FIGS. 46 and 49, the TFTs are turned off to float one of one pair of comb electrodes, or all the TFTs are turned on to set one pair of comb electrodes to 7.5 V, and refreshing (initializing step) is performed to initial alignment by the lower electrode having a voltage of 7.5 V. Other reference numerals in the drawings according to the modification of Embodiment 2 are the same as those in the drawings according to Embodiment 1 except that 1 is added as each hundred's digit and that "'" is added to each of the reference numerals.

Embodiment 3

Figure 50:
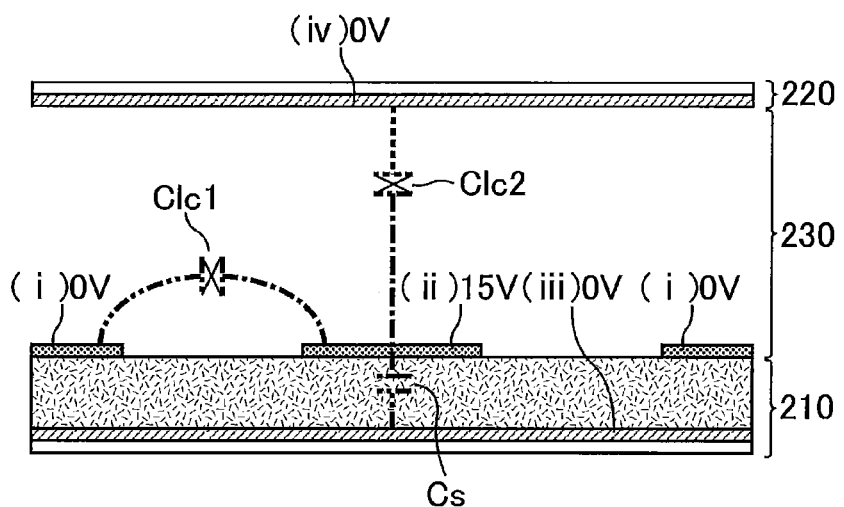
FIG. 50 is a sectional schematic diagram of a liquid crystal display panel according to Embodiment 3.
Figure 51:
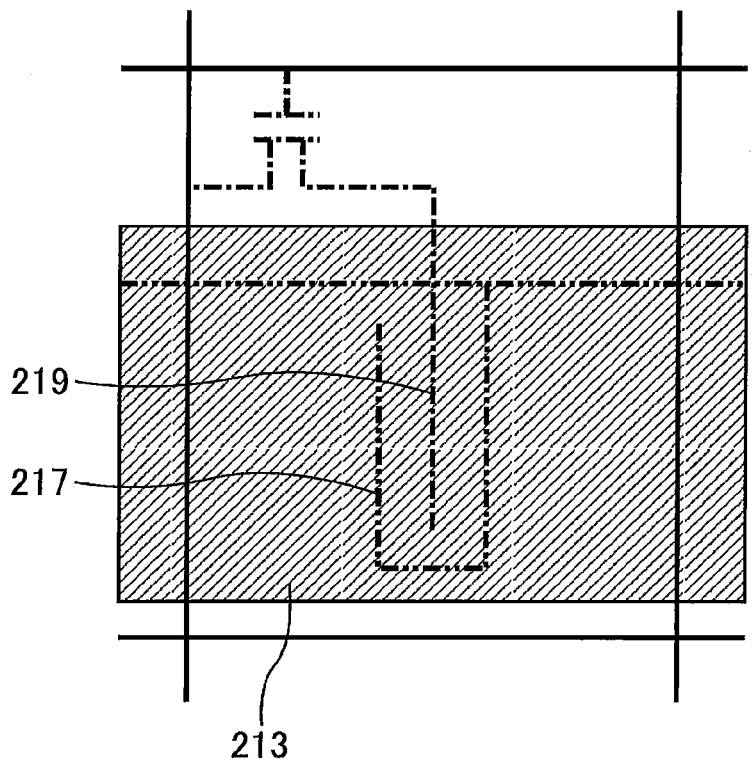
FIG. 51 is a pixel planar diagram of the liquid crystal display panel according to Embodiment 3.
Figure 52:
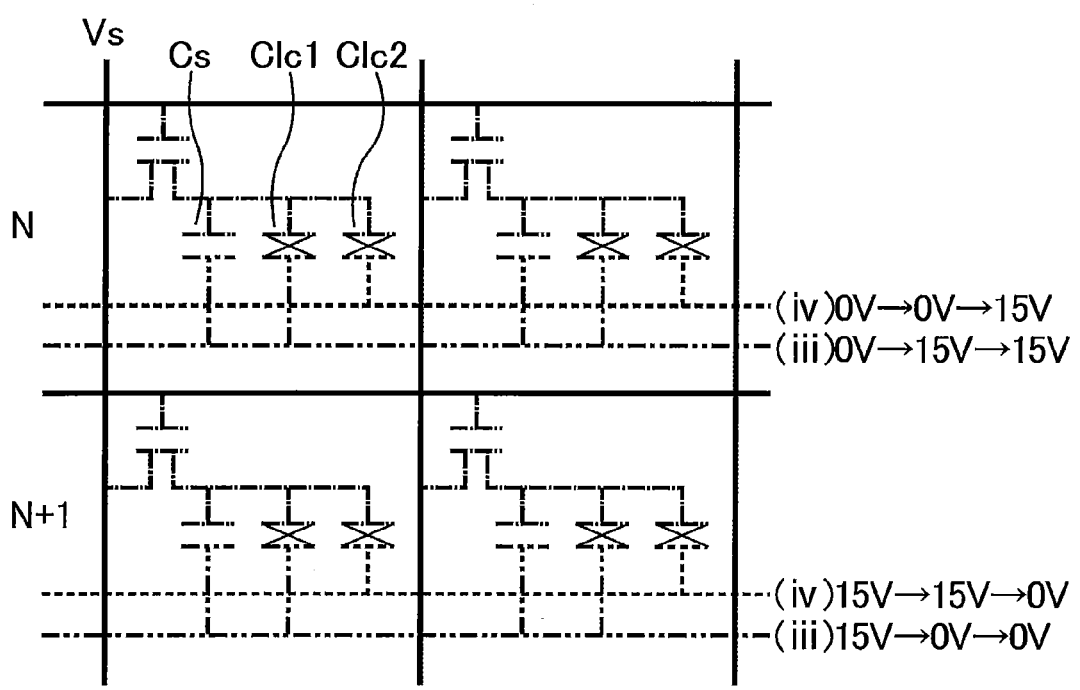
FIG. 52 is a pixel equivalent circuit diagram of the liquid crystal display panel according to Embodiment 3.
Figure 53:
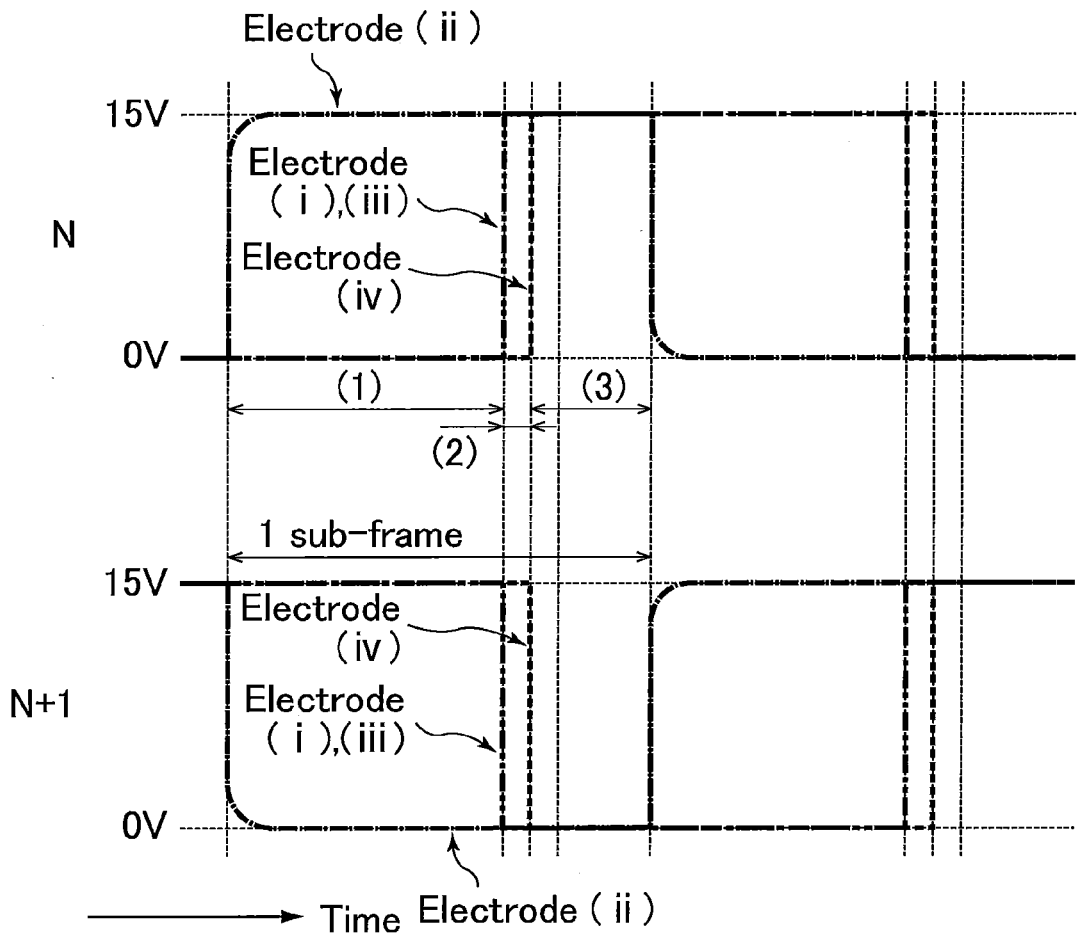
FIG. 53 is a diagram showing potential changes of electrodes in the liquid crystal display panel according to Embodiment 3.

FIG. 50 is a sectional schematic diagram of a liquid crystal display panel according to Embodiment 3. FIG. 51 is a pixel planar diagram of the liquid crystal display panel according to Embodiment 3. FIG. 52 is a pixel equivalent circuit diagram of the liquid crystal display panel according to Embodiment 3. FIG. 53 is a diagram showing potential changes of electrodes in the liquid crystal display panel according to Embodiment 3.

As a driving method in a module in Embodiment 3, the method is performed such that one TFT is driven per pixel.

In FIG. 50 to FIG. 53, a wiring electrically connected to a lower electrode of a lower substrate is indicated by a chain double-dashed line. A wiring electrically connected to one of one pair of comb electrodes of the lower substrate is indicated by a chain line. A wiring electrically connected to the other of one pair of comb electrodes of the lower substrate is indicated by a chain double-dashed line because the other of the comb electrodes is electrically connected to the lower electrode of the lower substrate. A wiring electrically connected to the electrode of the upper substrate is indicated by a dotted line. The lower electrodes also serve as Cs electrodes and are connected in units of sets respectively including even-number lines and odd-number lines in common. In Embodiment 3, common electrodes on an opposed substrate side are connected in units of sets respectively including the even-number lines and the odd-number lines in common.

At pixels on an Nth row, a voltage applied to the lower electrode is 0 V in a bright display state, and thereafter, becomes 15 V in a dark display (black display) state. At pixels on an (N+1)th row, a voltage applied to the lower electrode is 15 V in a bright display state, and, thereafter, becomes 0 V in a dark display (black display) state. At the pixels on the Nth row, a voltage applied to a common electrode on an opposed substrate side is 0 V in a bright display state, and, thereafter, is kept at the voltage even in a dark display (black display) state. However, in an initializing step, the voltage becomes 15 V to invert a potential change. At the pixels on the (N+1)th row, a voltage applied to the common electrode on the opposed substrate side is 15 V in a bright display state, and, thereafter, is kept at the voltage even in a dark display (black display) state. However, in an initializing step, the voltage becomes 0 V to invert a potential change. The Nth row and the (N+1)th row may be an even-number line and an odd-number line, respectively, and may be an odd-number line and an even-number line, respectively. In Embodiment 3, voltages are applied to the lower electrodes and the common electrodes on the opposed substrate side, both of which are connected in units of sets respectively including even-number lines and odd-number lines in common, to invert potential changes.

Figure 54:
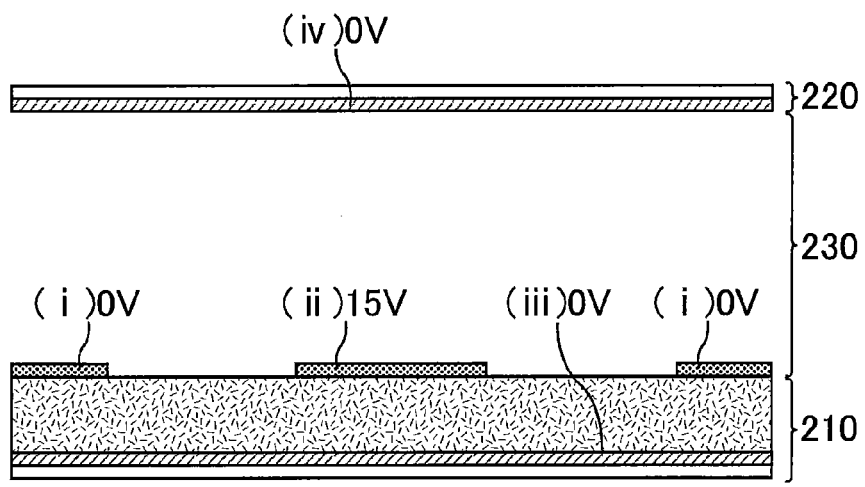
FIG. 54 is a sectional schematic diagram showing electrodes of an Nth row in the liquid crystal display panel according to Embodiment 3 in generation of a horizontal electric field.
Figure 55:
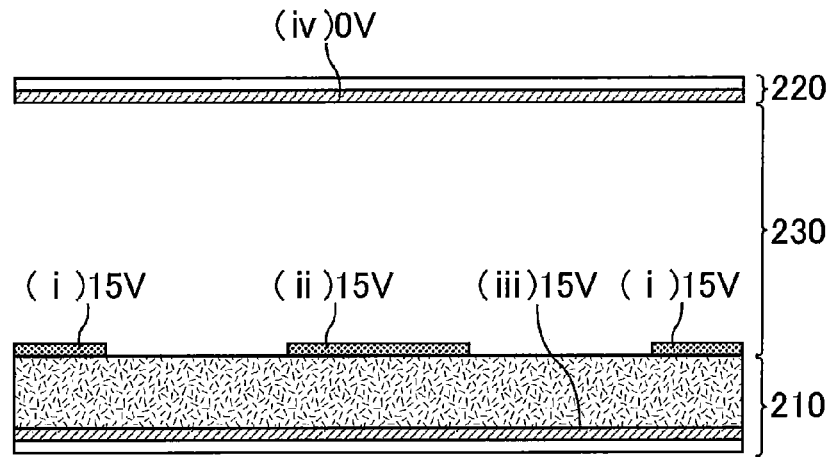
FIG. 55 is a sectional schematic diagram showing the electrodes of the Nth row in the liquid crystal display panel according to Embodiment 3 in generation of a vertical electric field.
Figure 56:
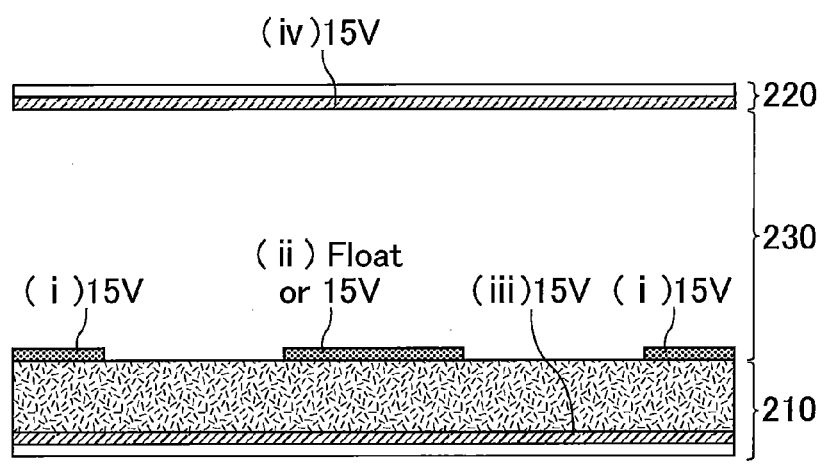
FIG. 56 is a sectional schematic diagram showing electrodes of the Nth row in an initializing step in the liquid crystal display panel according to Embodiment 3 after generation of a vertical electric field.
Figure 57:
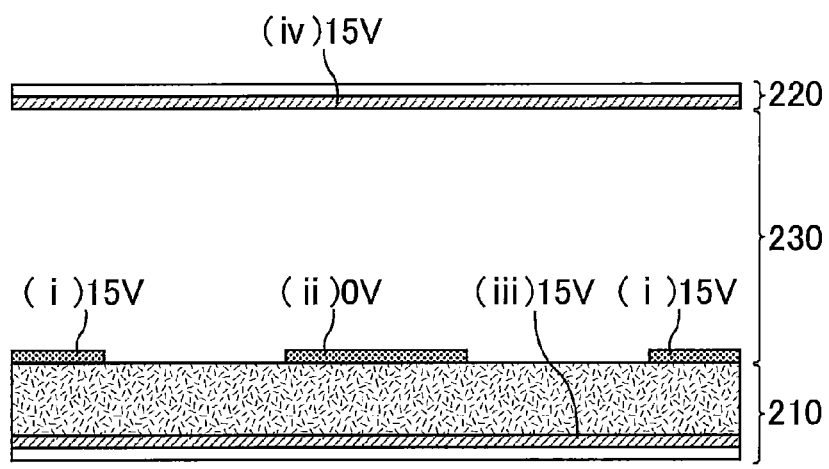
FIG. 57 is a sectional schematic diagram showing electrodes of an (N+1)th row in the liquid crystal display panel according to Embodiment 3 in generation of a horizontal electric field.
Figure 58:
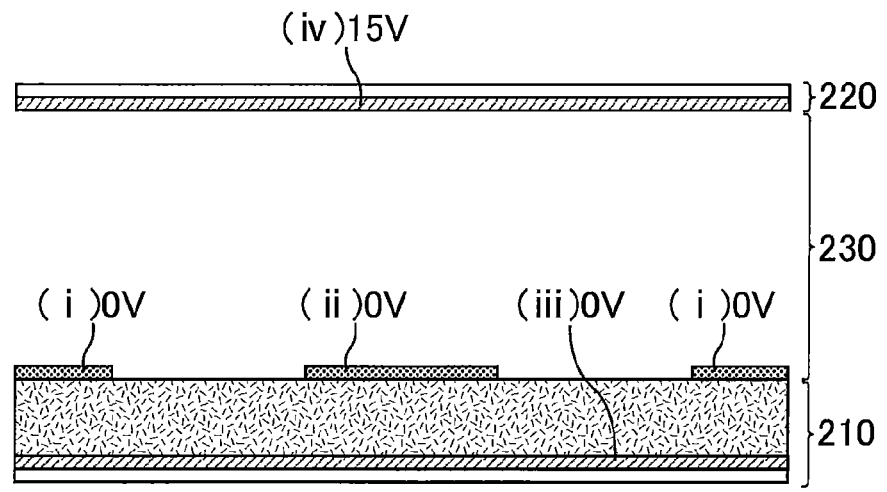
FIG. 58 is a sectional schematic diagram showing the electrodes of the (N+1)th row in the liquid crystal display panel according to Embodiment 3 in generation of a vertical electric field.
Figure 59:
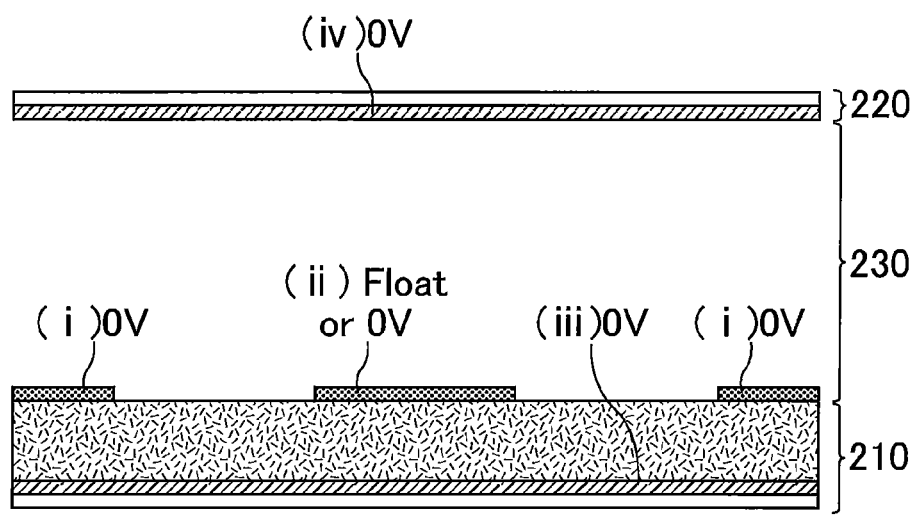
FIG. 59 is a sectional schematic diagram showing electrodes of the (N+1)th row in the initializing step in the liquid crystal display panel according to Embodiment 3 after generation of a vertical electric field.

FIG. 54 is a sectional schematic diagram showing electrodes of the Nth row in the liquid crystal display panel according to Embodiment 3 in generation of a horizontal electric field. FIG. 55 is a sectional schematic diagram showing the electrodes of the Nth row in the liquid crystal display panel according to Embodiment 3 in generation of a vertical electric field. FIG. 56 is a sectional schematic diagram showing electrodes of the Nth row in an initializing step in the liquid crystal display panel according to Embodiment 3 after generation of a vertical electric field. FIG. 57 is a sectional schematic diagram showing electrodes of an (N+1)th row in the liquid crystal display panel according to Embodiment 3 in generation of a horizontal electric field. FIG. 58 is a sectional schematic diagram showing the electrodes of the (N+1)th row in the liquid crystal display panel according to Embodiment 3 in generation of a vertical electric field. FIG. 59 is a sectional schematic diagram showing electrodes of the (N+1)th row in the initializing step in the liquid crystal display panel according to Embodiment 3 after generation of a vertical electric field.

In FIGS. 54 and 57, a liquid crystal is driven by a horizontal electric field between one pair of comb electrodes. In FIGS. 55 and 58, TFTs are turned on in units of sets respectively including even-number lines and odd-number lines, and the comb electrode and the lower electrode are set to 15 V or 0 V, and a common electrode on an opposed substrate side is set to 0 V or 15 V, so that a vertical electric field is applied. In FIGS. 56 and 59, the TFTs are turned off to float one of one pair of comb electrodes, or the TFTs are turned on in units of sets respectively including even-number lines and odd-number lies to set one of one pair of comb electrodes to 15 V or 0 V, and refreshing (initializing step) is performed to initial alignment such that the common electrode of the opposed substrate and the lower electrode are set to 15 V or 0 V and 15 V or 0 V, respectively. Other reference numerals in the drawings according to Embodiment 3 are the same as those in the drawings according to Embodiment 1 except that 2 is added as each hundred's digit. The liquid crystal display panel according to each of Embodiments 1 to 3 can be easily manufactured to make it possible to achieve a high-speed response and a high transmittance.

The TFT driving method described above is a method that performs driving to include a sub-frame serving as a drive period from when a liquid crystal is changed to when the liquid crystal is returned to an initial state. The driving method includes a drive operation that generates a potential difference between electrodes of one pair of comb electrodes, a drive operation that generates a potential difference higher than that between one pair of comb electrodes between common electrodes, and a drive operation that does not substantially generate a potential difference between all electrodes of one pair of comb electrodes and one pair of common electrodes that are executed in the period of the sub-frame. In the embodiment, after the drive operation that generates a potential difference higher than that between the electrodes of one pair of comb electrodes between the common electrodes, the drive operation that does not substantially generate a potential difference between all the electrodes of one pair of comb electrodes and one pair of common electrodes is executed. In this manner, the effect of the present invention described above can be exerted, and alignment of liquid crystal molecules is preferably controlled to make it possible to set a transmittance in a black display state to a sufficiently low transmittance.

Figure 60:
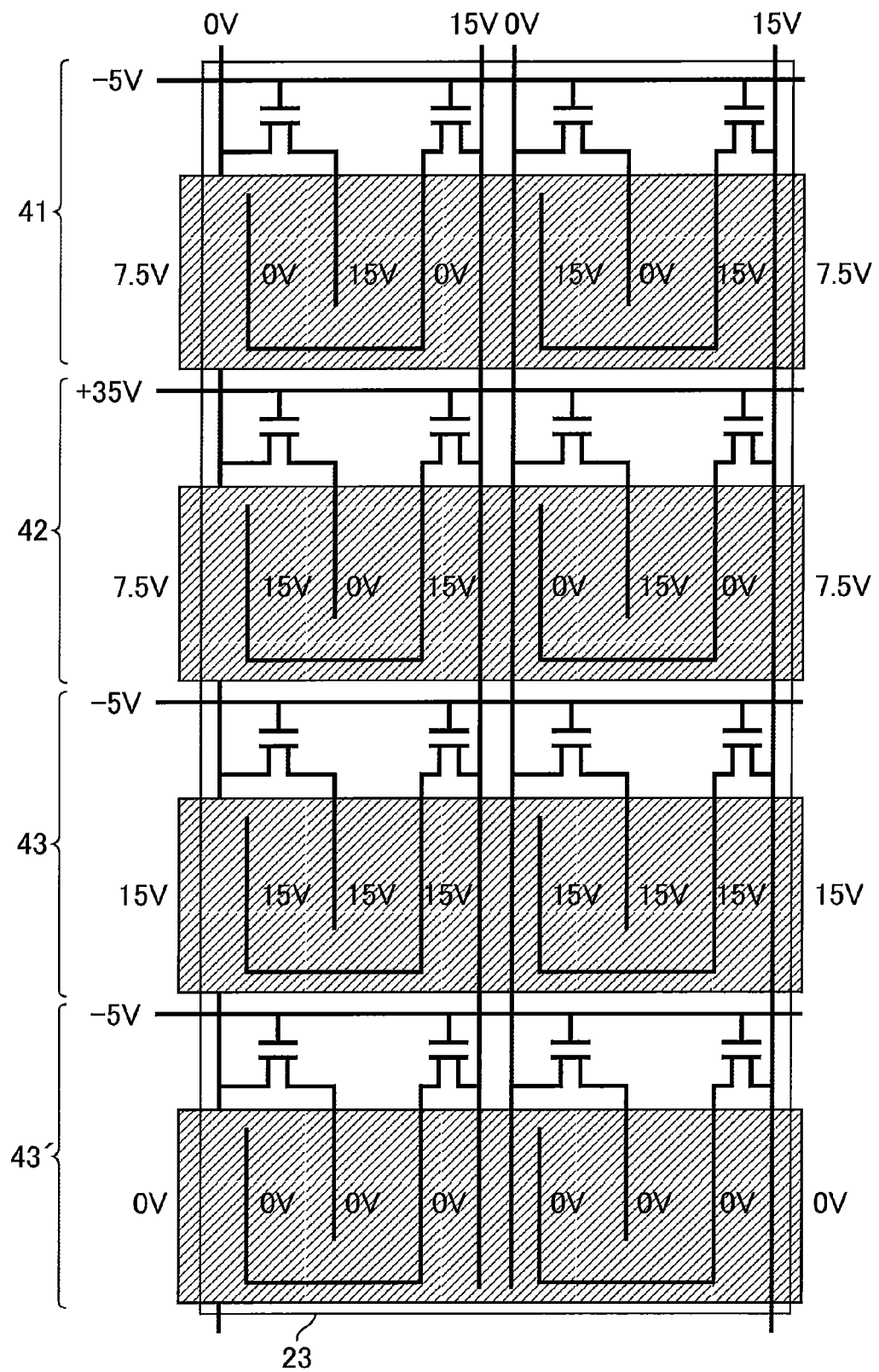
FIG. 60 is a plan schematic diagram showing a drive mode of a liquid crystal display panel according to the present invention.

FIG. 60 is a plan schematic diagram showing a drive mode of a liquid crystal display panel according to the present invention. FIG. 60 shows a manner in which white displays are written on the liquid crystal display panel. On a source side, a white writing voltage is applied as in vertical line reversal. A black writing voltage is not inverted. In FIG. 60, a gate bus line side is scanned (two values including +35 V and −5 V). The lower electrode is also scanned (three values including 7.5 V, 15 V, and 0 V). In FIG. 60, at pixels along the top bus line, white (halftone) displays have been written, and the white (halftone) displays are maintained (display maintenance 41). The lower electrode is kept at 7.5 V. At pixels 42 along the second bus line from the top, a voltage of the gate bus line is 35 V, and white (halftone) displays are written. The lower electrode is also scanned and set to 7.5 V. At pixels 43 along the third bus line from the top, black is written and kept. The lower electrode is set to 15 V. Also at pixels 43' along the fourth bus line from the top, black is written and kept. The lower electrode is set to 0 V. The common electrode 23 is always set to 7.5 V.

Figure 61:
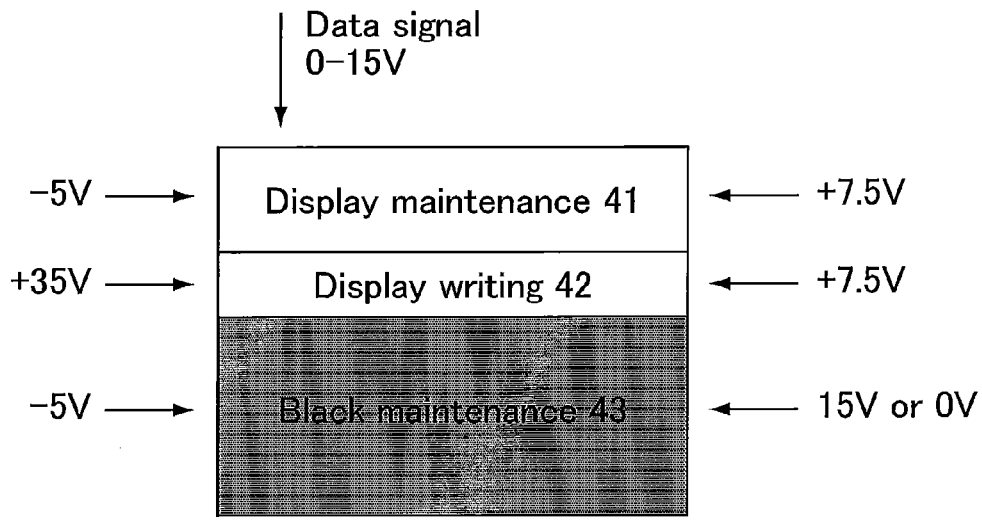
FIG. 61 is a plan schematic diagram showing the drive mode of the liquid crystal display panel according to the present invention.
Figure 62:
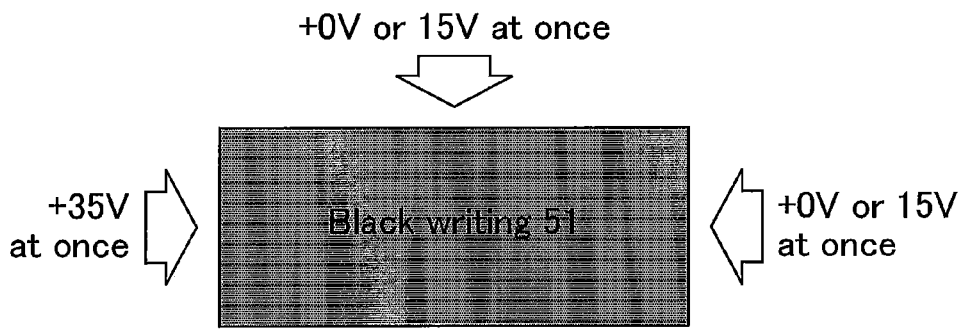
FIG. 62 is a plan schematic diagram showing the drive mode of the liquid crystal display panel according to the present invention.
Figure 63:
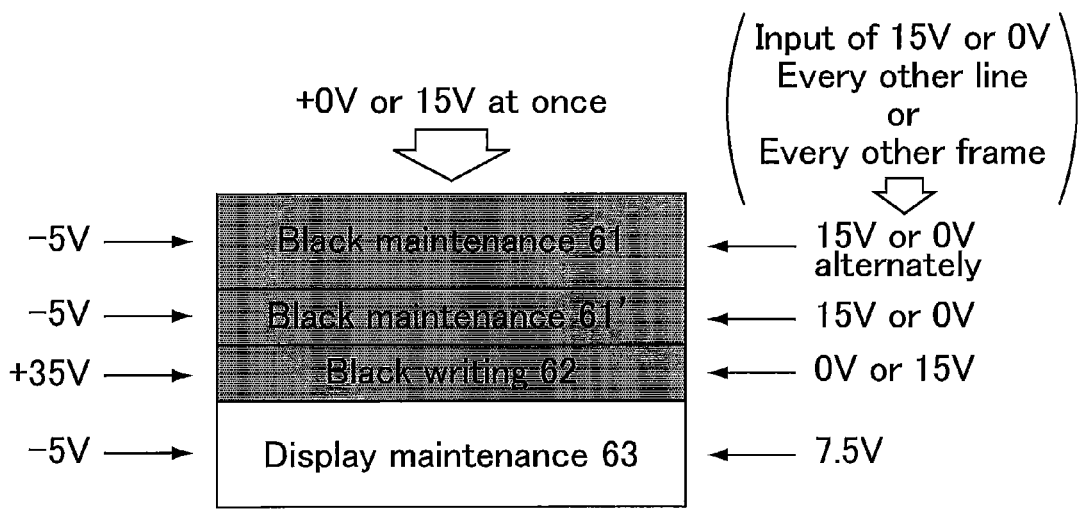
FIG. 63 is a plan schematic diagram showing the drive mode of the liquid crystal display panel according to the present invention.
Figure 64:
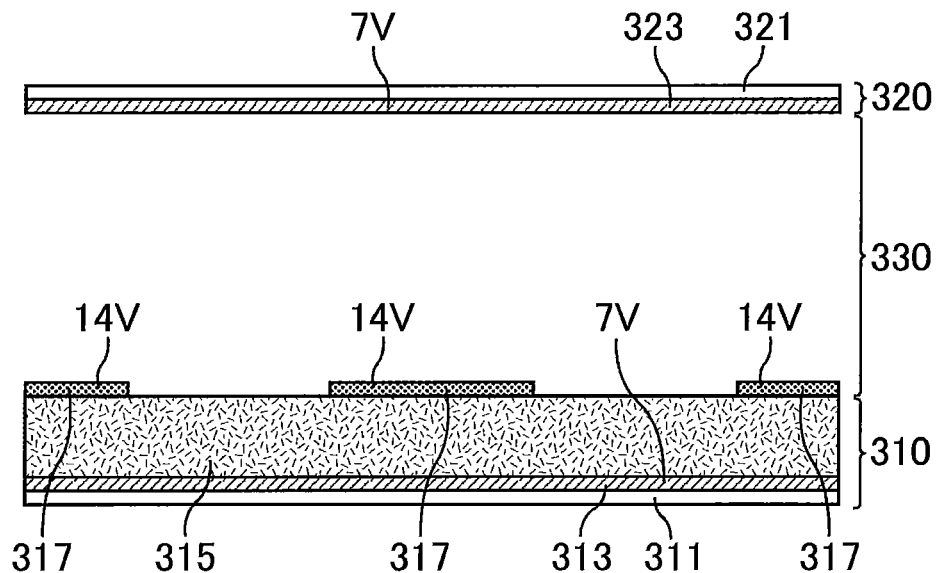
FIG. 64 is a sectional schematic diagram of a liquid crystal display panel according to Comparative Example 1 in generation of a fringe electric field.
Figure 65:
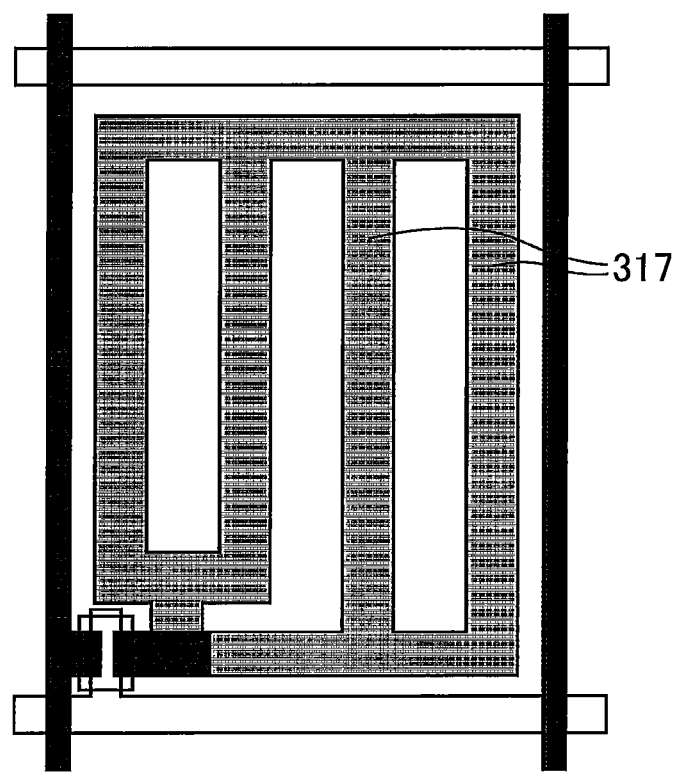
FIG. 65 is a plan schematic diagram of the liquid crystal display panel shown in FIG. 64.
Figure 66:
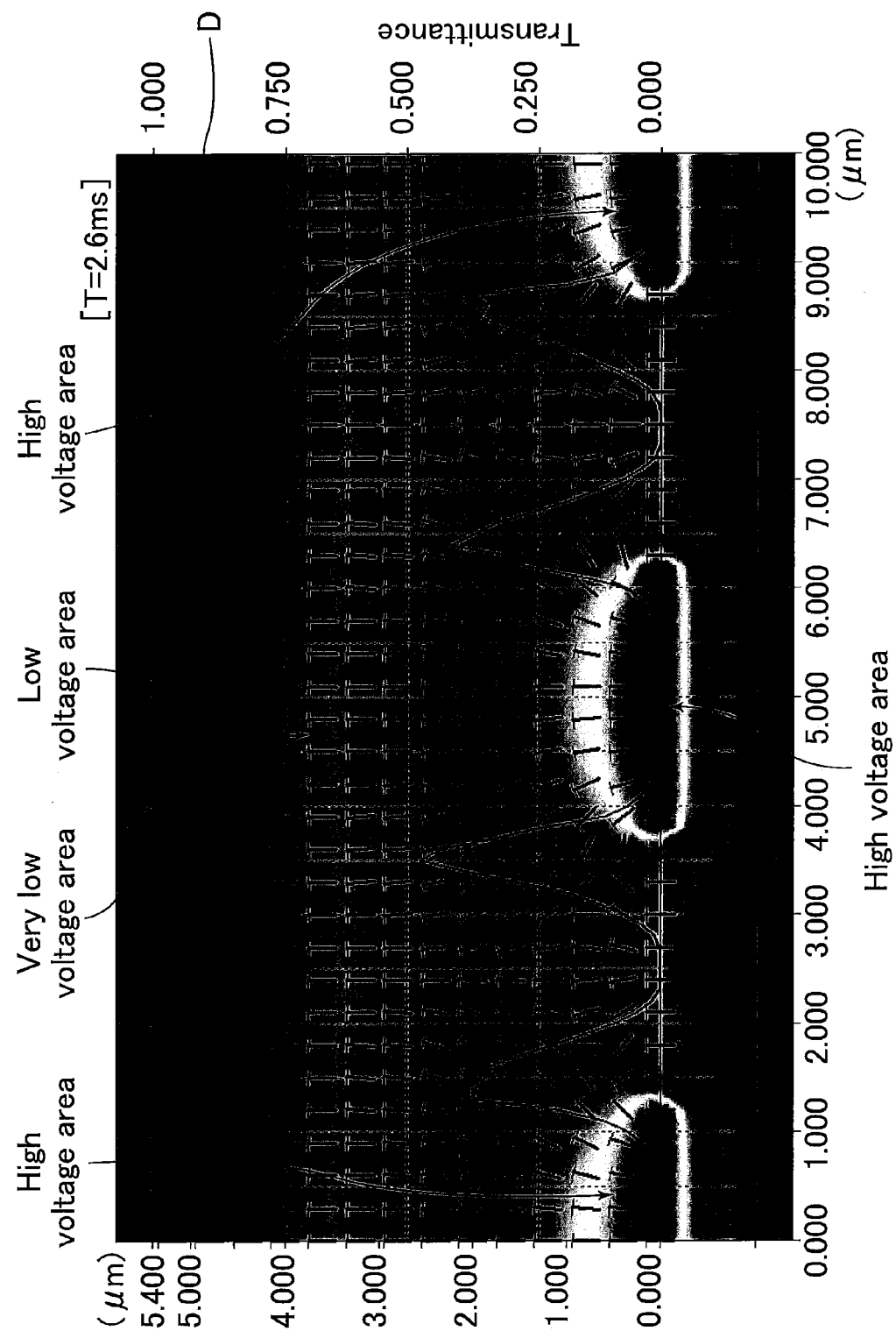
FIG. 66 shows a simulation result about the liquid crystal display panel shown in FIG. 64.

FIG. 61 is a plan schematic diagram showing the drive mode of the liquid crystal display panel according to the present invention. FIG. 62 is a plan schematic diagram showing the drive mode of the liquid crystal display panel according to the present invention. FIG. 63 is a plan schematic diagram showing the drive mode of the liquid crystal display panel according to the present invention. FIG. 64 is a sectional schematic diagram of a liquid crystal display panel according to Comparative Example 1 in generation of a fringe electric field. FIG. 65 is a plan schematic diagram of the liquid crystal display panel shown in FIG. 64. FIG. 66 shows a simulation result about the liquid crystal display panel shown in FIG. 64.

FIG. 61 conceptually shows a whole of a display panel on which the display writing shown in FIG. 60 is executed. In display maintenance 41, a data signal is applied by display writing, and the data signal is kept. In display writing 42, 35 V is applied to a gate bus line, and 7.5 V is applied to the lower electrode so as to apply the data signal. In black maintenance 43, display writing has not been written.

FIGS. 62 and 63 conceptually show a whole of a display panel on which black writing is executed. In FIG. 62, black is written at once without scanning. In this manner, a writing speed further increases. In FIG. 63, as in the display writing, scanning is sequentially performed to write black. A voltage of 15 V or 0 V may be input to the lower electrode every other line, may be input every other frame.

In each of the embodiments described above, a liquid crystal display can be easily manufactured, and a high transmittance can be achieved. A field sequential scheme can be executed, and a response speed that is suitable for an in-vehicle device and a 3D display device can be achieved. Of the devices, a liquid crystal driving device preferably performs field sequential driving and preferably includes a circularly polarizing plate. Since there is no color filter when the field sequential driving is performed, internal reflection is enhanced. This is because, since the transmittance of the color filter is normally ⅓ and reflected light pass through the color filter twice, the internal reflection becomes about ⅒ when the color filter is used. For this reason, a circularly polarizing plate is used to make it possible to sufficiently reduce such internal reflection. In a TFT substrate and an opposed substrate, an electrode structure or the like according to the liquid crystal display device and the thin film transistor array substrate of the present invention can be checked by a microscope observation using an SEM (Scanning Electron Microscope) or the like.

Comparative Example 1

FIG. 64 is a sectional schematic diagram of a liquid crystal display panel according to Comparative Example 1 in generation of a fringe electric field. FIG. 65 is a plan schematic diagram of the liquid crystal display panel shown in FIG. 64. FIG. 66 shows a simulation result about the liquid crystal display panel shown in FIG. 64.

A liquid crystal display panel according to Comparative Example 1, as in Patent Literature 1, generates a fringe electric field by FFS driving. FIG. 66 shows simulation results (a cell thickness of 5.4 μm and a slit interval of 2.6 μm) of a director D, an electric field, and a transmittance distribution. Reference numerals in FIG. 64 according to Comparative Example 1 are the same as those in the drawings according to Embodiment 1 except that 3 is added as each hundred's digit.

In FIG. 64, the slit electrode is set to 14 V, and an opposed sheet electrode is set to 7 V. However, for example, the slit electrode may be set to 5 V, and the opposed sheet electrode may be set to 0 V. In a display (using a slit electrode in place of one pair of comb electrodes) using the FFS driving described in Patent Literature 1, liquid crystal molecules are rotated by a fringe electric field generated between the upper and lower electrodes of the lower substrate. In this case, since only the liquid crystal molecules near the slit electrode end are rotated, a transmittance in simulation is low, i.e., 3.6%. Unlike in the embodiments described above, a transmittance could not be improved (see FIG. 66).

Comparative Example 2

Figure 67:
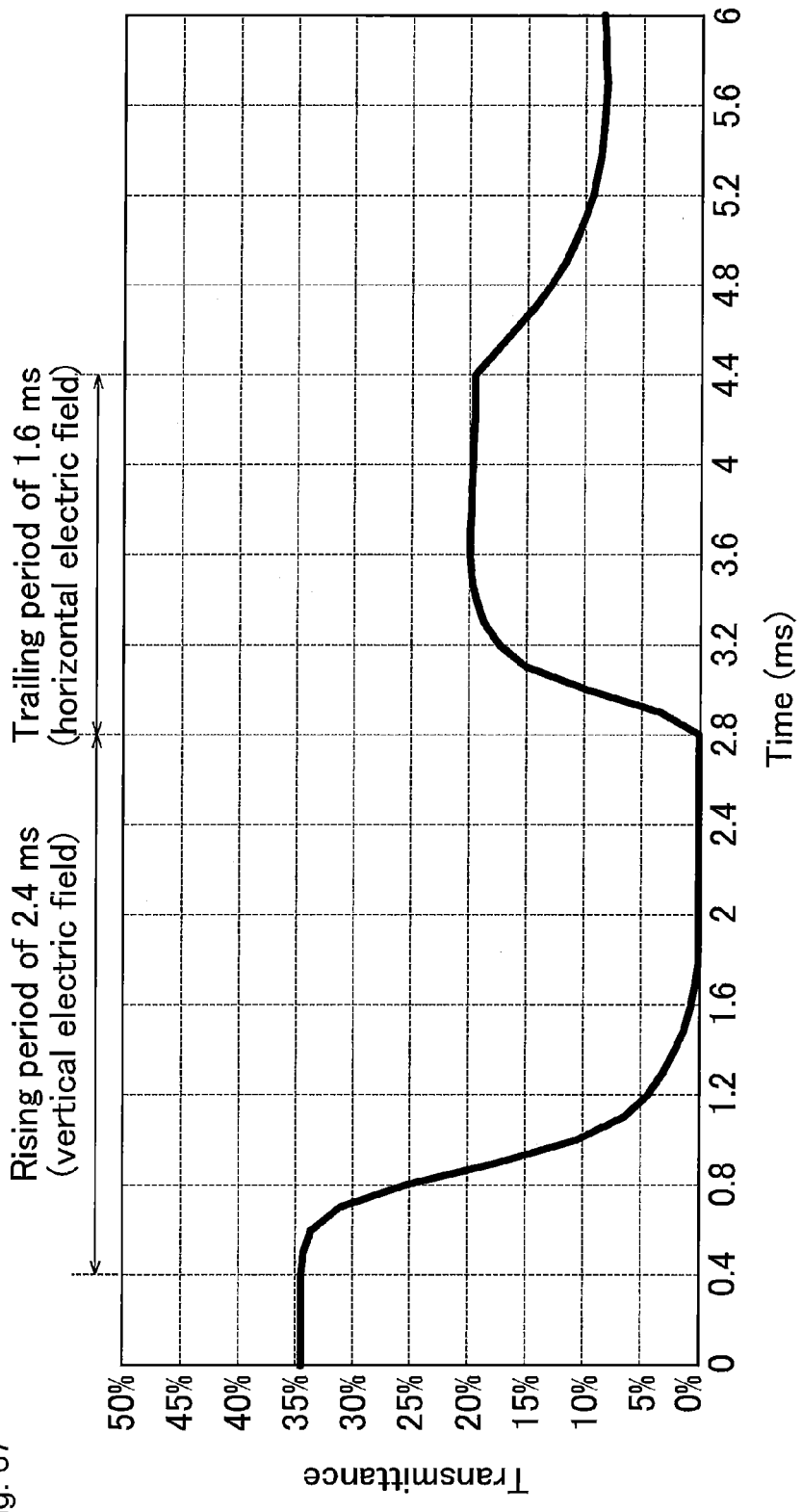
FIG. 67 is a graph showing a response waveform obtained by simulation of comb driving using a TN mode in Comparative Example 2.

FIG. 67 is a graph showing a response waveform obtained by simulation of comb driving using a TN mode in Comparative Example 2. Since the panel is not driven in the first 0.4-ms period, a rising period (horizontal electric field application period) is 2.4 ms, and a trailing period (vertical electric field application period) is 1.6 ms.

Figure 68:
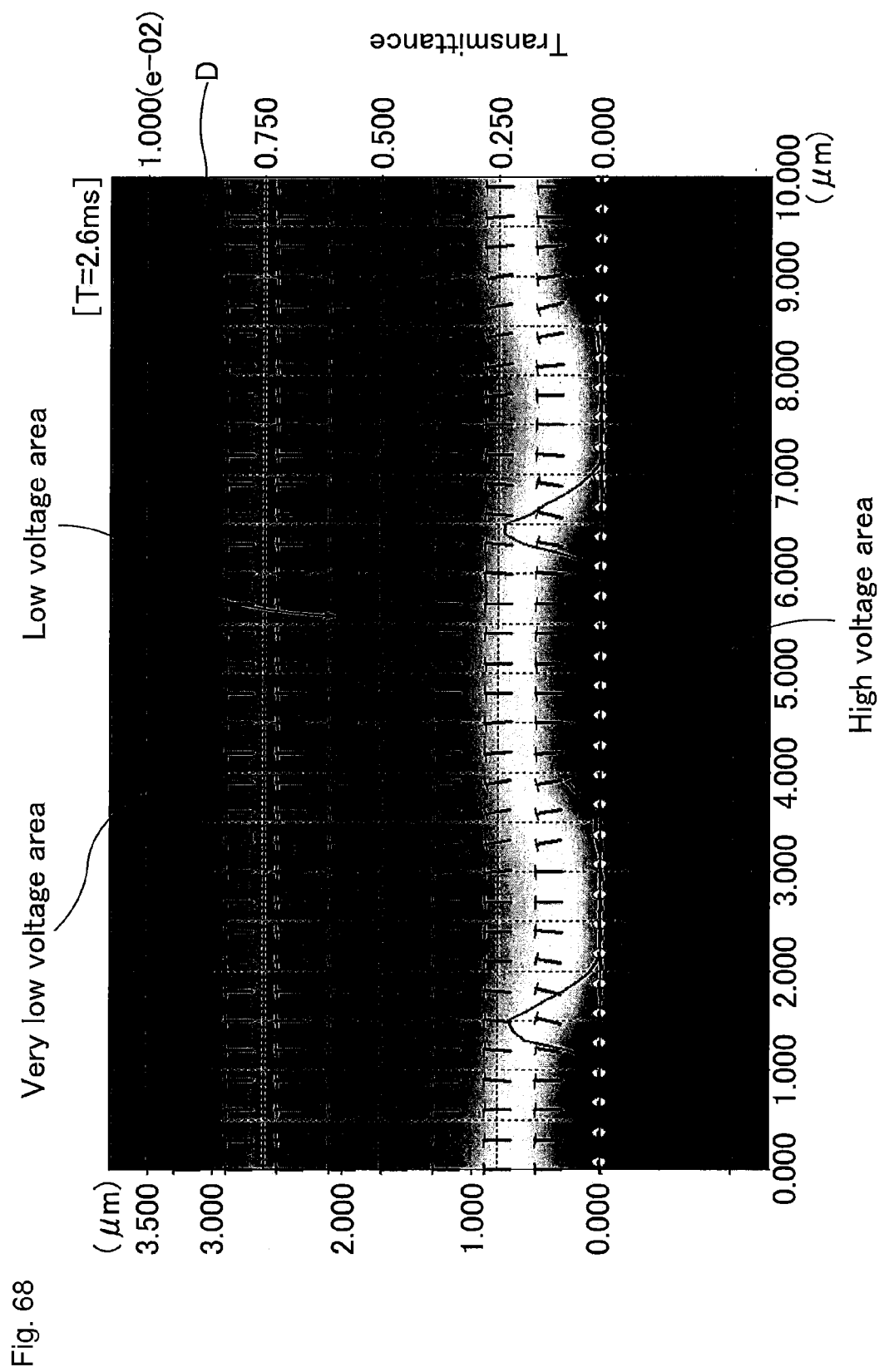
FIG. 68 shows a simulation result about the liquid crystal display panel according to Comparative Example 2.
Figure 69:
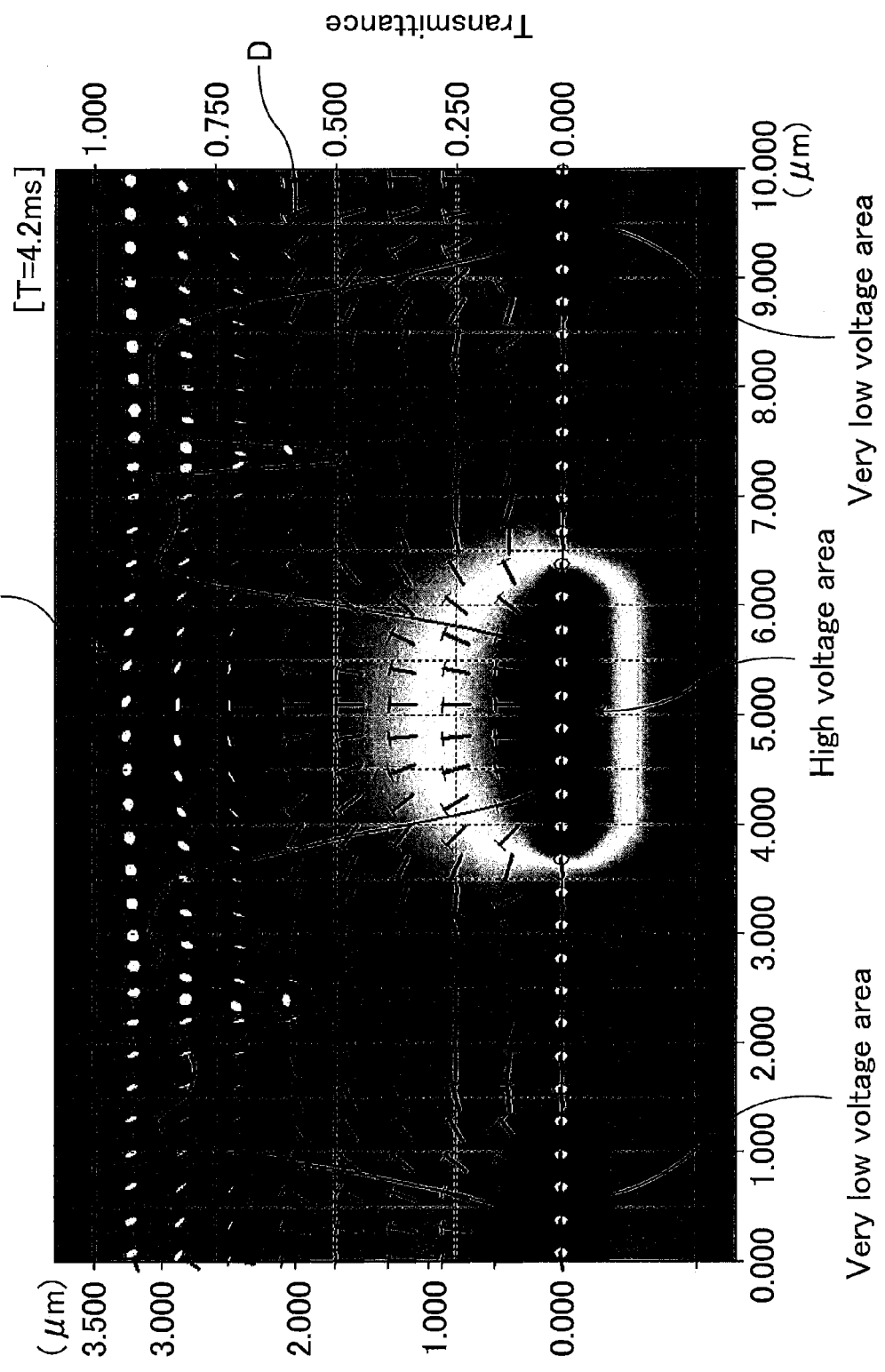
FIG. 69 shows a simulation result about the liquid crystal display panel according to Comparative Example 2.
Figure 70:
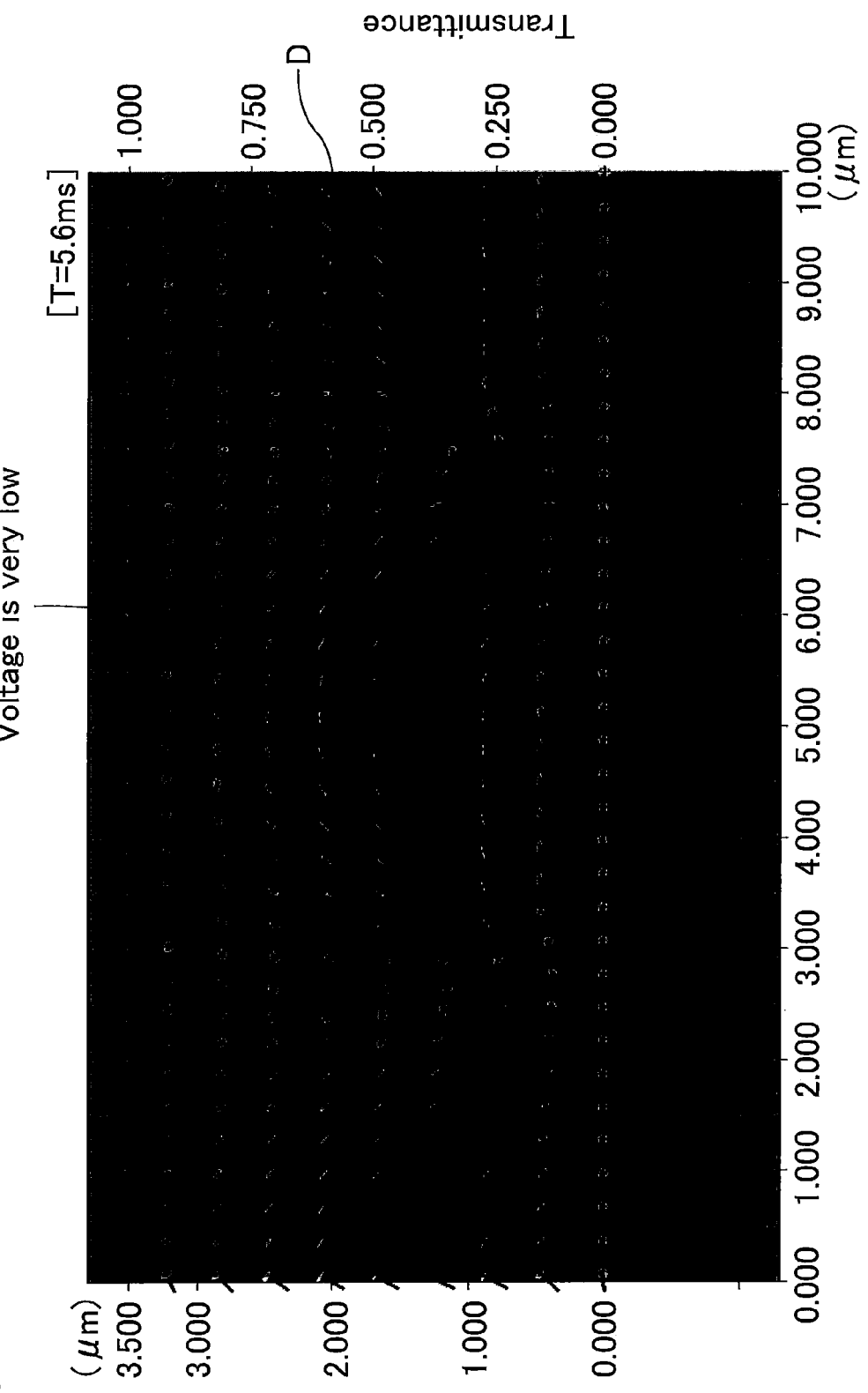
FIG. 70 shows a simulation result about the liquid crystal display panel according to Comparative Example 2.
Figure 71:
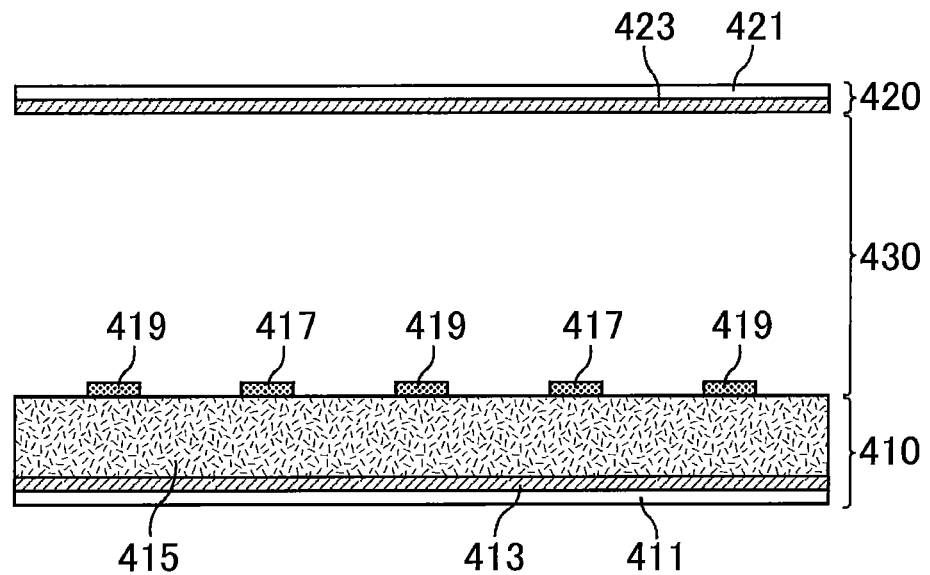
FIG. 71 is a sectional schematic diagram showing one mode of a comb electrode of a liquid crystal display panel according to the present invention.
Figure 72:
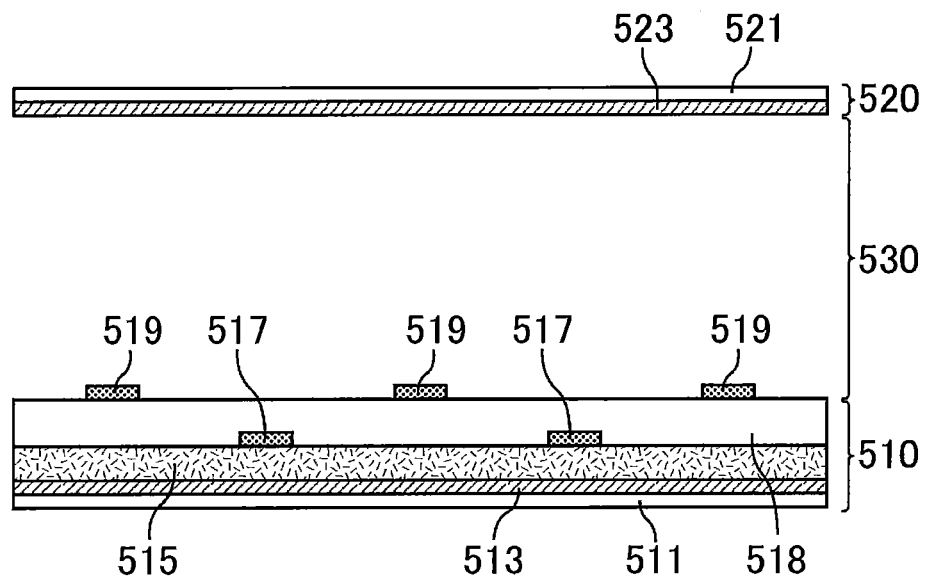
FIG. 72 is a sectional schematic diagram showing one mode of the comb electrode of the liquid crystal display panel according to the present invention.

FIGS. 68 to 70 show a simulation result about the liquid crystal display panel according to Comparative Example 2. More specifically, FIG. 68 shows simulation results of a director D, an electric field, and a transmittance distribution at a timing of 2.6 ms. FIG. 69 shows simulation results of the director D, the electric field, and the transmittance distribution at a timing of 4.2 ms. FIG. 70 shows simulation results of the director D, the electric field, and the transmittance distribution at a timing of 5.6 ms. As shown in FIG. 67, for the first 0.4-ms period, the device is not driven. A graph indicated by a solid line shows a transmittance. The director D indicates a longitudinal alignment direction of liquid crystal molecules. In Comparative Example 2, a comb electrode and a TN mode are used which are described in Patent Literature 2. When simulation using LCD MASTER 2D was executed, it was confirmed that an effect of a high-speed response could not be obtained in Comparative Example 2. As simulation conditions, a cell thickness was set to 5.4 μm, and a comb interval was set to 2.6 μm. At a timing of 2.6 ms, as shown in FIG. 68, liquid crystal molecules vertically respond by a vertical electric field. At a timing of 4.2 ms, as shown in FIG. 69, a horizontal electric field makes liquid crystal molecules between the comb electrodes horizontal, and liquid crystal molecules on the comb electrode are kept vertical by a vertical electric field between the lower substrate and the upper substrate and make no response. At a timing of 5.6 ms, as shown in FIG. 70, since alignment is disturbed by a horizontal electric field even though the initializing step is set, the alignment is difficult to return to initial alignment. As is apparent from a result in Comparative Example 2, when the comb electrode and the TN mode described in Patent Literature 2 are used, an effect of a high-speed response cannot be obtained.

A basic design pattern of a driving device (thin film transistor array substrate) to drive three electrodes according to the present invention will be described below in detail. Two TFTs are used per pixel in Embodiment 1 described above, and one TFT is used per pixel in Embodiment 2, the modification thereof, and Embodiment 3. In this manner, the reduction in number of TFTs as described above is especially preferable to increase an aperture ratio. However, the driving method in Embodiment 1 may be executed by using, for example, three TFTs per pixel, the driving method according to Embodiment 2, the modification thereof, and Embodiment 3 may be executed by using, for example, three TFTs per pixel or may be executed by using two TFTs per pixel. A design pattern using three TFTs per pixel and a design pattern using two TFTs per pixel will be also described below.

(Basic Design Pattern to Drive Three Electrodes)

Figure 73:
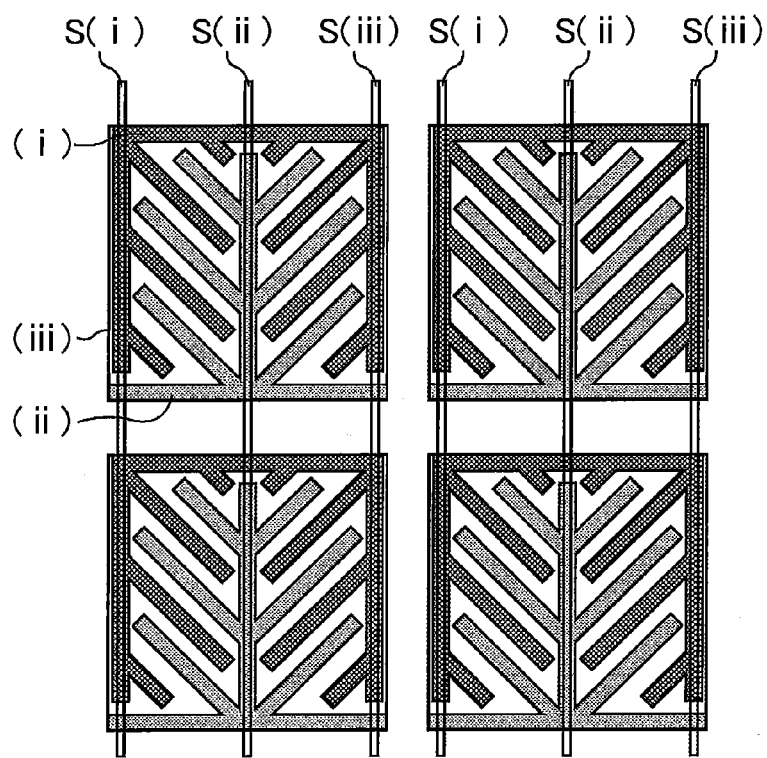
FIG. 73 is a plan schematic diagram showing one mode of a design pattern of a driving device according to an invention related to the present invention.

FIG. 73 is a plan schematic diagram showing one mode of a design pattern of a driving device according to an invention related to the present invention. FIGS. 74 to 78 are plan schematic diagrams showing one mode of a design pattern of the driving device according to the present invention. The driving device means a thin film transistor array substrate also in the following description.

Since three electrodes on the TFT side are separately driven, three TFTs are normally required per pixel. However, since an aperture ratio decreases when the number of TFTs is large, a design pattern is desirably devised to decrease the number of TFTs.

In FIGS. 73 to 78, (i) denotes an upper ITO layer (Indium Tin Oxide) (reference electrode), (ii) denotes an upper ITO layer (gray-scale electrode), (iii) denotes a lower ITO layer (lower electrode), S(i), S(ii), and S(iii) denote source wirings to apply voltages to the electrodes (i), (ii), and (iii), respectively, M denotes a metal wiring such as a gate wiring except for a source wiring, and C denotes a contact hole. As an electrode material, in addition to the ITO, a known material such as IZO (Indium Zinc Oxide) can be used. Although a recessed electrode like (i) in FIGS. 73 to 78 is used as a reference electrode, the recessed electrode may be used as a gray-scale electrode as in an example (will be described later). Although a convex electrode like (ii) is used as a gray-scale electrode, the convex electrode may be used as a reference electrode as in the example (will be described later).

In FIGS. 73 to 78, there are lateral pixels and longitudinal pixels due to suitable adjustment because the transmittance can be increased when a metal wiring such as a source wiring overlaps an ITO trunk (main line) configuring an electrode. Principally, the lateral pixels and the longitudinal pixels may be arbitrarily used. A main line of an electrode (ITO, IZO, or the like) electrically connected along a pixel line is preferably superposed on a metal wiring when a substrate major surface is planarly viewed. Since the metal wiring does not normally transmit light, the main line of the electrode electrically connected along the pixel line is arranged as described above to make it possible to increase an aperture ratio. The metal wiring is preferably at least one wiring selected from a group consisting of a source bus line, a gate bus line, and a metal wiring for reducing a capacity.

(A) Reference Example of Thin Film Transistor Array Substrate Using 3-TFT Driving FIG. 73 shows a case in which driving is performed by using three TFTs (not shown) per pixel. In (A), three electrodes (reference electrode (i) and gray-scale electrode (ii) that configure one pair of comb electrodes, and lower electrode (iii)) arranged on a lower substrate (array substrate or second substrate) are separately driven to make it possible to obtain different potentials. For this reason, three source wirings and three TFTs corresponding to one pixel are required. Reference symbol S(i) denotes a source wiring for the reference electrode (i), S(ii) denotes a source wiring for the gray-scale electrode (ii), and S(iii) denotes a source wiring for the lower electrode (iii). In the 3-TFT driving, the three electrodes can be separately driven, and all the driving methods described in the specification can be executed. The 3-TFT driving is advantageous to a large-scale liquid crystal driving device and a large-scale liquid crystal display device because of a small signal delay.

Figure 74:
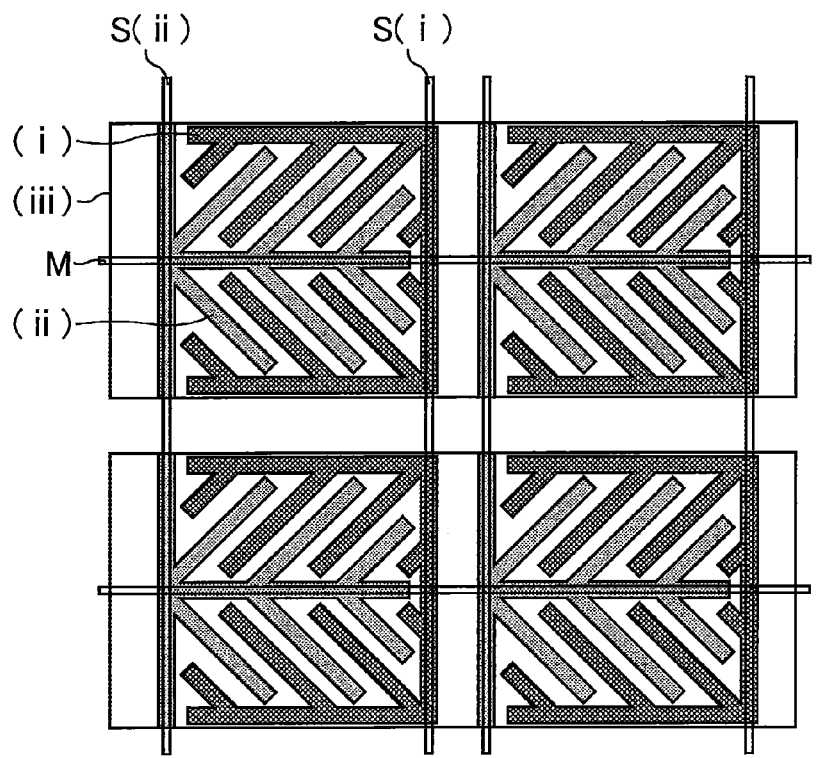
FIG. 74 is a plan schematic diagram showing one mode of a design pattern of a driving device according to the present invention.

(B-1) 2-TFT Driving and Embodiment of Thin Film Transistor Array Substrate that Shares Lower Electrode (iii) in Line Direction FIG. 74 shows a case in which driving is performed by using two TFTs per pixel to share a lower electrode (iii) in a horizontal line direction. In (B-1), the lower electrodes (iii) arranged on a lower substrate are electrically connected in units of pixel lines.

More specifically, the reference electrode (i) and the gray-scale electrode (ii) are applied with voltages from source wirings S(i) and S(ii), respectively, such that the reference electrode (i) and the gray-scale electrode (ii) can be separately driven.

All the lower electrodes (iii) in the horizontal direction (gate wiring direction) are used as the same lower electrode. More specifically, the lower electrodes (iii) are connected in common in the horizontal line direction to reduce the number of TFTs and source wirings so as to increase an aperture ratio (the lower electrodes (iii) may also be connected in common in a vertical line direction, and, similarly, an effect of increasing an aperture ratio can be exerted). At this time, in a large-size panel, a resistance of the lower electrode is excessively high, and a waveform may be dulled. For this reason, in the large-size panel, metal is preferably electrically connected to ITO such as a lower electrode connected in common to reduce the resistance.

In 2-TFT driving in which the lower electrodes (iii) are shared every pixel line, an aperture ratio can be improved.

Figure 75:
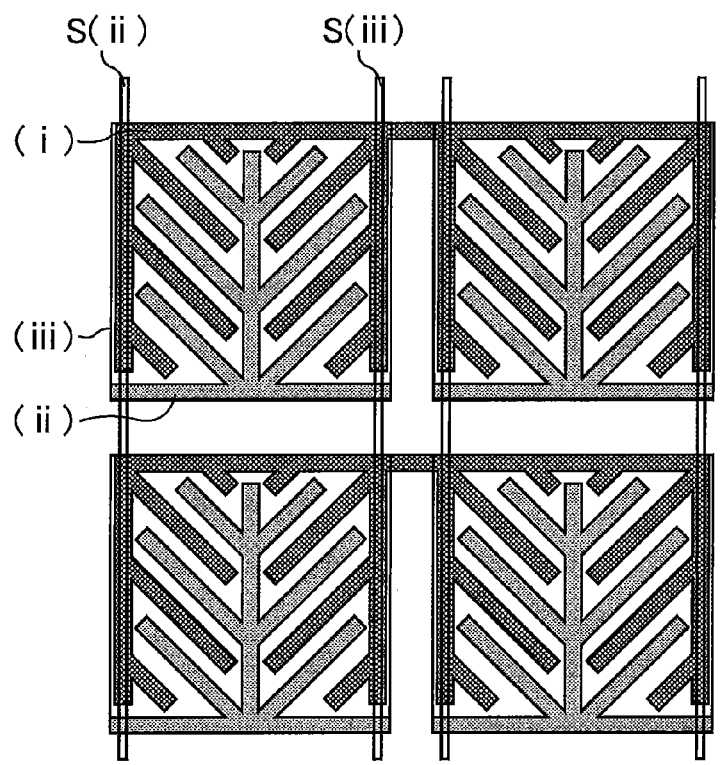
FIG. 75 is a plan schematic diagram showing one mode of the design pattern of the driving device according to the present invention.

(B-2) 2-TFT Driving and Embodiment of Thin Film Transistor Array Substrate that Shares Reference Electrode (i) (or Gray-scale Electrode (ii)) in Line Direction FIG. 75 shows a case in which driving is performed by using two TFTs per pixel to share a reference electrode (i) in a horizontal line direction. In (B-2), the reference electrodes (i) each serving as one electrode of one pair of comb electrodes arranged on the lower substrate are electrically connected in units of pixel lines.

In this case, the gray-scale electrode (ii) and the lower electrode (iii) are applied with voltages from source wirings such that the gray-scale electrode (ii) and the lower electrode (iii) can be separately driven. The reference electrode (i) may also be shared in the horizontal line direction as shown in FIG. 75 or may be shared in a vertical line direction.

The same gray-scale electrode (ii) is used in a horizontal line direction (direction along a gate wiring) to reduce the number of TFTs and the number of source wirings so as to increase an aperture ratio (the same gray-scale electrode (ii) may be used in the vertical line direction). At this time, metal is preferably connected to ITO such as a reference electrode connected in common.

In the 2-TFT driving in which the reference electrode (i) (or the gray-scale electrode (ii)) is shared, an aperture ratio can be increased.

(B-3) 2-TFT Driving and Embodiment of Thin Film Transistor Array Substrate that Shares Lower Electrode (iii) and Reference Electrode (i)

Figure 76:
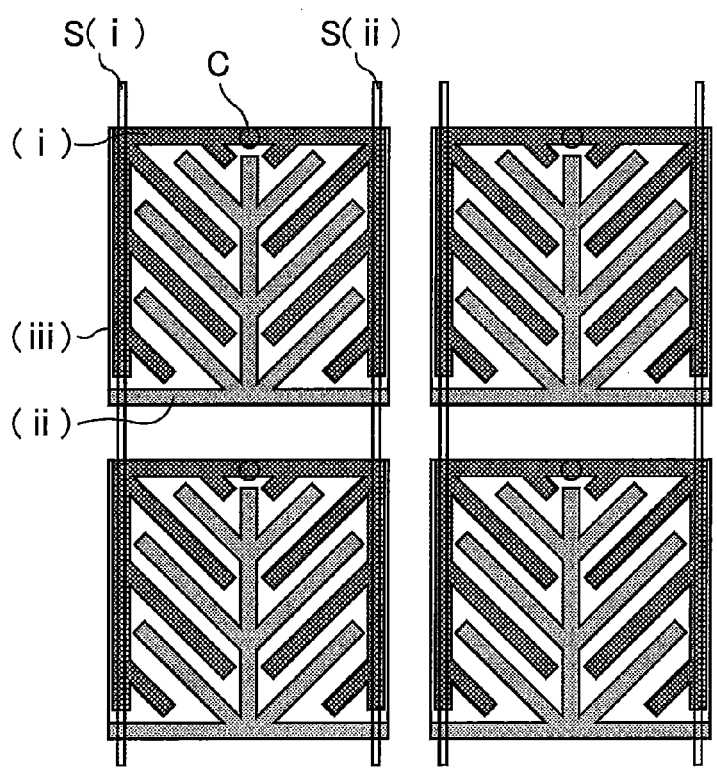
FIG. 76 is a plan schematic diagram showing one mode of the design pattern of the driving device according to the present invention.

FIG. 76 shows a case in which driving is performed by using two TFTs per pixel to share a lower electrode (iii) and a reference electrode (i). In (B-3), two electrode (reference electrode (i) serving as one electrode of one pair of comb electrodes and lower electrode (iii)) arranged on the lower substrate are electrically connected to each other.

In this case, the gray-scale electrodes (ii) are applied with voltages from source wirings S(ii) such that the gray-scale electrodes (ii) can be separately driven.

Although the reference electrode (i) is also applied with a voltage from the source wiring S(i), in order to reduce the number of TFTs, the reference electrode (i) and the lower electrode (iii) are connected to each other by a contact hole (electrically connected to each other) so as to make a TFT and a source wiring for the lower electrode (iii) unnecessary.

In the 2-TFT driving in which the lower electrode (iii) and the reference electrode (i) are shared, an aperture ratio can be increased, and resistances of electrodes connected in common can be made lower than those in other 2-TFT driving methods (B-1) and (B-2).

Figure 77:
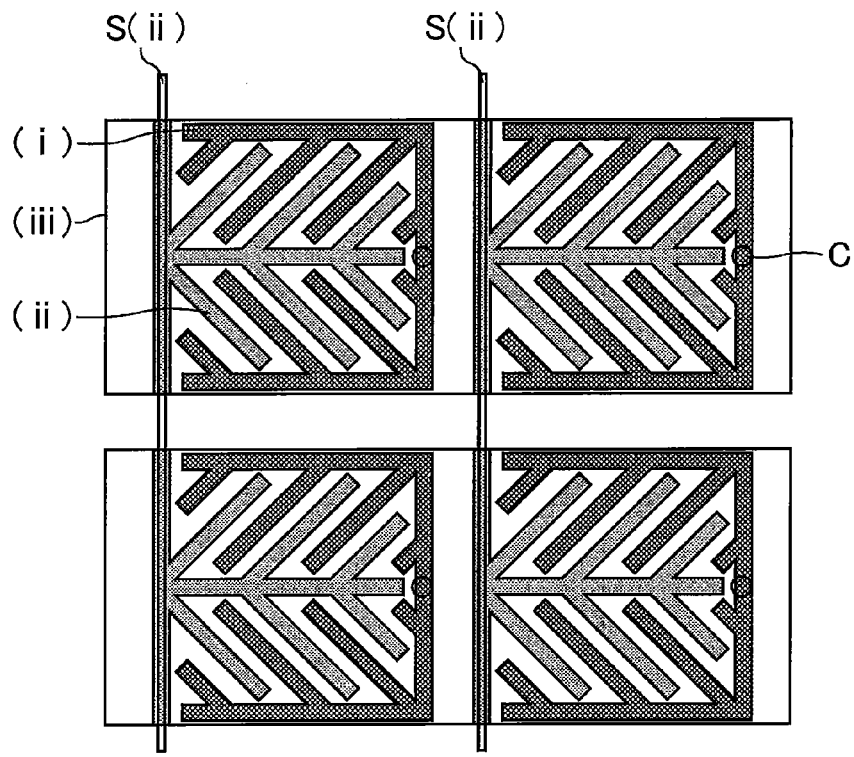
FIG. 77 is a plan schematic diagram showing one mode of the design pattern of the driving device according to the present invention.

(C-1) 1-TFT driving and Embodiment of Thin Film Transistor Array Substrate that Shares Lower Electrode (iii) and Reference Electrode (i) and Shares Lower Electrode (iii) in Line Direction FIG. 77 shows a case in which driving is performed by using one TFT per pixel to share a lower electrode (iii) and a reference electrode (i). In (C-1), the lower electrodes (iii) are electrically connected in units of pixel lines, and two electrode (reference electrode (i) serving as one electrode of one pair of comb electrodes and lower electrode (iii)) arranged on a second substrate are electrically connected to each other. This mode is one of modes that can be preferably applied to the present invention.

In this case, the gray-scale electrodes (ii) are applied with voltages from source wirings S(ii) such that the gray-scale electrodes (ii) can be separately driven.

The lower electrode (iii) is shared in a horizontal direction (or a vertical direction), and voltages are input in units of lines, so that the number of TFTs and the number of source wirings can be reduced. The reference electrode (i) and the lower electrode (iii) are connected to each other by a contact hole to achieve a driving device using one TFT per one pixel.

In the 1-TFT driving in which the lower electrode (iii) and the reference electrode (i) are shared, an aperture ratio can be maximized, and the driving device can be made suitable for small-size and middle-size liquid crystal driving devices and liquid crystal display devices.

Figure 78:
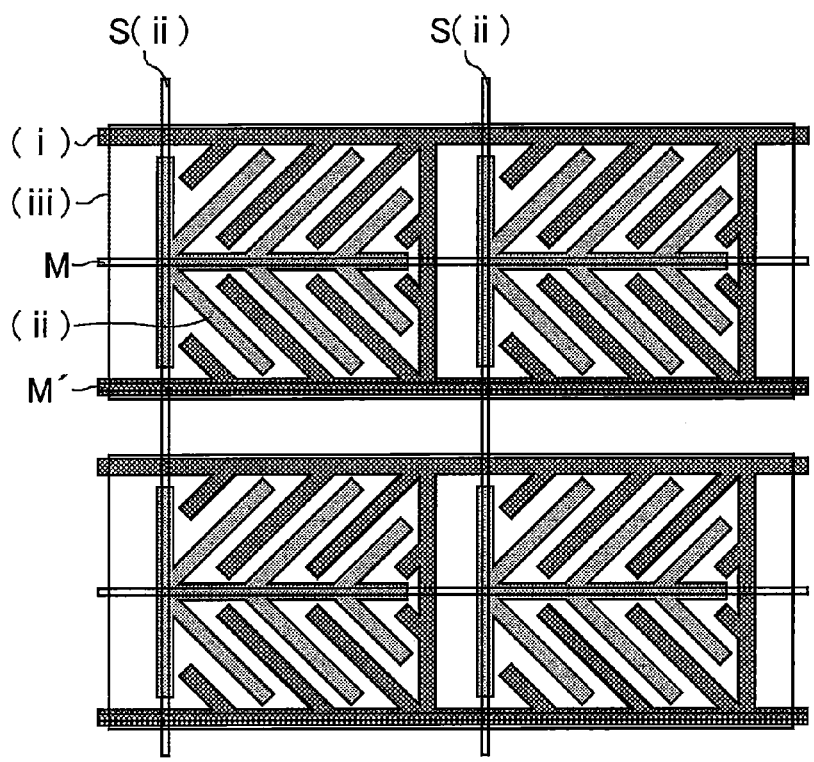
FIG. 78 is a plan schematic diagram showing one mode of the design pattern of the driving device according to the present invention.

(C-2) 1-TFT Driving and Embodiment of Thin Film Transistor Array Substrate that shares Lower Electrode (iii) in Line Direction Shares Reference Electrode (i) in Line Direction FIG. 78 shows a case in which driving is performed by using one TFT per pixel to share a lower electrode (iii) along a pixel line and also share a reference electrode (i) in the pixel line.

In this case, the gray-scale electrodes (ii) are applied with voltages from source wirings S(ii) such that the gray-scale electrodes (ii) can be separately driven.

The lower electrode (iii) is shared in a horizontal direction (or a vertical direction), the reference electrode (i) is shared in the horizontal direction (or the vertical direction), and voltages are input in units of lines, so that the number of TFTs and the number of source wirings can be reduced. The reference electrodes (i) and the lower electrode (iii) are electrically connected in units of pixel lines, respectively to achieve a driving device using one TFT per pixel. In terms of a reduction in resistance, a metal is preferably electrically connected to the reference electrodes such as ITO connected in common and/or the lower electrodes such as ITO connected in common.

In the 1-TFT driving in which the lower electrode (iii) is shared along a pixel line and the reference electrode (i) is shared in the pixel line, an aperture ratio can be maximized, and the driving device can be made suitable for small-size and middle-size liquid crystal driving devices and liquid crystal display devices.

In the specification, the small-size liquid crystal display panel means a mobile display having a size of 10 inches or less. A middle-size liquid crystal display panel means a display for a personal computer or the like having a size of 20 inches or less. A large-size panel means a display for a television set larger than the size of 20 inches.

By combinations between the driving methods according to Embodiments 1 to 3 and the design patterns (A), (B-1), (B-2), (B-3), (C-1), and (C-2) (total of 6 patterns), various driving methods can be executed. Since the driving methods have different advantages, an optimum driving method can be executed by a panel design. Embodiment 1 is to execute the TFT driving method (B-1) and explains that two TFTs are used per pixel, and the pattern of (B-1) is preferable in terms of an aperture ratio. However, as a design pattern that can drive the driving method in Embodiment 1, in addition to the pattern (B-1), a pattern (A) using three TFTs per pixel is given. Furthermore, Embodiment 2, the modification of Embodiment 2, and Embodiment 3 are to execute the TFT driving method of (C-1) and explains that that one TFT is used per pixel. However, as a design pattern that can drive the driving methods in the embodiments, in addition to the pattern (C-1), the pattern (C-2) similarly using one TFT per pixel, the pattern (A) using three TFTs per pixel, and the patterns (B-1), (B-2), and (B-3) each using two TFTs per pixel are given. More specifically, all the patterns (A), (B-1), (B-2), (B-3), (C-1), and (C-2) can be applied.

In the embodiments described above, it is explained that electrodes are electrically connected in units of odd-number pixel lines and electrically connected in units of even-number pixel lines. The mode is preferable to perform line reversal driving. However, the electrodes need only be electrically connected along a pixel line, for example, the electrodes may be connected in units of pixel lines, and the electrodes may be connected in units each including a plurality (except for the above number) of pixel lines (n lines (n is an integer that is 2 or more)).

The design patterns (A), (B-1), (B-2), (B-3), (C-1), and (C-2) in which the electrodes are electrically connected in units of sets respectively including odd-number pixel lines and even-number pixel lines can also be driven in frame reversal. However, the line reversal driving is more preferable in terms of display quality as will be described later.

Each of the embodiments mainly describes the thin film transistor array substrate that can be preferably applied to a liquid crystal display device that executes line reversal driving, electrically connects electrodes in pixels in one horizontal line direction (or vertical line direction), and simultaneously drives pixels to reduce the number of TFTs per pixel. In this case, the device can be preferably applied to a liquid crystal display device that executes the line reversal driving. On the other hand, dot-reversal drive is frequently required to improve display quality. The thin film transistor array substrate according to the present invention can also be preferably applied to a liquid crystal display device that executes dot-reversal drive, and can preferably reduce the number of TFTs per pixel. A concrete mode of the thin film transistor array substrate will be described below with reference to FIGS. 79 to 81. The thin film transistor array substrate for dot-reversal drive and the liquid crystal display device including the thin film transistor array substrate are included in the scope of the present invention.

Figure 79:
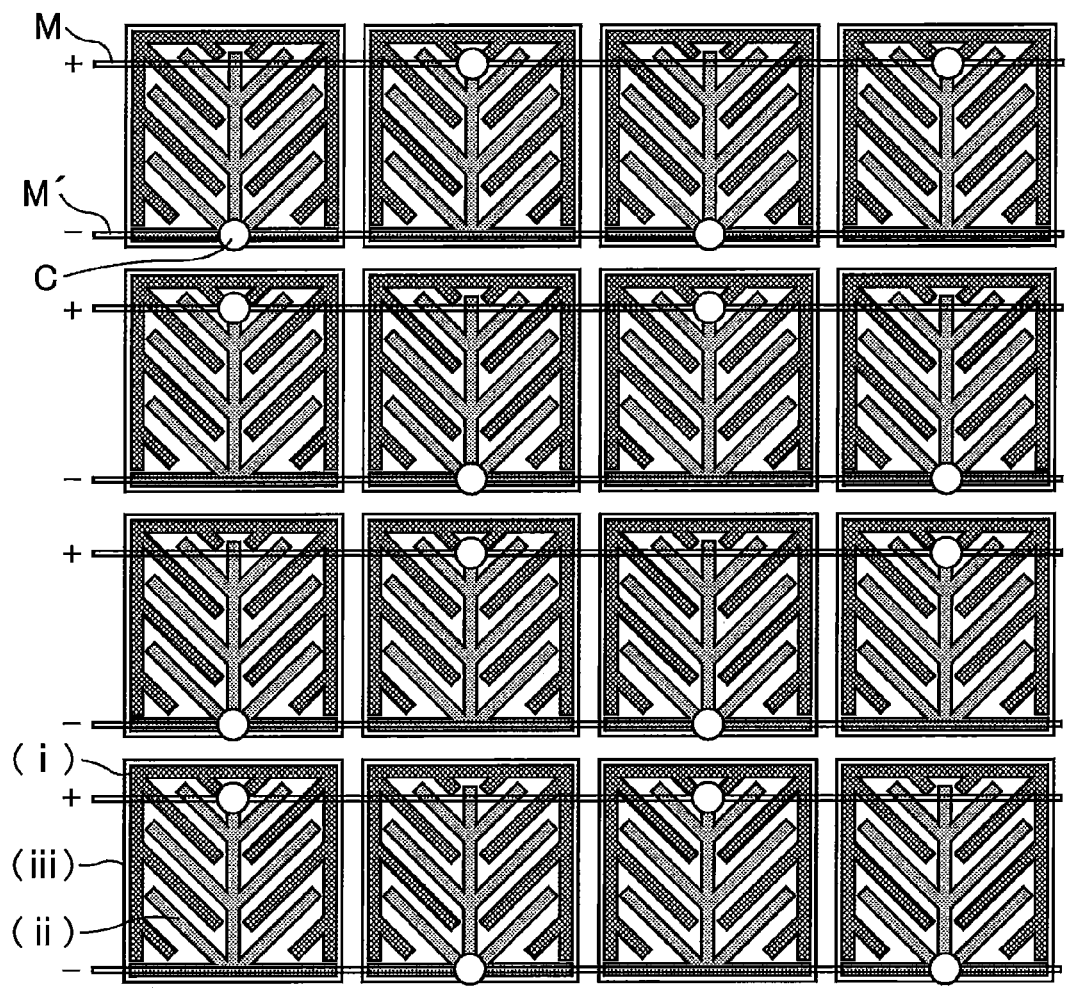
FIG. 79 is a plan schematic diagram showing one mode of the design pattern of the driving device according to the present invention.
Figure 80:
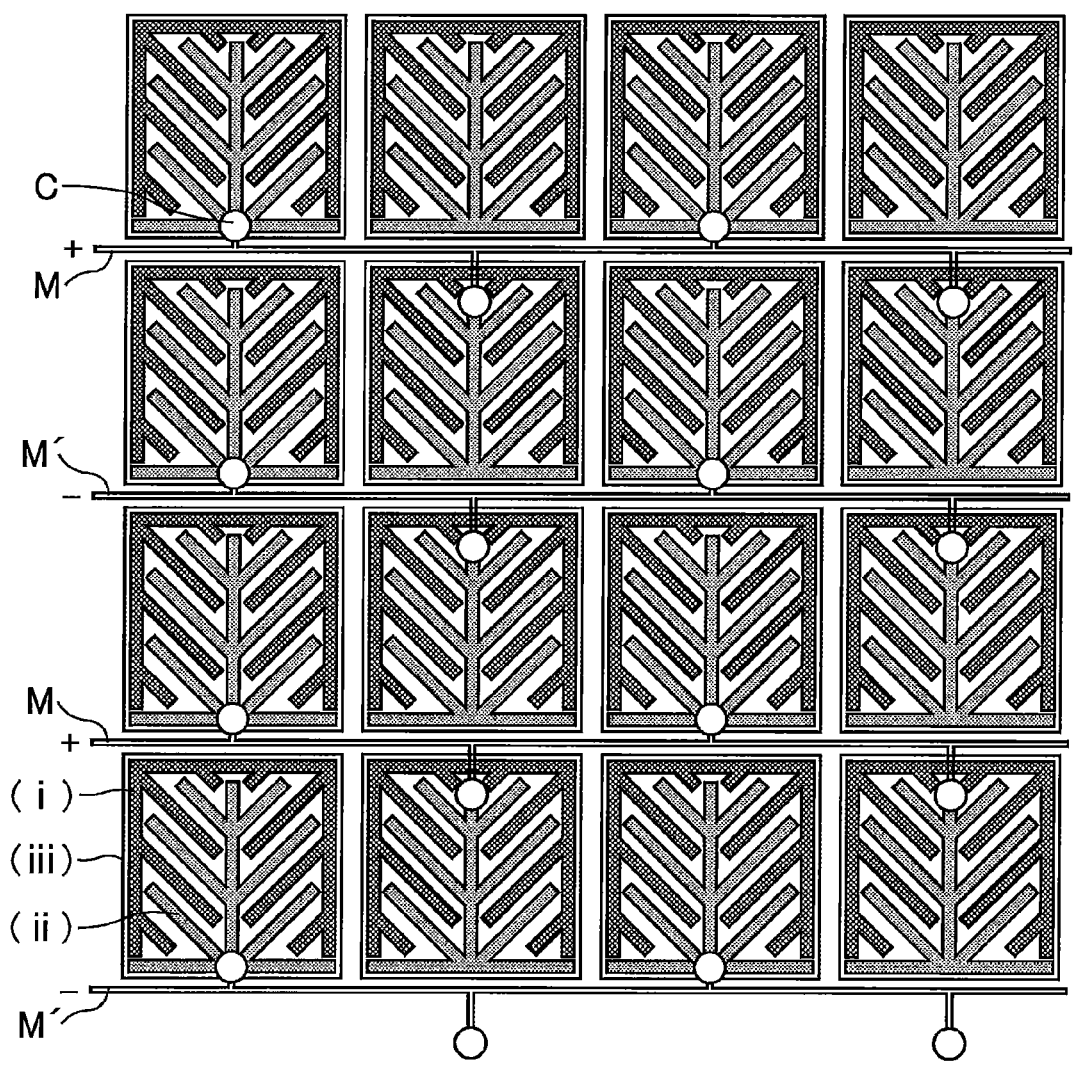
FIG. 80 is a plan schematic diagram showing one mode of the design pattern of the driving device according to the present invention.
Figure 81:
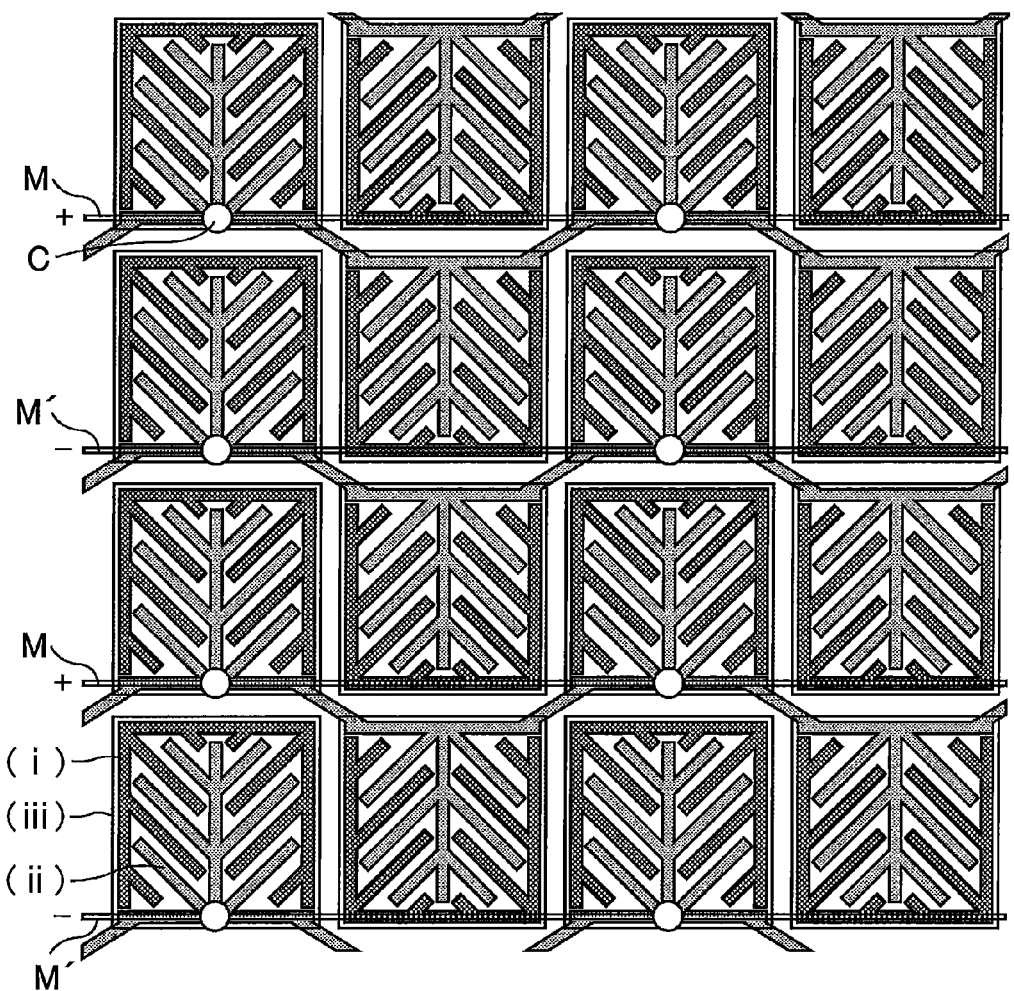
FIG. 81 is a plan schematic diagram showing one mode of the design pattern of the driving device according to the present invention.

In FIGS. 79 to 81, (i) denotes an upper ITO layer (Indium Tin Oxide) (gray-scale electrode), (ii) denotes an upper ITO layer (reference electrode), (iii) denotes a lower ITO layer (lower electrode), M denotes a metal wiring such as a gate wiring except for a source wiring, and C denotes a contact hole. The position of the contact hole C is not limited to an illustrated specific position as long as the operation and effect of the present invention can be exerted.

(D-1) Embodiment of Thin Film Transistor Array Substrate Using Dot-Reversal Drive FIG. 79 is a plan schematic diagram showing one mode of a design pattern of a driving device according to the present invention. In FIG. 79, in order to preferably achieve a display scheme in which adjacent pixels have different polarities, two metal wirings (metal wirings M and M') are drawn per pixel line of one row, the metal wirings M and M' are shifted by one pixel and electrically connected to the upper ITO layer (reference electrode (ii) or the like) and/or to the lower ITO layer (lower layer electrode (iii)) every other pixel at the contact hole C. Preferable modes (b-1), (b-2), (c-1), and (c-2) of electrodes shared in a line direction will be described below in detail.

Mode of (b-1)

The metal wirings M and M' may be shifted by one pixel and electrically connected to only the lower ITO layer (lower electrode (iii)) every other pixel at the contact hole C. In this case, in order to connect the metal wiring to only the lower ITO layer (lower layer electrode (iii)), the position of the contact hole C may be arbitrarily changed from the position shown in FIG. 79. It can also be said that this connecting manner is the same as a manner of connecting electrodes of a thin film transistor array substrate on which the lower electrode (iii) is shared in the line direction in the 2-TFT driving in the (B-1) described above except that the electrodes are connected every other pixel to execute dot-reversal drive.

Mode of (b-2)

Each of the metal wirings M and M' is shifted by one pixel is electrically connected to only the reference electrode (ii) (or the gray-scale electrode (i)) serving an upper ITO layer every other pixel at the contact hole C. It can also be said that this connecting manner is the same as a manner of connecting electrodes of a thin film transistor array substrate on which the reference electrode (or gray-scale electrode) is shared in the line direction in the 2-TFT driving in the (B-2) described above except that the electrodes are connected to each other in every other pixel to execute dot-reversal drive.

Mode of (c-1)

The upper ITO layer (reference electrode (ii)) and the lower ITO layer (lower electrode (iii)) may be electrically connected to each other by a contact hole, each of the metal wirings M and M' may be shifted by one pixel and electrically connected to any one of the reference electrode (ii) (or gray-scale electrode (i)) serving as the upper ITO layer and the lower ITO layer (lower electrode (iii)) at the contact hole C every other pixel. As the contact hole that electrically connect the upper ITO layer (reference electrode (ii)) and the lower ITO layer (lower electrode (iii)) to each other, a contact hole integrated with the contact hole C or independent of the contact hole C may be used. It can also be said that this connecting manner is the same as a manner of connecting electrodes of a thin film transistor array substrate on which the lower electrode and the reference electrode are shared and the lower electrode is shared in the line direction in the 1-TFT driving in the (C-1) described above except that the electrodes are connected to each other in every other pixel to execute dot-reversal drive.

Mode of (c-2)

Each of the metal wirings M and M' is shifted by one pixel and electrically connected to the reference electrode (ii) (or gray-scale electrode (i)) serving as the upper ITO layer at the contact hole C every other pixel. A combination of metal wirings (two metal wirings) may be additionally arranged per pixel line from the metal wirings shown in FIG. 79, and each of the combination of metal wirings may be shifted by one pixel and electrically connected to the lower ITO layer (lower electrode (iii)) every other pixel at a contact hole formed at a position different from that of the contact hole C. It can also be said that this connecting manner is the same as a manner of connecting electrodes of a thin film transistor array substrate on which the lower electrode is shared in the line direction and the reference electrode is shared in the line direction in the 1-TFT driving in the (C-2) described above except that the electrodes are connected to each other in every other pixel to execute dot-reversal drive.

As described above, a manner of alternately connecting the electrodes every other pixel can be applied to in both the case in which the metal wiring and the upper electrode (upper ITO layer or the like) are connected to each other and the case in which the metal wiring and the lower electrode (lower ITO layer or the like) are connected to each other.

FIG. 79 shows a manner in which, for example, an electrode connected to the metal wiring M has a positive polarity (+) and an electrode connected to the metal wiring M' has a negative polarity (−). With this mode, a potential having an opposite polarity can be applied across the upper electrodes and/or the lower electrodes of adjacent pixels, and dot-reversal drive can be executed. This can also be applied to FIGS. 80 and 81 (will be described later).

The design pattern shown in FIG. 79 can be applied to not only dot-reversal drive but also frame-reversal driving and line reversal driving. More specifically, the mode of (D-1) can be applied to all the frame-reversal driving, the line reversal driving, and the dot-reversal driving.

(D-2) Modification of Embodiment of Thin Film Transistor Array Substrate Using Dot-Reversal Drive FIG. 80 is a plan schematic diagram showing one mode of the design pattern of the driving device according to the present invention. In FIG. 80, although one metal wiring M or M' is used per pixel line of one row, the metal wirings M or M' along the pixel line direction are alternately electrically connected to the electrodes in upper and lower pixels on pixel lines of two rows in the pixel line direction at the contact hole C every other one pixel about each pixel line. More specifically, one metal wiring corresponding to pixel lines of two rows, at pixels of odd-number columns, is electrically connected to the electrodes in one-side pixels of upper and lower pixels on the pixel lines of two rows, and, at pixels of even-number columns, electrically connected to electrodes in other-side pixels of the upper and lower pixels on the pixel lines of the two rows. This makes it possible to execute dot-reversal drive. The metal wirings are sequentially electrically connected to the electrodes in the upper and lower pixels on the pixel lines of two rows to make it possible to omit one metal wiring per pixel line of one row in comparison with the embodiment of (D-1) and increase an aperture ratio accordingly. FIG. 80 shows a mode in which a metal wiring along a horizontal line direction is alternately connected to the electrodes in the upper and lower pixels on the pixel lines of two rows. However, in place of the mode, a mode in which a metal wiring along one vertical line direction is alternately connected to the electrodes in left and right pixels on the pixel lines of two columns may be used. In FIG. 80, since a metal wiring on the upper side of the pixel line of the top row is not shown, contact holes at the second and fourth pixels from the left on the pixel line are not shown.

The electrodes in the upper and lower pixels to which the metal wiring M or M' is electrically connected may be only the lower ITO layers (lower electrodes (iii)) (mode of (b-1)). As shown in FIG. 80, the electrodes may be only the reference electrodes (ii) (or gray-scale electrodes (i)) serving as upper ITO layers (mode of (b-2)) or one of the reference electrode (ii) (or gray-scale electrode (i)) serving as the upper ITO layer and the lower ITO layer (lower electrode (iii) that are electrically connected to each other (mode of (c-1)). The electrodes in the upper and lower pixels to which the metal wiring M or M' is electrically connected may be only the reference electrodes (ii) (or gray-scale electrodes (i)) serving as the upper ITO layers as shown in FIG. 80. Furthermore, one combination of metal wirings (two metal wirings) are additionally arranged per two pixel lines from the metal wirings shown in FIG. 80, each of the combination of metal wirings may be electrically connected to the lower ITO layers (lower electrodes (iii)) every other pixel at a contact hole formed at a position different from that of the contact hole C (mode of (c-2)).

(D-3) Another Modification of Embodiment of Thin Film Transistor Array Substrate Using Dot-Reversal Drive FIG. 81 is a plan schematic diagram showing one mode of the design pattern of the driving device according to the present invention. In the dot-reversal drive, in order to electrically connect pixels having the same polarity, the reference electrode (ii) (or gray-scale electrode (i)) serving as the upper ITO layer in a pixel is electrically connected to the reference electrode (ii) (or gray-scale electrode (i)) in a pixel in an oblique direction of the pixel. More specifically, as shown in FIG. 81, along the pixel line direction, the reference electrodes (ii) in the upper and lower pixels on the pixel lines of two rows are shifted by one pixel in the pixel line direction and electrically connected every other pixel on each of the pixel lines. Furthermore, in other words, on the pixel lines of two rows, the electrodes in one-side pixels of the upper and lower pixels of the pixels on odd-number rows are electrically connected to the electrodes in the other-side pixels of the upper and lower pixels of the pixels on even-number rows along the pixel line direction.

The electrodes in the pixels electrically connected between the pixels may be only the lower ITO layers (lower electrodes (iii)) (mode of (b-1)). As shown in FIG. 81, the electrodes may be only the reference electrodes (ii) (or gray-scale electrodes (i)) serving as upper ITO layers (mode of (b-2)) or one of the reference electrode (ii) (or gray-scale electrode (i)) serving as the upper ITO layer and the lower ITO layer (lower electrode (iii) that are electrically connected to each other (mode of (c-1)). The electrodes in the pixels electrically connected between the pixels may be only the reference electrode (ii) (or gray-scale electrodes (i)) serving as the upper ITO layers as shown in FIG. 81, and, in the mode shown in FIG. 81, the lower ITO layers (lower electrodes (iii)) in the upper and lower pixels on the pixel lines of two rows may be shifted by one pixel in the pixel line direction and electrically connected every other pixel on each of the pixel lines (mode of (c-2)).

FIG. 81 shows the mode in which the electrodes in the upper and lower pixels on the pixel lines of two rows are alternately electrically connected. However, in place of this, a mode in which the electrodes in left and right pixels on pixel lines of two columns are alternately electrically connected may be used.

In this case, in the mode in which the electrodes in the pixels are electrically connected between the pixels, like (D-3), the metal wirings M and M' shown in FIG. 81 need not be arranged. In FIG. 81, in order to reduce the resistance of the reference electrode (ii), the metal wiring M or M' is connected to the reference electrode (ii). In this manner, in order to reduce the resistance of the electrode to which the metal wiring is connected, the metal wiring may be arranged as shown in FIG. 81 as needed.

When a metal wiring is arranged in (D-3), an electrode connected to the metal wiring M or M' may be only the lower electrode (iii) (mode of (b-1)), may be only the reference electrode (ii) (mode of (b-2)), or may be one of the reference electrode (ii) and the lower electrode (iii) electrically connected to each other (mode of (c-1)). The electrode connected to the metal wiring M or M' may be only the reference electrode (ii) (or gray-scale electrode (i)) serving as the upper ITO layer as shown in FIG. 81. Furthermore, one combination of metal wirings (two metal wirings) are additionally arranged per two pixel lines from the metal wirings shown in FIG. 81, each of the combination of metal wirings may be electrically connected to the lower ITO layers (lower electrodes (iii)) every other pixel at a contact hole formed at a position different from that of the contact hole C (mode of (c-2)).

In FIG. 81, since a 2-line configuration (one combination of metal wirings (two metal wirings) to apply potentials having different polarities to electrodes are arranged for pixel lines of two rows, and, as a result, one metal wiring is drawn for a pixel line of one row) is employed, the number of metal wirings is half the number in (D-1) described above, and an aperture ratio can be increased accordingly.

The design patterns shown in FIGS. 80 and 81 can be applied to not only dot-reversal drive but also frame-reversal driving. More specifically, the modes of (D-2) and (D-3) can be applied to the frame-reversal driving and the dot-reversal drive.

In each of the embodiments described above, as the upper electrode, the reference electrode is mainly described. In this manner, the mode in which the reference electrode and other electrodes or the like are shared is preferably used. However, a gray-scale electrode may be used in place of the reference electrode.

(About Driving Method and Flicker)

An advantage obtained when dot-reversal is performed will be described below.

A liquid crystal display is required to be AC-driven to improve the reliability. When the AC driving is performed, positive and negative application voltages are difficult to be completely equal to each other. This difference causes a difference in luminance, and is recognized as flickers to deteriorate display quality. In order to reduce the influence as much as possible, when, as a driving method for polarity inversion, line reversal is used rather than frame reversal, and dot reversal is used rather than line reversal to make flickers difficult to be recognized. More specifically, (1) flickers are most difficult to be recognized in the dot reversal, (2) flickers are second-most difficult to be recognized in the line reversal, and (3) flickers are third-most difficult to be recognized in the frame reversal.

Figure 82:
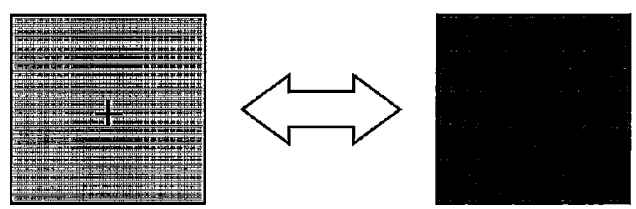
FIG. 82 is a plan schematic diagram showing one mode of polarity inversion of the driving device according to the present invention.
Figure 83:
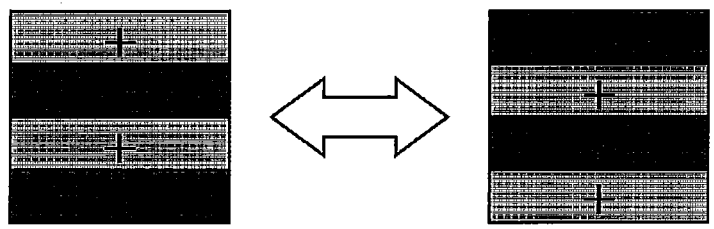
FIG. 83 is a plan schematic diagram showing one mode of the polarity inversion of the driving device according to the present invention.
Figure 84:
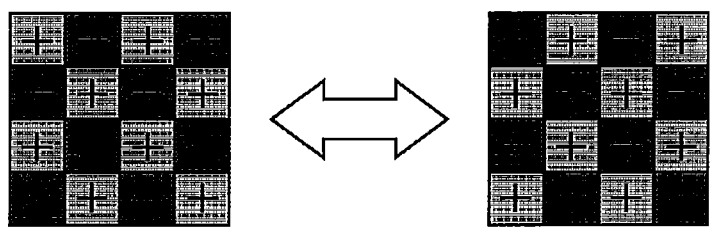
FIG. 84 is a plan schematic diagram showing one mode of the polarity inversion of the driving device according to the present invention.

FIGS. 82 to 84 are plan schematic diagrams showing one mode of polarity inversion of the driving device according to the present invention. In the drawings, sign + denotes a positive polarity, and sign − denotes a negative polarity. FIG. 82 shows frame reversal. In frame-reversal driving, since a luminance difference between positive polarity and negative polarity appears on an entire screen, flickers can be relatively easily visually checked. FIG. 83 shows line reversal. In the line reversal driving, since the positive polarity and the negative polarity are displayed to be adjacent to each other, flickers cannot be easily recognized. FIG. 84 shows dot-reversal. In the dot-reversal drive, since divisions are made finely more than those in the line reversal, flickers are more difficult to be recognized.

In each of the embodiments of the present invention, an oxide semiconductor TFT (IGZO or the like) is preferably used. The oxide semiconductor TFT will be described below in detail.

At least one of the upper and lower substrates normally includes a thin film transistor element. The thin film transistor element preferably includes an oxide semiconductor. More specifically, in the thin film transistor element, in place of a silicon semiconductor film, an oxide semiconductor film made of zinc oxide or the like is preferably used to form an active layer of the active drive element (TFT). The TFT is called an "oxide semiconductor TFT". The oxide semiconductor has characteristic features of exhibiting a carrier mobility higher than that of amorphous silicon and having a small fluctuation in characteristic. For this reason, the oxide semiconductor TFT can operate at a speed higher than that of the amorphous silicon TFT, and is suitable for driving a next-generation display device having a high driving frequency and a higher resolution. Since the oxide semiconductor film is formed by a process that is simpler than that of a polysilicon film, the oxide semiconductor film can be advantageously applied to a device that requires a large area.

When the liquid crystal driving method according to the embodiment is especially used in an FSD (Field Sequential Display device), the following characteristic features become conspicuous.

Figure 85:
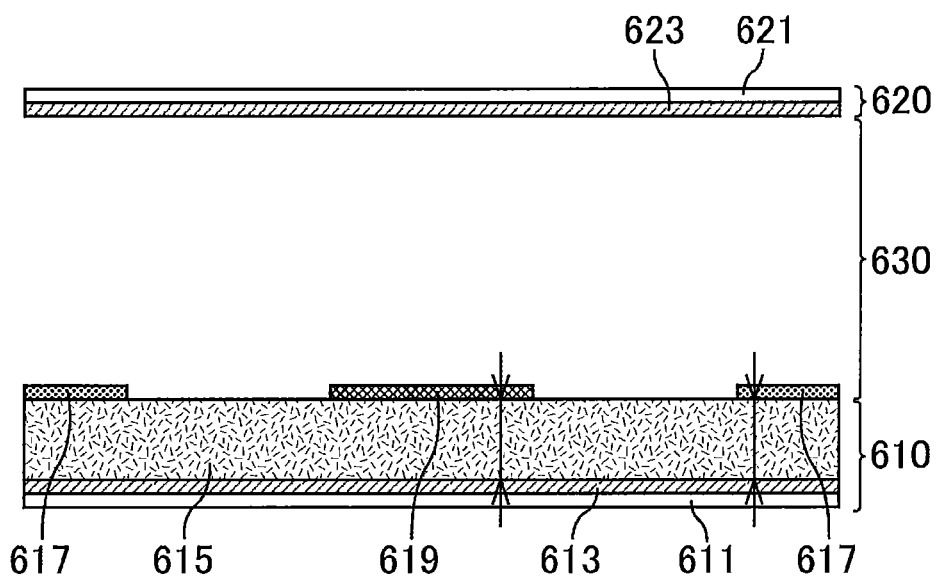
FIG. 85 is a sectional schematic diagram showing one example of a liquid crystal display device used in a liquid crystal display method according to the embodiment.

(1) A pixel capacity is larger than that in a normal VA (vertical alignment) mode (FIG. 85 is a sectional schematic diagram showing an example of a liquid crystal display device used in the liquid crystal driving method according to the embodiment, and, since a large capacity is generated between an upper electrode and a lower electrode at a portion indicated by an arrow in FIG. 85, the pixel capacity is larger than that of the liquid crystal display device in the normal vertical alignment [VA] mode). (2) Since one pixel is required as three pixels for RGB, the capacity of one pixel trebles. (3) Furthermore, driving at 240 Hz or more is required, a gate-on time is very short.

Furthermore, an advantage obtained when an oxide semiconductor TFT (IGZO or the like) is applied is as follows.

For the reasons (1) and (2), a pixel capacity is about 20 times that of a machine type of UV2A driven at 240 Hz, in a display having a size of 52 inches.

Thus, when transistors are made of conventional a-Si, a transistor size is 20 times, and a sufficiently large aperture ratio cannot be achieved disadvantageously.

Since the mobility of IGZO is 10 times that of a-Si, the transistor size becomes about 1/10.

Since one transistor is replaced with three transistors included in a liquid crystal display device using a color filter RGB, the transistors can be manufactured to have a size that is almost equal to or smaller than that obtained by using a-Si.

When the transistors decrease in size as described above, the capacity of Cgd also decreases, and a load on a source bus line decreases accordingly.

Specific Example

Figure 86:
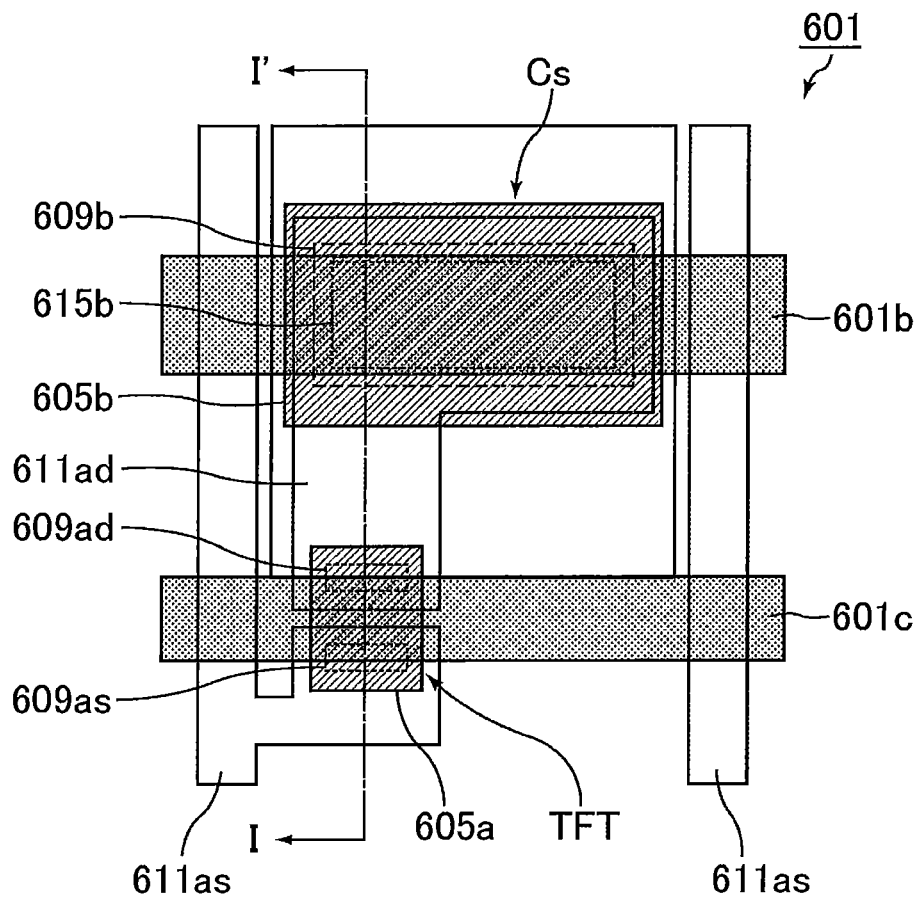
FIG. 86 is a plan schematic diagram of a periphery of an active drive element used in the embodiment.
Figure 87:
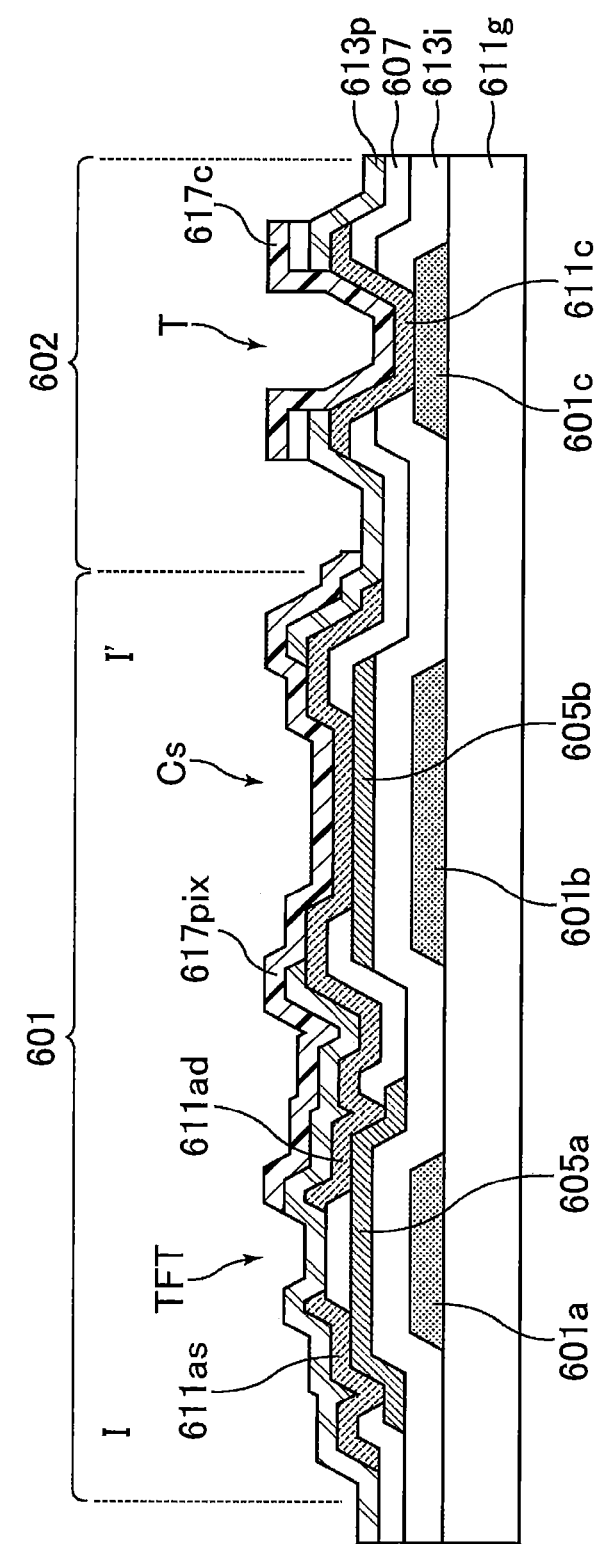
FIG. 87 is a sectional schematic diagram of a periphery of an active drive element used in the embodiment.

Configuration diagrams (illustration) of an oxide semiconductor TFT are shown in FIGS. 86 and 87. FIG. 86 is a plan schematic diagram of a periphery of an active drive element used in the embodiment. FIG. 87 is a sectional schematic diagram of a periphery of an active drive element used in the embodiment. Reference symbol T denotes a gate-source terminal. Reference symbol Cs denotes an auxiliary capacity.

An example (corresponding portion) of manufacturing steps of an oxide semiconductor TFT will be described below.

Active-layer oxide semiconductor layers 605*a* and 605*b* of an active drive element (TFT) using an oxide semiconductor film can be formed as follows.

An In—Ga—Zn—O semiconductor (IGZO) film having a thickness of, for example, 30 nm or more and 300 nm or less is formed on an insulating film 613*i* by using a sputtering method. Thereafter, a resist mask covering a predetermined area of the IGZO film is formed by photolithography. A portion that is not covered with the resist mask on the IGZO film is removed by wet etching. Thereafter, the resist mask is peeled. In this manner, the island-like oxide semiconductor layers 605*a* and 605*b* are obtained. In place of the IGZO film, by using another oxide semiconductor film, the oxide semiconductor layers 605*a* and 605*b* may be formed.

After an insulating film 607 is deposited on the entire surface of a substrate 611*g*, the insulating film 607 is patterned.

More specifically, on the insulating film 613*i* and the oxide semiconductor layers 605*a* and 605*b*, as the insulating film 607, for example, an SiO$_2$ film (thickness: for example, about 150 nm) is formed by a CVD method.

The insulating film 607 preferably includes an oxide film made of SiOy or the like.

When the oxide film is used, when oxygen deficiency occurs in the oxide semiconductor layers 605*a* and 605*b*, the oxygen deficiency can be recovered by oxygen contained in the oxide film. For this reason, the oxygen deficiency in the oxide semiconductor layers 605*a* and 605*b* can be more effectively reduced. In this case, although a single layer configured by an SiO$_2$ film is used as the insulating film 607, a laminate structure including an SiO$_2$ film and an SiNx film as a lower layer and an upper layer, respectively, may be used as the insulating film 607.

The thickness of the insulating film 607 (total of thicknesses of layers when the insulating film has a laminate structure) is preferably 50 nm or more and 200 nm or less. When the thickness is 50 nm or more, in the patterning step or the like of a source-drain electrode, the surfaces of the oxide semiconductor layers 605*a* and 605*b* can be reliably protected. On the other hand, when the thickness exceeds 200 nm, since a large step is formed by the source electrode or the drain electrode, disconnection or the like may occur.

The oxide semiconductor layers 605*a* and 605*b* in the embodiment are preferably layers made of, for example, a Zn—O semiconductor (ZnO), an In—Ga—Zn—O semiconductor (IGZO), an In—Zn—O semiconductor (IZO), or a Zn—Ti—O semiconductor (ZTO). Of these materials, the In—Ga—Zn—O semiconductor (IGZO) is more preferable.

Although this mode exerts a predetermined operation and effect by a combination of the oxide semiconductor TFTs described above, the device can also be driven by using a known TFT element such as an amorphous Si TFT or a polycrystalline Si TFT.

The liquid crystal display device including the thin film transistor array substrate described above can arbitrarily include a member (for example, a light source or the like) included in a general liquid crystal display device.

The aforementioned modes may be employed in appropriate combination as long as the combination is not beyond the spirit of the present invention.

The present application claims priority to Patent Application No. 2011-061662 filed in Japan on 18 Mar. 2011 and Patent Application No. 2011-142351 filed in Japan on 27 Jun. 2011 under the Paris Convention and provisions of national law in a designated State, the entire contents of which are hereby incorporated by reference.

REFERENCE SIGNS LIST 10, 110, 110', 210, 410, 510: Array substrate
11, 21, 411, 421, 511, 521: Glass substrate
13, 23, 113, 113', 123, 213, 223, 313, 323, 413, 423, 513, 523: Common electrode
15, 415, 515: Insulating layer
16: One pair of comb electrodes
17, 19, 117, 117', 119, 119', 217, 219, 417, 419, 517, 519: Comb electrode
20, 120, 120', 220, 420, 520: Opposed substrate
30, 130, 130', 230, 430, 530: Liquid crystal layer
31: Liquid crystal (liquid crystal molecule)
41, 63: Display maintenance
42: Display writing
43, 43', 61, 61': Black maintenance
51, 62: Black writing
601*a*: Gate wiring
601*b*: Auxiliary capacitor wiring
601*c*: Connecting portion
611*g*: Substrate
613*i*: Insulating film (gate insulator)
605*a*, 605*b*: Oxide semiconductor layer (active layer)
607: Insulating layer (etching stopper, protection film)
609*as*, 609*ad*, 609*b*, 615*b*: Opening
611*as*: Source wiring
611*ad*: Drain wiring
611*c*, 617*c*: Connecting portion
613*p*: Protection film
617*pix*: Pixel electrode
601: Pixel unit
602: Terminal arrangement area
Cs: Auxiliary capacitor
T: Gate-source terminal

The invention claimed is:

1. A thin film transistor array substrate including a thin film transistor element,
    wherein electrodes of the thin film transistor array substrate include one pair of comb electrodes and a sheet electrode,
    the thin film transistor array substrate is a thin film transistor array substrate for frame-reversal driving, line reversal driving, or dot-reversal drive, and
    at least one electrode selected from the group consisting of the pair of comb electrodes and the sheet electrode is electrically connected along a pixel line, and electrically connected every other pixel between pixels of one pixel line.

2. The thin film transistor array substrate according to claim 1,
    wherein said sheet electrode is electrically connected along a pixel line.

3. The thin film transistor array substrate according to claim 2,
    wherein said sheet electrode is configured by a transparent conductor and a metal conductor electrically connected to said transparent conductor.

4. The thin film transistor array substrate according claim 1,
    wherein at least one of said pair of comb electrodes is electrically connected along a pixel line.

5. The thin film transistor array substrate according to claim 1,
    wherein at least one of said pair of comb electrodes is electrically connected to said sheet electrode.

6. A liquid crystal display device characterized by comprising a thin film transistor array substrate according to claim 1 and an opposed substrate, the opposed substrate including another sheet electrode.

7. The thin film transistor array substrate according to claim 1,
    wherein said thin film transistor element includes an oxide semiconductor.

8. The thin film transistor array substrate according to claim 7,
    wherein said oxide semiconductor includes In, Ga, and Zn.

* * * * *